US011867749B2

(12) United States Patent
Pei et al.

(10) Patent No.: US 11,867,749 B2
(45) Date of Patent: Jan. 9, 2024

(54) VISION SYSTEM FOR AN AUTOMATED TEST SYSTEM

(71) Applicant: Teradyne, Inc., North Reading, MA (US)

(72) Inventors: Jianfa Pei, North Reading, MA (US); Adnan Khalid, North Reading, MA (US); Philip Luke Campbell, North Reading, MA (US); Christopher James Bruno, North Reading, MA (US); Christopher Croft Jones, North Reading, MA (US)

(73) Assignee: TERADYNE, INC., North Reading, MA (US)

( * ) Notice: Subject to any disclaimer, the term of this patent is extended or adjusted under 35 U.S.C. 154(b) by 248 days.

(21) Appl. No.: 17/077,827

(22) Filed: Oct. 22, 2020

(65) Prior Publication Data

US 2022/0128622 A1 Apr. 28, 2022

(51) Int. Cl.
*G01R 31/28* (2006.01)
*G01R 31/3183* (2006.01)
*G01R 31/319* (2006.01)

(52) U.S. Cl.
CPC ... *G01R 31/2863* (2013.01); *G01R 31/31905* (2013.01); *G01R 31/318307* (2013.01)

(58) Field of Classification Search
CPC .............. G01R 1/0466; G01R 1/07314; G01R 31/2879; G01R 31/2886; G01R 31/2889; G01R 31/289
See application file for complete search history.

(56) References Cited

U.S. PATENT DOCUMENTS

| 557,186 A | 3/1896 | Cahill |
| 2,224,407 A | 12/1940 | Passur |
| 2,380,026 A | 7/1945 | Clarke |
| 2,631,775 A | 3/1953 | Gordon |

(Continued)

FOREIGN PATENT DOCUMENTS

| AU | 583716 B2 | 5/1989 |
| CN | 1177187 A | 3/1998 |

(Continued)

OTHER PUBLICATIONS

International Preliminary Report on Patentability in Application No. PCT/US2021/055898 dated May 4, 2023, 7 pages.

(Continued)

*Primary Examiner* — Tung X Nguyen
(74) *Attorney, Agent, or Firm* — Burns & Levinson LLP

(57) ABSTRACT

An example test system includes test sites that include sockets for testing devices under test (DUTs), pickers for picking DUTs from the sockets or placing the DUTs in the sockets, and a gantry on which the pickers are mounted. The gantry is configured to move the pickers relative to the test sites to position the pickers for picking the DUTs from the sockets or placing the DUTs into the sockets. The test system also includes one or more LASER range finders mounted on the gantry for movement over the DUTs in the sockets and in conjunction with movement of the pickers. A LASER range finder among the one or more LASER rangefinders mounted on the gantry is configured to detect a distance to a DUT placed into a socket.

36 Claims, 59 Drawing Sheets

(56) References Cited

U.S. PATENT DOCUMENTS

| | | |
|---|---|---|
| 2,635,524 A | 4/1953 | Jenkins |
| 3,120,166 A | 2/1964 | Lyman |
| 3,360,032 A | 12/1967 | Sherwood |
| 3,364,838 A | 1/1968 | Bradley |
| 3,517,601 A | 6/1970 | Courchesne |
| 3,845,286 A | 10/1974 | Zeiss et al. |
| 4,147,299 A | 4/1979 | Freeman |
| 4,233,644 A | 11/1980 | Hwang et al. |
| 4,336,748 A | 6/1982 | Martin et al. |
| 4,379,259 A | 4/1983 | Varadi et al. |
| 4,477,127 A | 10/1984 | Kume |
| 4,495,545 A | 1/1985 | Dufresne et al. |
| 4,526,318 A | 7/1985 | Fleming et al. |
| 4,620,248 A | 10/1986 | Gitzendanner |
| 4,648,007 A | 3/1987 | Garner |
| 4,654,727 A | 3/1987 | Blum et al. |
| 4,654,732 A | 3/1987 | Mesher |
| 4,665,455 A | 5/1987 | Mesher |
| 4,683,424 A | 7/1987 | Cutright et al. |
| 4,685,303 A | 8/1987 | Branc et al. |
| 4,688,124 A | 8/1987 | Scribner et al. |
| 4,700,293 A | 10/1987 | Grone |
| 4,713,714 A | 12/1987 | Gatti et al. |
| 4,739,444 A | 4/1988 | Zushi et al. |
| 4,754,397 A | 6/1988 | Varaiya et al. |
| 4,768,285 A | 9/1988 | Woodman, Jr. |
| 4,775,281 A | 10/1988 | Prentakis |
| 4,778,063 A | 10/1988 | Ueberreiter |
| 4,801,234 A | 1/1989 | Cedrone |
| 4,809,881 A | 3/1989 | Becker |
| 4,817,273 A | 4/1989 | Lape et al. |
| 4,817,934 A | 4/1989 | McCormick et al. |
| 4,851,965 A | 7/1989 | Gabuzda et al. |
| 4,878,137 A | 10/1989 | Yamashita et al. |
| 4,881,591 A | 11/1989 | Rignall |
| 4,888,549 A | 12/1989 | Wilson et al. |
| 4,911,281 A | 3/1990 | Jenkner |
| 4,967,155 A | 10/1990 | Magnuson |
| 5,012,187 A | 4/1991 | Littlebury |
| 5,045,960 A | 9/1991 | Eding |
| 5,061,630 A | 10/1991 | Knopf et al. |
| 5,094,584 A | 3/1992 | Bullock |
| 5,119,270 A | 6/1992 | Bolton et al. |
| 5,122,914 A | 6/1992 | Hanson |
| 5,127,684 A | 7/1992 | Klotz et al. |
| 5,128,813 A | 7/1992 | Lee |
| 5,136,395 A | 8/1992 | Ishii et al. |
| 5,143,193 A | 9/1992 | Geraci |
| 5,158,132 A | 10/1992 | Guillemot |
| 5,168,424 A | 12/1992 | Bolton et al. |
| 5,171,183 A | 12/1992 | Pollard et al. |
| 5,173,819 A | 12/1992 | Takahashi et al. |
| 5,176,202 A | 1/1993 | Richard |
| 5,205,132 A | 4/1993 | Fu |
| 5,206,772 A | 4/1993 | Hirano et al. |
| 5,207,613 A | 5/1993 | Ferchau et al. |
| 5,210,680 A | 5/1993 | Scheibler |
| 5,237,484 A | 8/1993 | Ferchau et al. |
| 5,263,537 A | 11/1993 | Plucinski et al. |
| 5,268,637 A | 12/1993 | Liken |
| 5,269,698 A | 12/1993 | Singer |
| 5,295,392 A | 3/1994 | Hensel et al. |
| 5,309,323 A | 5/1994 | Gray et al. |
| 5,325,263 A | 6/1994 | Singer et al. |
| 5,343,403 A | 8/1994 | Beidle et al. |
| 5,349,486 A | 9/1994 | Sugimoto et al. |
| 5,368,072 A | 11/1994 | Cote |
| 5,374,395 A | 12/1994 | Robinson et al. |
| 5,379,229 A | 1/1995 | Parsons et al. |
| 5,398,058 A | 3/1995 | Hattori |
| 5,412,531 A | 5/1995 | Clapp, III |
| 5,412,534 A | 5/1995 | Cutts et al. |
| 5,414,591 A | 5/1995 | Kimura et al. |
| 5,426,581 A | 6/1995 | Kishi et al. |
| 5,434,737 A | 7/1995 | Okimi |
| 5,469,037 A | 11/1995 | McMurtrey, Sr. et al. |
| 5,477,416 A | 12/1995 | Schkrohowsky et al. |
| 5,484,012 A | 1/1996 | Hiratsuka |
| 5,486,681 A | 1/1996 | Dagnac et al. |
| 5,491,610 A | 2/1996 | Mok et al. |
| 5,543,727 A | 8/1996 | Bushard et al. |
| 5,546,250 A | 8/1996 | Diel |
| 5,557,186 A | 9/1996 | McMurtrey, Sr. et al. |
| 5,563,768 A | 10/1996 | Perdue |
| 5,570,740 A | 11/1996 | Flores et al. |
| 5,593,380 A | 1/1997 | Bittikofer |
| 5,601,141 A | 2/1997 | Gordon et al. |
| 5,604,662 A | 2/1997 | Anderson et al. |
| 5,610,893 A | 3/1997 | Soga et al. |
| 5,617,430 A | 4/1997 | Angelotti et al. |
| 5,644,705 A | 7/1997 | Stanley |
| 5,646,918 A | 7/1997 | Dimitri et al. |
| 5,654,846 A | 8/1997 | Wicks et al. |
| 5,673,029 A | 9/1997 | Behl et al. |
| 5,694,290 A | 12/1997 | Chang |
| 5,703,843 A | 12/1997 | Katsuyama et al. |
| 5,718,627 A | 2/1998 | Wicks |
| 5,718,628 A | 2/1998 | Nakazato et al. |
| 5,719,985 A | 2/1998 | Norikazu et al. |
| 5,731,928 A | 3/1998 | Jabbari et al. |
| 5,751,549 A | 5/1998 | Eberhardt et al. |
| 5,754,365 A | 5/1998 | Beck et al. |
| 5,761,032 A | 6/1998 | Jones |
| 5,785,482 A | 7/1998 | Nobuhiro |
| 5,793,610 A | 8/1998 | Schmitt et al. |
| 5,811,678 A | 9/1998 | Hirano |
| 5,812,761 A | 9/1998 | Seki et al. |
| 5,813,817 A | 9/1998 | Matsumiya et al. |
| 5,819,842 A | 10/1998 | Potter et al. |
| 5,831,525 A | 11/1998 | Harvey |
| 5,851,143 A | 12/1998 | Hamid |
| 5,859,409 A | 1/1999 | Kim et al. |
| 5,859,540 A | 1/1999 | Fukumoto |
| 5,862,037 A | 1/1999 | Behl |
| 5,870,630 A | 2/1999 | Reasoner et al. |
| 5,886,639 A | 3/1999 | Behl et al. |
| 5,890,959 A | 4/1999 | Pettit et al. |
| 5,892,367 A | 4/1999 | Magee et al. |
| 5,894,218 A | 4/1999 | Farnworth et al. |
| 5,912,799 A | 6/1999 | Grouell et al. |
| 5,913,926 A | 6/1999 | Anderson et al. |
| 5,914,856 A | 6/1999 | Morton et al. |
| 5,927,386 A | 7/1999 | Lin |
| 5,955,877 A | 9/1999 | Farnworth et al. |
| 5,956,301 A | 9/1999 | Dimitri et al. |
| 5,959,834 A | 9/1999 | Chang |
| 5,999,356 A | 12/1999 | Dimitri et al. |
| 5,999,365 A | 12/1999 | Hasegawa et al. |
| 6,000,623 A | 12/1999 | Blatti et al. |
| 6,005,404 A | 12/1999 | Cochran et al. |
| 6,005,770 A | 12/1999 | Schmitt |
| 6,008,636 A | 12/1999 | Miller et al. |
| 6,008,984 A | 12/1999 | Cunningham et al. |
| 6,011,689 A | 1/2000 | Wrycraft |
| 6,031,717 A | 2/2000 | Baddour et al. |
| 6,034,870 A | 3/2000 | Osborn et al. |
| 6,042,348 A | 3/2000 | Aakalu et al. |
| 6,045,113 A | 4/2000 | Itakura |
| 6,055,814 A | 5/2000 | Song |
| 6,066,822 A | 5/2000 | Nemoto et al. |
| 6,067,225 A | 5/2000 | Reznikov et al. |
| 6,069,792 A | 5/2000 | Nelik |
| 6,084,768 A | 7/2000 | Bolognia |
| 6,094,342 A | 7/2000 | Dague et al. |
| 6,104,607 A | 8/2000 | Behl |
| 6,107,813 A | 8/2000 | Sinsheimer et al. |
| 6,115,250 A | 9/2000 | Schmitt |
| 6,122,131 A | 9/2000 | Jeppson |
| 6,122,232 A | 9/2000 | Schell et al. |
| 6,124,707 A | 9/2000 | Kim et al. |
| 6,129,428 A | 10/2000 | Helwig et al. |
| 6,130,817 A | 10/2000 | Flotho et al. |
| 6,144,553 A | 11/2000 | Hileman et al. |
| 6,166,901 A | 12/2000 | Gamble et al. |

(56) References Cited

U.S. PATENT DOCUMENTS

| | | |
|---|---|---|
| 6,169,413 B1 | 1/2001 | Paek et al. |
| 6,169,930 B1 | 1/2001 | Blachek et al. |
| 6,177,805 B1 | 1/2001 | Pih |
| 6,178,835 B1 | 1/2001 | Orriss et al. |
| 6,181,557 B1 | 1/2001 | Gatti |
| 6,185,065 B1 | 2/2001 | Hasegawa et al. |
| 6,185,097 B1 | 2/2001 | Behl |
| 6,188,191 B1 | 2/2001 | Frees et al. |
| 6,192,282 B1 | 2/2001 | Smith et al. |
| 6,193,339 B1 | 2/2001 | Behl et al. |
| 6,209,842 B1 | 4/2001 | Anderson et al. |
| 6,227,516 B1 | 5/2001 | Webster, Jr. et al. |
| 6,229,275 B1 | 5/2001 | Yamamoto |
| 6,231,145 B1 | 5/2001 | Liu |
| 6,233,148 B1 | 5/2001 | Shen |
| 6,236,563 B1 | 5/2001 | Buican et al. |
| 6,247,944 B1 | 6/2001 | Bolognia et al. |
| 6,249,824 B1 | 6/2001 | Henrichs |
| 6,252,769 B1 | 6/2001 | Tullstedt et al. |
| 6,262,581 B1 | 7/2001 | Han |
| 6,262,863 B1 | 7/2001 | Ostwald et al. |
| 6,272,007 B1 | 8/2001 | Kitlas et al. |
| 6,272,767 B1 | 8/2001 | Botruff et al. |
| 6,281,677 B1 | 8/2001 | Cosci et al. |
| 6,282,501 B1 | 8/2001 | Assouad |
| 6,285,524 B1 | 9/2001 | Boigenzahn et al. |
| 6,289,678 B1 | 9/2001 | Pandolfi |
| 6,297,950 B1 | 10/2001 | Erwin |
| 6,298,672 B1 | 10/2001 | Valicoff, Jr. |
| 6,301,105 B2 | 10/2001 | Glorioso et al. |
| 6,302,714 B1 | 10/2001 | Bologna et al. |
| 6,304,839 B1 | 10/2001 | Ho et al. |
| 6,307,386 B1 | 10/2001 | Fowler et al. |
| 6,327,150 B1 | 12/2001 | Levy et al. |
| 6,330,154 B1 | 12/2001 | Fryers et al. |
| 6,351,379 B1 | 2/2002 | Cheng |
| 6,354,792 B1 | 3/2002 | Kobayashi et al. |
| 6,356,409 B1 | 3/2002 | Price et al. |
| 6,356,415 B1 | 3/2002 | Kabasawa |
| 6,384,593 B1 | 5/2002 | Kobayashi et al. |
| 6,384,995 B1 | 5/2002 | Smith |
| 6,388,437 B1 | 5/2002 | Wolski et al. |
| 6,388,875 B1 | 5/2002 | Chen |
| 6,388,878 B1 | 5/2002 | Chang |
| 6,389,225 B1 | 5/2002 | Malinoski et al. |
| 6,390,756 B1 | 5/2002 | Isaacs et al. |
| 6,411,584 B2 | 6/2002 | Davis et al. |
| 6,421,236 B1 | 7/2002 | Montoya et al. |
| 6,434,000 B1 | 8/2002 | Pandolfi |
| 6,434,498 B1 | 8/2002 | Ulrich et al. |
| 6,434,499 B1 | 8/2002 | Ulrich et al. |
| 6,459,572 B1 | 10/2002 | Huang et al. |
| 6,464,080 B1 | 10/2002 | Morris et al. |
| 6,467,153 B2 | 10/2002 | Butts et al. |
| 6,473,297 B1 | 10/2002 | Behl et al. |
| 6,473,301 B1 | 10/2002 | Levy et al. |
| 6,476,627 B1 | 11/2002 | Pelissier et al. |
| 6,477,044 B2 | 11/2002 | Foley et al. |
| 6,477,442 B1 | 11/2002 | Valerino, Sr. |
| 6,480,380 B1 | 11/2002 | French et al. |
| 6,480,382 B2 | 11/2002 | Cheng |
| 6,487,071 B1 | 11/2002 | Tata et al. |
| 6,489,793 B2 | 12/2002 | Jones et al. |
| 6,494,663 B2 | 12/2002 | Ostwald et al. |
| 6,515,470 B2 | 2/2003 | Suzuki et al. |
| 6,525,933 B2 | 2/2003 | Eland |
| 6,526,841 B1 | 3/2003 | Wanek et al. |
| 6,535,384 B2 | 3/2003 | Huang |
| 6,537,013 B2 | 3/2003 | Emberty et al. |
| 6,544,309 B1 | 4/2003 | Hoefer et al. |
| 6,546,445 B1 | 4/2003 | Hayes |
| 6,553,279 B2 | 4/2003 | Brown |
| 6,553,532 B1 | 4/2003 | Aoki |
| 6,560,107 B1 | 5/2003 | Beck et al. |
| 6,565,163 B2 | 5/2003 | Behl et al. |
| 6,566,859 B2 | 5/2003 | Wolski et al. |
| 6,567,266 B2 | 5/2003 | Ives et al. |
| 6,568,770 B2 | 5/2003 | Gonska et al. |
| 6,570,734 B2 | 5/2003 | Ostwald et al. |
| 6,577,586 B1 | 6/2003 | Yang et al. |
| 6,577,687 B2 | 6/2003 | Hall et al. |
| 6,618,246 B2 | 9/2003 | Sullivan et al. |
| 6,618,254 B2 | 9/2003 | Ives |
| 6,618,548 B1 | 9/2003 | Shuji et al. |
| 6,626,846 B2 | 9/2003 | Spencer |
| 6,628,518 B2 | 9/2003 | Behl et al. |
| 6,635,115 B1 | 10/2003 | Fairbairn et al. |
| 6,640,235 B1 | 10/2003 | Anderson |
| 6,644,982 B1 | 11/2003 | Ondricek et al. |
| 6,651,192 B1 | 11/2003 | Viglione et al. |
| 6,654,240 B1 | 11/2003 | Tseng et al. |
| 6,679,128 B2 | 1/2004 | Wanek et al. |
| 6,693,757 B2 | 2/2004 | Hayakawa et al. |
| 6,701,003 B1 | 3/2004 | Feinstein |
| 6,736,583 B2 | 5/2004 | Ostwald et al. |
| 6,741,529 B2 | 5/2004 | Getreuer |
| 6,746,648 B1 | 6/2004 | Mattila et al. |
| 6,751,093 B1 | 6/2004 | Hsu et al. |
| 6,791,785 B1 | 9/2004 | Messenger et al. |
| 6,791,799 B2 | 9/2004 | Fletcher |
| 6,798,651 B2 | 9/2004 | Syring et al. |
| 6,798,972 B1 | 9/2004 | Ito et al. |
| 6,801,834 B1 | 10/2004 | Konshak et al. |
| 6,806,700 B2 | 10/2004 | Wanek et al. |
| 6,808,353 B2 | 10/2004 | Ostwald et al. |
| 6,811,427 B2 | 11/2004 | Garrett et al. |
| 6,822,412 B1 | 11/2004 | Gan et al. |
| 6,822,858 B2 | 11/2004 | Allgeyer et al. |
| 6,826,046 B1 | 11/2004 | Muncaster et al. |
| 6,830,372 B2 | 12/2004 | Liu et al. |
| 6,832,929 B2 | 12/2004 | Garrett et al. |
| 6,838,051 B2 | 1/2005 | Marquiss et al. |
| 6,854,174 B2 | 2/2005 | Jiang |
| 6,861,861 B2 | 3/2005 | Song et al. |
| 6,862,173 B1 | 3/2005 | Konshak et al. |
| 6,867,939 B2 | 3/2005 | Katahara et al. |
| 6,882,141 B2 | 4/2005 | Kim |
| 6,892,328 B2 | 5/2005 | Klein et al. |
| 6,904,479 B1 | 6/2005 | Hall et al. |
| 6,908,330 B2 | 6/2005 | Garrett et al. |
| 6,928,336 B2 | 8/2005 | Peshkin et al. |
| 6,937,432 B2 | 8/2005 | Sri-Jayantha et al. |
| 6,957,291 B2 | 10/2005 | Moon et al. |
| 6,960,908 B2 | 11/2005 | Chung et al. |
| 6,965,811 B2 | 11/2005 | Dickey et al. |
| 6,974,017 B2 | 12/2005 | Oseguera |
| 6,976,190 B1 | 12/2005 | Goldstone |
| 6,980,381 B2 | 12/2005 | Gray et al. |
| 6,982,872 B2 | 1/2006 | Behl et al. |
| 7,002,363 B2 | 2/2006 | Mathieu |
| 7,006,325 B2 | 2/2006 | Emberty et al. |
| 7,013,198 B2 | 3/2006 | Haas |
| 7,021,883 B1 | 4/2006 | Plutt et al. |
| 7,039,924 B2 | 5/2006 | Goodman et al. |
| 7,047,106 B2 | 5/2006 | Butka et al. |
| 7,054,150 B2 | 5/2006 | Orriss et al. |
| 7,070,323 B2 | 7/2006 | Wanek et al. |
| 7,076,391 B1 | 7/2006 | Pakzad et al. |
| 7,077,614 B1 | 7/2006 | Hasper et al. |
| 7,084,655 B2 | 8/2006 | Min et al. |
| 7,088,541 B2 | 8/2006 | Orriss et al. |
| 7,092,251 B1 | 8/2006 | Henry |
| 7,106,582 B2 | 9/2006 | Albrecht et al. |
| 7,123,477 B2 | 10/2006 | Coglitore et al. |
| 7,126,777 B2 | 10/2006 | Flechsig et al. |
| 7,130,138 B2 | 10/2006 | Lum et al. |
| 7,134,553 B2 | 11/2006 | Stephens |
| 7,139,145 B1 | 11/2006 | Archibald et al. |
| 7,142,419 B2 | 11/2006 | Cochrane |
| 7,164,579 B2 | 1/2007 | Muncaster et al. |
| 7,167,360 B2 | 1/2007 | Inoue et al. |
| 7,181,458 B1 | 2/2007 | Higashi |
| 7,203,021 B1 | 4/2007 | Ryan et al. |
| 7,203,060 B2 | 4/2007 | Kay et al. |

(56) References Cited

U.S. PATENT DOCUMENTS

| | | | |
|---|---|---|---|
| 7,206,201 | B2 | 4/2007 | Behl et al. |
| 7,216,968 | B2 | 5/2007 | Smith et al. |
| 7,219,028 | B2 | 5/2007 | Bae et al. |
| 7,219,273 | B2 | 5/2007 | Fisher et al. |
| 7,227,746 | B2 | 6/2007 | Tanaka et al. |
| 7,232,101 | B2 | 6/2007 | Wanek et al. |
| 7,243,043 | B2 | 7/2007 | Shin |
| 7,248,467 | B2 | 7/2007 | Sri-Jayantha et al. |
| 7,249,992 | B2 | 7/2007 | Kalenian et al. |
| 7,251,544 | B2 | 7/2007 | Christie, Jr. |
| 7,257,747 | B2 | 8/2007 | Song |
| 7,259,966 | B2 | 8/2007 | Connelly, Jr. et al. |
| 7,273,344 | B2 | 9/2007 | Ostwald et al. |
| 7,280,352 | B2 | 10/2007 | Wilson et al. |
| 7,280,353 | B2 | 10/2007 | Wendel et al. |
| 7,289,885 | B2 | 10/2007 | Basham et al. |
| 7,304,855 | B1 | 12/2007 | Milligan et al. |
| 7,315,447 | B2 | 1/2008 | Inoue et al. |
| 7,333,283 | B2 | 2/2008 | Akamatsu et al. |
| 7,349,205 | B2 | 3/2008 | Hall et al. |
| 7,353,524 | B1 | 4/2008 | Lin et al. |
| 7,362,961 | B2 | 4/2008 | Shigeru et al. |
| 7,375,960 | B2 | 5/2008 | Blaalid et al. |
| 7,385,385 | B2 | 6/2008 | Magliocco et al. |
| 7,387,485 | B2 | 6/2008 | Dickey et al. |
| 7,390,458 | B2 | 6/2008 | Burow et al. |
| 7,391,609 | B2 | 6/2008 | Wendel et al. |
| 7,395,133 | B2 | 7/2008 | Lowe |
| 7,403,451 | B2 | 7/2008 | Goodman et al. |
| 7,408,338 | B2 | 8/2008 | Ham et al. |
| 7,416,332 | B2 | 8/2008 | Rountree et al. |
| 7,421,623 | B2 | 9/2008 | Haugh |
| 7,437,212 | B2 | 10/2008 | Farchmin et al. |
| 7,447,011 | B2 | 11/2008 | Wade et al. |
| 7,457,112 | B2 | 11/2008 | Fukuda et al. |
| 7,467,024 | B2 | 12/2008 | Flitsch |
| 7,476,362 | B2 | 1/2009 | Angros |
| 7,480,807 | B2 | 1/2009 | Wilson et al. |
| 7,483,269 | B1 | 1/2009 | Marvin, Jr. et al. |
| 7,505,264 | B2 | 3/2009 | Hall et al. |
| 7,554,811 | B2 | 6/2009 | Scicluna et al. |
| 7,568,122 | B2 | 7/2009 | Mechalke et al. |
| 7,570,455 | B2 | 8/2009 | Deguchi et al. |
| 7,573,715 | B2 | 8/2009 | Mojaver et al. |
| 7,584,016 | B2 | 9/2009 | Weaver |
| 7,584,851 | B2 | 9/2009 | Hong et al. |
| 7,612,996 | B2 | 11/2009 | Atkins et al. |
| 7,625,027 | B2 | 12/2009 | Kiaie et al. |
| 7,630,196 | B2 | 12/2009 | Hall et al. |
| 7,635,246 | B2 | 12/2009 | Neeper et al. |
| 7,643,289 | B2 | 1/2010 | Ye et al. |
| 7,646,596 | B2 | 1/2010 | Ng |
| 7,710,684 | B2 | 5/2010 | Koujiro |
| 7,729,107 | B2 | 6/2010 | Atkins et al. |
| 7,729,112 | B2 | 6/2010 | Atkins |
| 7,777,985 | B2 | 8/2010 | Barkley |
| 7,778,031 | B1 | 8/2010 | Merrow et al. |
| 7,789,267 | B2 | 9/2010 | Hutchinson et al. |
| 7,796,724 | B2 | 9/2010 | Ito |
| 7,848,106 | B2 | 12/2010 | Merrow |
| 7,852,723 | B2 | 12/2010 | Onagi et al. |
| 7,890,207 | B2 | 2/2011 | Toscano et al. |
| 7,904,211 | B2 | 3/2011 | Merrow et al. |
| 7,908,029 | B2 | 3/2011 | Slocum, III |
| 7,911,778 | B2 | 3/2011 | Merrow |
| 7,920,380 | B2 | 4/2011 | Merrow et al. |
| 7,929,303 | B1 | 4/2011 | Merrow |
| 7,932,734 | B2 | 4/2011 | Merrow et al. |
| 7,936,534 | B2 | 5/2011 | Orriss et al. |
| 7,940,529 | B2 | 5/2011 | Merrow et al. |
| 7,945,424 | B2 | 5/2011 | Garcia et al. |
| 7,987,018 | B2 | 7/2011 | Polyakov et al. |
| 7,995,349 | B2 | 8/2011 | Merrow et al. |
| 7,996,174 | B2 | 8/2011 | Garcia et al. |
| 8,041,449 | B2 | 10/2011 | Noble et al. |
| 8,046,187 | B2 | 10/2011 | Klein et al. |
| 8,061,155 | B2 | 11/2011 | Farquhar et al. |
| 8,086,343 | B2 | 12/2011 | Slocum, III |
| 8,095,234 | B2 | 1/2012 | Polyakov et al. |
| 8,102,173 | B2 | 1/2012 | Merrow |
| 8,116,079 | B2 | 2/2012 | Merrow |
| 8,117,480 | B2 | 2/2012 | Merrow et al. |
| 8,140,182 | B2 | 3/2012 | Noble et al. |
| 8,160,739 | B2 | 4/2012 | Toscano et al. |
| 8,167,521 | B2 | 5/2012 | Nakao et al. |
| 8,238,099 | B2 | 8/2012 | Merrow |
| 8,279,603 | B2 | 10/2012 | Merrow et al. |
| 8,305,751 | B2 | 11/2012 | Merrow |
| 8,318,512 | B2 | 11/2012 | Shah et al. |
| 8,339,445 | B2 | 12/2012 | Yoro et al. |
| 8,405,971 | B2 | 3/2013 | Merrow et al. |
| 8,466,699 | B2 | 6/2013 | Merrow et al. |
| 8,467,180 | B2 | 6/2013 | Merrow et al. |
| 8,482,915 | B2 | 7/2013 | Merrow |
| 8,485,511 | B2 | 7/2013 | Di Stefano |
| 8,499,611 | B2 | 8/2013 | Merrow et al. |
| 8,504,194 | B2 | 8/2013 | Mitsuyoshi |
| 8,547,123 | B2 | 10/2013 | Merrow et al. |
| 8,549,912 | B2 | 10/2013 | Merrow et al. |
| 8,628,239 | B2 | 1/2014 | Merrow et al. |
| 8,631,698 | B2 | 1/2014 | Merrow et al. |
| 8,655,482 | B2 | 2/2014 | Merrow |
| 8,687,349 | B2 | 4/2014 | Truebenbach |
| 8,687,356 | B2 | 4/2014 | Merrow |
| 8,755,177 | B2 | 6/2014 | Farquhar et al. |
| 8,770,204 | B2 | 7/2014 | Bencivenni et al. |
| 8,886,946 | B1 | 11/2014 | Fraser et al. |
| 8,926,196 | B2 | 1/2015 | Detofsky et al. |
| 8,941,726 | B2 | 1/2015 | Marks et al. |
| 8,964,361 | B2 | 2/2015 | Truebenbach |
| 8,967,605 | B2 | 3/2015 | Kogure |
| 8,970,244 | B2 | 3/2015 | Di Stefano et al. |
| 9,001,456 | B2 | 4/2015 | Campbell et al. |
| 9,002,186 | B2 | 4/2015 | Akers et al. |
| 9,196,518 | B1 | 11/2015 | Hofmeister et al. |
| 9,201,093 | B2 | 12/2015 | Lee |
| 9,459,312 | B2 | 10/2016 | Arena et al. |
| 9,463,574 | B2 | 10/2016 | Purkayastha et al. |
| 9,483,040 | B2 | 11/2016 | Ikushima |
| 9,580,245 | B2 | 2/2017 | Mansfield et al. |
| 9,606,145 | B2 | 3/2017 | Peng et al. |
| 9,779,780 | B2 | 10/2017 | Martino |
| 9,789,605 | B2 | 10/2017 | Meier et al. |
| 10,359,779 | B2 | 7/2019 | Duda et al. |
| 10,466,273 | B1 | 11/2019 | Hwang et al. |
| 10,725,091 | B2 | 7/2020 | Bowyer et al. |
| 10,845,410 | B2 | 11/2020 | Bowyer et al. |
| 11,002,787 | B2 | 5/2021 | Wolff et al. |
| 2001/0006453 | A1 | 7/2001 | Glorioso et al. |
| 2001/0044023 | A1 | 11/2001 | Johnson et al. |
| 2001/0046118 | A1 | 11/2001 | Yamanashi et al. |
| 2001/0048590 | A1 | 12/2001 | Behl et al. |
| 2002/0009391 | A1 | 1/2002 | Marquiss et al. |
| 2002/0026258 | A1 | 2/2002 | Suzuki et al. |
| 2002/0030981 | A1 | 3/2002 | Sullivan et al. |
| 2002/0044416 | A1 | 4/2002 | Harmon et al. |
| 2002/0051338 | A1 | 5/2002 | Jiang et al. |
| 2002/0071248 | A1 | 6/2002 | Huang et al. |
| 2002/0079422 | A1 | 6/2002 | Jiang |
| 2002/0090320 | A1 | 7/2002 | Burow et al. |
| 2002/0116087 | A1 | 8/2002 | Brown |
| 2002/0161971 | A1 | 10/2002 | Dimitri et al. |
| 2002/0172004 | A1 | 11/2002 | Ives et al. |
| 2003/0035271 | A1 | 2/2003 | Lelong et al. |
| 2003/0043550 | A1 | 3/2003 | Ives |
| 2003/0121337 | A1 | 7/2003 | Wanek et al. |
| 2003/0206397 | A1 | 11/2003 | Allgeyer et al. |
| 2004/0051544 | A1 | 3/2004 | Malathong et al. |
| 2004/0165489 | A1 | 8/2004 | Goodman et al. |
| 2004/0207387 | A1 | 10/2004 | Chung et al. |
| 2004/0208354 | A1 | 10/2004 | Vilella |
| 2004/0230399 | A1 | 11/2004 | Shin |
| 2004/0236465 | A1 | 11/2004 | Butka et al. |
| 2004/0251866 | A1 | 12/2004 | Gan et al. |

(56) References Cited

U.S. PATENT DOCUMENTS

| | | |
|---|---|---|
| 2004/0264121 A1 | 12/2004 | Orriss et al. |
| 2005/0004703 A1 | 1/2005 | Christie |
| 2005/0010836 A1 | 1/2005 | Bae et al. |
| 2005/0012498 A1 | 1/2005 | Lee et al. |
| 2005/0018397 A1 | 1/2005 | Kav et al. |
| 2005/0055601 A1 | 3/2005 | Wilson et al. |
| 2005/0057849 A1 | 3/2005 | Twogood et al. |
| 2005/0062463 A1 | 3/2005 | Kim |
| 2005/0069400 A1 | 3/2005 | Dickey et al. |
| 2005/0109131 A1 | 5/2005 | Wanek et al. |
| 2005/0116702 A1 | 6/2005 | Wanek et al. |
| 2005/0131578 A1 | 6/2005 | Weaver |
| 2005/0164530 A1 | 7/2005 | Yates et al. |
| 2005/0179457 A1 | 8/2005 | Min et al. |
| 2005/0207059 A1 | 9/2005 | Cochrane |
| 2005/0216811 A1 | 9/2005 | Song |
| 2005/0219809 A1 | 10/2005 | Muncaster et al. |
| 2005/0225338 A1 | 10/2005 | Sands et al. |
| 2005/0270737 A1 | 12/2005 | Wilson et al. |
| 2006/0010353 A1 | 1/2006 | Haugh |
| 2006/0023331 A1 | 2/2006 | Flechsia et al. |
| 2006/0028802 A1 | 2/2006 | Shaw et al. |
| 2006/0035563 A1 | 2/2006 | Kalenian et al. |
| 2006/0066974 A1 | 3/2006 | Akamatsu et al. |
| 2006/0130316 A1 | 6/2006 | Takase et al. |
| 2006/0190205 A1 | 8/2006 | Klein et al. |
| 2006/0208757 A1 | 9/2006 | Bjork |
| 2006/0227517 A1 | 10/2006 | Zayas et al. |
| 2006/0250766 A1 | 11/2006 | Blaalid et al. |
| 2007/0018673 A1 | 1/2007 | Hsieh |
| 2007/0034368 A1 | 2/2007 | Atkins et al. |
| 2007/0035874 A1 | 2/2007 | Wendel et al. |
| 2007/0035875 A1 | 2/2007 | Hall et al. |
| 2007/0040570 A1 | 2/2007 | Gopal et al. |
| 2007/0053154 A1 | 3/2007 | Fukuda et al. |
| 2007/0082907 A1 | 4/2007 | Canada et al. |
| 2007/0127202 A1 | 6/2007 | Scicluna et al. |
| 2007/0127206 A1 | 6/2007 | Wade et al. |
| 2007/0144542 A1 | 6/2007 | Bencivenni et al. |
| 2007/0152655 A1 | 7/2007 | Ham et al. |
| 2007/0183871 A1 | 8/2007 | Hofmeister et al. |
| 2007/0185676 A1 | 8/2007 | Ding et al. |
| 2007/0195497 A1 | 8/2007 | Atkins |
| 2007/0248142 A1 | 10/2007 | Rountree et al. |
| 2007/0253157 A1 | 11/2007 | Atkins et al. |
| 2007/0286045 A1 | 12/2007 | Onagi et al. |
| 2007/0296408 A1 | 12/2007 | Liao et al. |
| 2007/0296426 A1 | 12/2007 | Krishnaswami et al. |
| 2008/0002538 A1 | 1/2008 | Raaymakers |
| 2008/0007865 A1 | 1/2008 | Orriss et al. |
| 2008/0030945 A1 | 2/2008 | Mojaver et al. |
| 2008/0112075 A1 | 5/2008 | Farquhar et al. |
| 2008/0191725 A1 | 8/2008 | Cojocneanu et al. |
| 2008/0238460 A1 | 10/2008 | Kress et al. |
| 2008/0239564 A1 | 10/2008 | Farquhar et al. |
| 2008/0282275 A1 | 11/2008 | Zaczek et al. |
| 2008/0282278 A1 | 11/2008 | Barkley |
| 2008/0317575 A1 | 12/2008 | Yamazaki et al. |
| 2009/0028669 A1 | 1/2009 | Rebstock |
| 2009/0082907 A1 | 3/2009 | Stuvel et al. |
| 2009/0122443 A1 | 5/2009 | Farquhar et al. |
| 2009/0142169 A1 | 6/2009 | Garcia et al. |
| 2009/0153992 A1 | 6/2009 | Garcia et al. |
| 2009/0153993 A1 | 6/2009 | Garcia et al. |
| 2009/0153994 A1 | 6/2009 | Merrow et al. |
| 2009/0175705 A1 | 7/2009 | Nakao et al. |
| 2009/0261047 A1 | 10/2009 | Merrow |
| 2009/0261228 A1 | 10/2009 | Merrow |
| 2009/0261229 A1 | 10/2009 | Merrow |
| 2009/0262444 A1 | 10/2009 | Polyakov et al. |
| 2009/0262445 A1 | 10/2009 | Noble et al. |
| 2009/0262454 A1 | 10/2009 | Merrow |
| 2009/0262455 A1 | 10/2009 | Merrow |
| 2009/0265032 A1 | 10/2009 | Toscano et al. |
| 2009/0265043 A1 | 10/2009 | Merrow et al. |
| 2009/0265136 A1 | 10/2009 | Garcia et al. |
| 2009/0297328 A1 | 12/2009 | Slocum, III |
| 2010/0074404 A1 | 3/2010 | Ito |
| 2010/0083732 A1 | 4/2010 | Merrow et al. |
| 2010/0165498 A1 | 7/2010 | Merrow et al. |
| 2010/0165501 A1 | 7/2010 | Polyakov et al. |
| 2010/0168906 A1 | 7/2010 | Toscano et al. |
| 2010/0172722 A1 | 7/2010 | Noble et al. |
| 2010/0193661 A1 | 8/2010 | Merrow |
| 2010/0194253 A1 | 8/2010 | Merrow et al. |
| 2010/0195236 A1 | 8/2010 | Merrow et al. |
| 2010/0220183 A1 | 9/2010 | Yoro |
| 2010/0230885 A1 | 9/2010 | Di Stefano |
| 2010/0249993 A1 | 9/2010 | Mitsuyoshi |
| 2010/0265609 A1 | 10/2010 | Merrow et al. |
| 2010/0265610 A1 | 10/2010 | Merrow et al. |
| 2010/0279439 A1 | 11/2010 | Shah et al. |
| 2010/0283476 A1 | 11/2010 | Shen |
| 2010/0302678 A1 | 12/2010 | Merrow |
| 2011/0011844 A1 | 1/2011 | Merrow et al. |
| 2011/0012631 A1 | 1/2011 | Merrow et al. |
| 2011/0012632 A1 | 1/2011 | Merrow et al. |
| 2011/0013362 A1 | 1/2011 | Merrow et al. |
| 2011/0013665 A1 | 1/2011 | Merrow et al. |
| 2011/0013666 A1 | 1/2011 | Merrow et al. |
| 2011/0013667 A1 | 1/2011 | Merrow et al. |
| 2011/0064546 A1 | 3/2011 | Merrow |
| 2011/0074458 A1 | 3/2011 | Di Stefano et al. |
| 2011/0148020 A1 | 6/2011 | Kogure |
| 2011/0157825 A1 | 6/2011 | Merrow et al. |
| 2011/0172807 A1 | 7/2011 | Merrow |
| 2011/0185811 A1 | 8/2011 | Merrow et al. |
| 2011/0189934 A1 | 8/2011 | Merrow |
| 2011/0236163 A1 | 9/2011 | Smith et al. |
| 2011/0261483 A1 | 10/2011 | Campbell et al. |
| 2011/0305132 A1 | 12/2011 | Merrow et al. |
| 2011/0310724 A1 | 12/2011 | Martino |
| 2012/0023370 A1 | 1/2012 | Truebenbach |
| 2012/0034054 A1 | 2/2012 | Polyakov et al. |
| 2012/0050903 A1 | 3/2012 | Campbell et al. |
| 2012/0106351 A1 | 5/2012 | Gohel et al. |
| 2012/0321435 A1 | 12/2012 | Truebenbach |
| 2013/0071224 A1 | 3/2013 | Merrow et al. |
| 2013/0108253 A1 | 5/2013 | Akers et al. |
| 2013/0181576 A1 | 7/2013 | Shiozawa et al. |
| 2013/0200915 A1 | 8/2013 | Panagas |
| 2013/0256967 A1 | 10/2013 | Carvalho |
| 2013/0340445 A1 | 12/2013 | Yosef et al. |
| 2013/0345836 A1 | 12/2013 | Ikushima |
| 2014/0002123 A1 | 1/2014 | Lee |
| 2014/0093214 A1 | 4/2014 | Detofsky et al. |
| 2014/0160270 A1* | 6/2014 | Naito ............... G01R 31/2891 348/95 |
| 2014/0260333 A1 | 9/2014 | Lopez et al. |
| 2014/0271064 A1 | 9/2014 | Merrow et al. |
| 2014/0306728 A1 | 10/2014 | Arena et al. |
| 2015/0127986 A1 | 5/2015 | Tahara |
| 2016/0041202 A1 | 2/2016 | Peng et al. |
| 2017/0059635 A1 | 3/2017 | Orchanian et al. |
| 2017/0277185 A1 | 9/2017 | Duda et al. |
| 2018/0294244 A1* | 10/2018 | Onozawa ............ G03F 7/70666 |
| 2018/0313890 A1 | 11/2018 | Wolff |
| 2018/0314249 A1 | 11/2018 | Appu et al. |
| 2019/0064252 A1 | 2/2019 | Bowyer et al. |
| 2019/0064254 A1 | 2/2019 | Bowyer et al. |
| 2019/0064261 A1 | 2/2019 | Bowyer et al. |
| 2019/0064305 A1 | 2/2019 | Khalid |
| 2019/0277907 A1 | 9/2019 | Wolff et al. |
| 2020/0025823 A1 | 1/2020 | Teich et al. |
| 2020/0319231 A1 | 10/2020 | Adams et al. |

FOREIGN PATENT DOCUMENTS

| | | |
|---|---|---|
| CN | 1192544 A | 9/1998 |
| CN | 2341188 Y | 9/1999 |
| CN | 1114109 C | 7/2003 |
| DE | 3786944 T2 | 11/1993 |
| DE | 69111634 T2 | 5/1996 |
| DE | 69400145 T2 | 10/1996 |

(56) References Cited

FOREIGN PATENT DOCUMENTS

| | | |
|---|---|---|
| DE | 19701548 A1 | 8/1997 |
| DE | 19804813 A1 | 9/1998 |
| DE | 69614460 T2 | 6/2002 |
| DE | 69626584 T2 | 12/2003 |
| DE | 19861388 B4 | 8/2007 |
| EP | 0242970 A2 | 2/1987 |
| EP | 0277634 A2 | 8/1988 |
| EP | 0210497 B1 | 12/1988 |
| EP | 0356977 B1 | 10/1990 |
| EP | 0442642 A2 | 6/1991 |
| EP | 0466073 A2 | 1/1992 |
| EP | 0523633 A1 | 1/1993 |
| EP | 0582017 A1 | 2/1994 |
| EP | 0617570 A1 | 9/1994 |
| EP | 0635836 A1 | 1/1995 |
| EP | 0657887 A2 | 6/1995 |
| EP | 0757351 A2 | 2/1997 |
| EP | 0776009 B1 | 7/1997 |
| EP | 0757320 A2 | 2/1998 |
| EP | 0741508 A2 | 10/1998 |
| EP | 1045301 A2 | 10/2000 |
| EP | 0840476 B1 | 1/2001 |
| EP | 1209557 A2 | 5/2002 |
| EP | 1234308 B1 | 8/2002 |
| EP | 1422713 A2 | 5/2004 |
| EP | 1612798 B1 | 1/2006 |
| EP | 1760722 A1 | 3/2007 |
| GB | 2241118 A | 8/1991 |
| GB | 2276275 A | 9/1994 |
| GB | 2299436 A | 10/1996 |
| GB | 2312984 A | 11/1997 |
| GB | 2328782 A | 3/1999 |
| GB | 2347597 A | 9/2000 |
| GB | 2439844 A | 1/2008 |
| JP | 61115279 A | 6/1986 |
| JP | 62177621 A | 8/1987 |
| JP | 62239394 A | 10/1987 |
| JP | 62251915 A | 11/1987 |
| JP | 63002160 A | 1/1988 |
| JP | 63004483 A | 1/1988 |
| JP | 63016482 A | 1/1988 |
| JP | 63062057 A | 3/1988 |
| JP | 63201946 A | 8/1988 |
| JP | 63214972 A | 9/1988 |
| JP | 63269376 A | 11/1988 |
| JP | S63195697 U | 12/1988 |
| JP | 64-089034 A | 4/1989 |
| JP | 2091565 A | 3/1990 |
| JP | 2098197 A | 4/1990 |
| JP | 2185784 A | 7/1990 |
| JP | 2199690 A | 8/1990 |
| JP | 2278375 A | 11/1990 |
| JP | 2297770 A | 12/1990 |
| JP | 3008066 A | 1/1991 |
| JP | H03-8086 | 1/1991 |
| JP | 3078160 A | 4/1991 |
| JP | 3105704 A | 5/1991 |
| JP | 3207947 A | 9/1991 |
| JP | 3210662 A | 9/1991 |
| JP | 3212859 A | 9/1991 |
| JP | 3214490 A | 9/1991 |
| JP | 3240821 A | 10/1991 |
| JP | 3295071 A | 12/1991 |
| JP | 4017134 A | 1/1992 |
| JP | 4143989 A | 5/1992 |
| JP | 4172658 A | 6/1992 |
| JP | 4214288 A | 8/1992 |
| JP | 4247385 A | 9/1992 |
| JP | 4259956 A | 9/1992 |
| JP | 4307440 A | 10/1992 |
| JP | 4325923 A | 11/1992 |
| JP | 5035053 A | 2/1993 |
| JP | 5035415 A | 2/1993 |
| JP | 5066896 A | 3/1993 |
| JP | 5068257 A | 3/1993 |
| JP | 5073566 A | 3/1993 |
| JP | 5073803 A | 3/1993 |
| JP | 5101603 A | 4/1993 |
| JP | 5173718 A | 7/1993 |
| JP | 5189163 A | 7/1993 |
| JP | 5204725 A | 8/1993 |
| JP | 5223551 A | 8/1993 |
| JP | H05319520 A | 12/1993 |
| JP | 6004220 B2 | 1/1994 |
| JP | 6004981 A | 1/1994 |
| JP | H6162645 A | 6/1994 |
| JP | H6181561 A | 6/1994 |
| JP | H6215515 A | 8/1994 |
| JP | H6274943 A | 9/1994 |
| JP | 6314173 A | 11/1994 |
| JP | 7007321 B | 1/1995 |
| JP | 7029364 A | 1/1995 |
| JP | H07010212 A | 1/1995 |
| JP | 7037376 A | 2/1995 |
| JP | 7056654 A | 3/1995 |
| JP | 7111078 A | 4/1995 |
| JP | 7115497 A | 5/1995 |
| JP | 7201082 A | 8/1995 |
| JP | 7226023 A | 8/1995 |
| JP | H07-230669 | 8/1995 |
| JP | 1982246 C | 10/1995 |
| JP | 7257525 A | 10/1995 |
| JP | 7307059 A | 11/1995 |
| JP | H087994 B2 | 1/1996 |
| JP | 8030398 A | 2/1996 |
| JP | 8030407 A | 2/1996 |
| JP | 8079672 A | 3/1996 |
| JP | H08106776 A | 4/1996 |
| JP | H08110821 A | 4/1996 |
| JP | H08167231 A | 6/1996 |
| JP | H08212015 A | 8/1996 |
| JP | H08244313 A | 9/1996 |
| JP | H08263525 A | 10/1996 |
| JP | H08263909 A | 10/1996 |
| JP | 2553315 B2 | 11/1996 |
| JP | H08297957 A | 11/1996 |
| JP | 0944445 A | 2/1997 |
| JP | 09082081 A | 3/1997 |
| JP | H09064571 A | 3/1997 |
| JP | 2635127 B2 | 7/1997 |
| JP | H09306094 A | 11/1997 |
| JP | H09319466 A | 12/1997 |
| JP | 10040021 A | 2/1998 |
| JP | 10049365 A | 2/1998 |
| JP | 10064173 A | 3/1998 |
| JP | 10098521 A | 4/1998 |
| JP | 2771297 B2 | 7/1998 |
| JP | 10275137 A | 10/1998 |
| JP | 10281799 A | 10/1998 |
| JP | 10320128 A | 12/1998 |
| JP | 10340139 A | 12/1998 |
| JP | 2862679 B2 | 3/1999 |
| JP | 11134852 A | 5/1999 |
| JP | 11139839 A | 5/1999 |
| JP | 2906930 B2 | 6/1999 |
| JP | 11203201 A | 7/1999 |
| JP | 11213182 A | 8/1999 |
| JP | 11327800 A | 11/1999 |
| JP | 11353128 A | 12/1999 |
| JP | 11353129 A | 12/1999 |
| JP | 2000-56935 | 2/2000 |
| JP | 2000056935 A | 2/2000 |
| JP | 2000066845 A | 3/2000 |
| JP | 2000112831 A | 4/2000 |
| JP | 2000113563 A | 4/2000 |
| JP | 2000114759 A | 4/2000 |
| JP | 2000125290 A | 4/2000 |
| JP | 2000132704 A | 5/2000 |
| JP | 2000149431 A | 5/2000 |
| JP | 3052183 B2 | 6/2000 |
| JP | 2000228686 A | 8/2000 |
| JP | 2000236188 A | 8/2000 |
| JP | 2000242598 A | 9/2000 |
| JP | 3097994 B2 | 10/2000 |

(56) References Cited

FOREIGN PATENT DOCUMENTS

| | | | |
|---|---|---|---|
| JP | 2000278647 A | 10/2000 | |
| JP | 2000305860 A | 11/2000 | |
| JP | 2001005501 A | 1/2001 | |
| JP | 2001023270 A | 1/2001 | |
| JP | 2001100925 A | 4/2001 | |
| JP | 2002042446 A | 2/2002 | |
| JP | 2007087498 A | 4/2007 | |
| JP | 2007188615 A | 7/2007 | |
| JP | 2007220184 A | 8/2007 | |
| JP | 2007293936 A | 11/2007 | |
| JP | 2007305206 A | 11/2007 | |
| JP | 2007305290 A | 11/2007 | |
| JP | 2007328761 A | 12/2007 | |
| JP | 2008503824 A | 2/2008 | |
| JP | 2000235762 A | 2/2021 | |
| KR | 19980035445 A | 8/1998 | |
| KR | 0176527 B1 | 4/1999 | |
| KR | 10-0214308 B1 | 8/1999 | |
| KR | 10-0403039 B1 | 12/2003 | |
| KR | 10-2004-0053235 | 6/2004 | |
| KR | 10-0639436 | 10/2006 | |
| KR | 100639436 B1 | 10/2006 | |
| KR | 10-2007-0024354 | 3/2007 | |
| KR | 1020070024354 A | 3/2007 | |
| KR | 1020130093262 A | 8/2013 | |
| KR | 10-2013-0111915 A | 10/2013 | |
| KR | 10-1420185 | 9/2014 | |
| KR | 101420185 B1 | 9/2014 | |
| KR | 10-2017-0095655 | 8/2017 | |
| KR | 20170095655 A | 8/2017 | |
| KR | 200486462 Y1 | 5/2018 | |
| KR | 10-2019-0106616 | 9/2019 | |
| KR | 1020190106616 A | 9/2019 | |
| SG | 45223 A1 | 1/1998 | |
| TW | 387574 Y | 4/2000 | |
| WO | 198901682 A1 | 2/1989 | |
| WO | 1997006532 A1 | 2/1997 | |
| WO | 0049487 A1 | 8/2000 | |
| WO | 0067253 A1 | 11/2000 | |
| WO | 0109627 A2 | 2/2001 | |
| WO | 0141148 A1 | 6/2001 | |
| WO | 03013783 A1 | 2/2003 | |
| WO | 03021597 A1 | 3/2003 | |
| WO | 03021598 A1 | 3/2003 | |
| WO | 03067385 A2 | 8/2003 | |
| WO | 2004006260 A1 | 1/2004 | |
| WO | 2004114286 A1 | 12/2004 | |
| WO | 2005024830 A1 | 3/2005 | |
| WO | 2005024831 A1 | 3/2005 | |
| WO | 2005083749 | 9/2005 | |
| WO | 2005109131 A1 | 11/2005 | |
| WO | 2006030185 A1 | 3/2006 | |
| WO | 2006048611 A1 | 5/2006 | |
| WO | 2006100441 A1 | 9/2006 | |
| WO | 2006100445 A1 | 9/2006 | |
| WO | 2007031729 A1 | 3/2007 | |
| WO | 2019217057 | 11/2019 | |

OTHER PUBLICATIONS

International Preliminary Report on Patentability in Application No. PCT/US2021/055895 dated May 4, 2023, 9 pages.
International Preliminary Report on Patentability in Application No. PCT/US2021/055903 dated May 4, 2023, 7 pages.
International Preliminary Report on Patentability in Application No. PCT/US2021/055899 dated May 4, 2023, 8 pages.
International Preliminary Report on Patentability in Application No. PCT/US2021/055901 dated May 4, 2023, 8 pages.
International Preliminary Report on Patentability for PCT/US2018/046725, 6 pages (dated Mar. 12, 2020).
Office Action dated Sep. 19, 2019 in U.S. Appl. No. 15/688,048; response thereto, and application as filed.
International Preliminary Report on Patentability for PCT/US2018/046734, 8 pages (dated Mar. 12, 2020).
International Preliminary Report on Patentability for PCT/US2018/046740, 6 pages (dated Mar. 12, 2020).
Final Office Action for U.S. Appl. No. 15/688,048 (50 pages) dated Feb. 18, 2020.
Non-Final Office Action for U.S. Appl. No. 15/688,048 (50 pages) dated Jun. 12, 2020.
Final Office Action for U.S. Appl. No. 15/688,104 (45 pages) dated Mar. 4, 2020.
Final Office Action for U.S. Appl. No. 15/688,112 (43 pages) dated Dec. 11, 2019.
Non-Final Office Action for U.S. Appl. No. 15/688,112 (66 pages) dated Mar. 5, 2020.
International Search Report for PCT/US2019/38909, 3 pages (dated Oct. 11, 2019).
Written Opinion for PCT/US2019/38909, 8 pages {dated Oct. 11, 2019).
International Preliminary Report on Patentability for PCT/US2018/046720, 8 pages (dated Mar. 12, 2020).
Office Action dated Oct. 2, 2019 in U.S. Appl. No. 15/688,073; response thereto; and application as filed.
International Search Report for PCT/US2016/046720. 3 pages (dated Dec. 11, 2018).
Written Opinion for PCT/US2016/046720 7 pages (dated Dec. 11, 2018).
Abraham et al., "Thermal Proximity Imaging of Hard-Disk Substrates", IEEE Transactions on Mathematics 36:3997-4004, Nov. 2000.
Abramovitch, "Rejecting Rotational Disturbances on Small Disk Drives Using Rotational Accelerometers", Proceedings of the 1996 IFAC World Congress in San Francisco, CA, 8 pages (Jul. 1996).
Ali et al., "Modeling and Simulation of Hard Disk Drive Final Assembly Using a HDD Template" Proceedings of the 2007 Winter Simulation Conference, IEEE pp. 1641-1650 (2007).
Anderson el al., "Clinical chemistry: concepts and applications", The McGraw-Hill Companies,Inc. DP. 131-132 2003.
Anderson et al., "High Reliability Variable Load Time Controllable Vibration Free Thermal Processing Environment", Delphion, 3 pages (Dec. 1993). https://www.delphion.com/tdbs/tdb?order=93A +63418 (retrieved Mar. 18, 2009).
Asbrand, "Engineers at One Company Share the Pride and the Profits of Successful Product Design", Professional Issues, 4 pages. 1987.
Bair et al., "Measurements of Asperity Temperatures of a Read/Write Head Slider Bearing in Hard Maanetic Recording Disks", Journal of Tribology 113:547-554, Jul. 1991.
Bakken et al., "Low Cost, Rack Mounted, Direct Access Disk Storage Device", Delphion, 2 pages (Mar. 1977). http://www.delp;hion.com/tdbs/tdb (retrieved Mar. 3, 2005).
Biber et al., "Disk Drive Drawer Thermal Management", Advances in Electronic Packaging vol. 1:43-46, 1995.
Christensen, "How Can Great firms Fail? Insights from the hard Disk Drive Industry", Harvard Business School Press, pp. 1-26, 2006.
Chung et al., "Vibration Absorber for Reduction of the In-plane Vibration in an Optical Disk Drive", IEEE Transactions on Consumer Electronics, Vo. 48, May 2004.
Curtis et al., "InPhase Professional Archive Drive Architecture", InPhase Technologies, Inc., 6 pages (Dec. 17, 2007) http://www.science.edu/TechoftheYear/Nominees/InPhase.
Exhibit 1 in *Xyratex Technology, LTD v. Teradyne, Inc.*; Newspaper picture that displays the CSO tester; 1990.
Exhibit 1314 in *Xyratex Technology, LTD. V. Teradyne, Inc.*; Case, "Last products of Disk-File Development at Hursley and Millbrook," IBM, Oct. 12, 1990.
Exhibit 1315 in *Xyratex Technology, LTD. V. Teradyne, Inc.*; Case, "History of Disk-File Development at Hursley and Millbrook," IBM, Oct. 17, 1990.
Exhibit 1326 in *Xyratex Technology, LTD v. Teradyne, Inc.*; Image of the back of Exhibit 1 and Exhibit 2 photos, which display the photos dates; 1990.
Exhibit 2 in *Xyratex Technology, LTD v. Teradyne, Inc.*; Photos of the CSO tester obtained from Hitachi; 1990.

(56) References Cited

OTHER PUBLICATIONS

Findeis et al., "Vibration Isolation Techniques Suitable for Portable Electronic Speckle Pattern Interferometry", Proc. SPIE vol. 4704, pp. 159-167, 2002; http://www.ndt.uct.ac.za/Paoers/soiendt2002.pdf.
FlexStar Technology, "A World of Storage Testing Solutions," http://www.flexstar.com, 1 page (1999).
FlexStar Technology, "Environment Chamber Products," http://www.flexstar.com, 1 page (1999).
FlexStar Technology. "FlexStar's Family of Products," http://www.flexstar.com, 1 page (1999).
FlexStar Technology, 30E/Cascade Users Manual, Doc #98-36387-00 Rev. 1.8, pp. 1-33, Jun. 1, 2004.
Frankovich, "The Basics of Vibration Isolation Using Elastomeric Materials", Aearo EAR Specialty Composites, 8 pages (2005) http://www.isoloss.com/11dfs/engineering/Basicsofvibrationisolation.
Grochowski et al., "Future Trends in Hard Disk Drives", IEEE Transactions on Magnetics, 32(3): 1850-1854 (May 1996).
Gurumurthi et al., "Disk Drive Roadmap from the Thermal Perspective: A Case for Dynamic Thermal Management", International Symposium on Computer Architecture Proceedings of the 32nd Annual International Symposium on Computer Architecture, Technical Report CSE-05-001, pp. 38-49 (Feb. 2005).
Gurumurthi et al., "Thermal Issues in Disk Drive Desian: Challenges and Possible Solutions", ACM Transactions on Storage, 2(1): 41-73 (Feb. 2006).
Gurumurthi, "The Need for temperature-Aware Storage Systems", The Tenth Intersociety conference on Thermal and Thermomechanical Phenomena in Electronics, pp. 387-394, 2006.
Haddad et al., "A new Mounting Adapter for Computer Peripherals with Improved Reliability, Thermal Distribution, Low Noise and Vibration Reduction", ISPS, Advances in Information Storage and Processing Systems. 1:97-108, 1995.
HighBeam Research website "ACT debuts six-zone catalytic gas heater. (American Catalytic Technologies offers new heaters)", 4 pages (Oct. 26, 1998). http://www.highbeam.com.
HighBeam Research website "Asynchronous Testing Increases Throughout", 7 pages (Dec. 1, 2000). http://www.highbeam.com.
High Beam Research website "Credence announces Production Release of the EPRO AQ Series for Integrated Test and Back-end Processing", 4 pages (1995). http://www.highbeam.com.
HighBeam Research website "Test Multiple Parts at Once for Air Leaks. (Brief Article)", 1 page (1999) http://www.highbeam.com.
Iwamiya, "Hard Drive Cooling Using a Thermoelectric Cooler", EEP—vol. 19-2, Advances in Electronic Packaging, vol. 2:2203-2208, ASME 1997.
Johnson et al., "Performance Measurements of Tertiary Storage Devices", Proceedings of the 24th VLDB Conference. New York. pp. 50-61 1998.
Ku, "Investigation of Hydrodynamic Bearing Friction in Data Storage information System Spindle Motors", ISPS vol. 1, Advances in Information Storage and Processing Systems, pp. 159-165, ASME 1995.
Lindner, "Disk drive mounting", IBM Technical Disclosure Brochure, vol. 16, No. 3, pp. 903-904 Aug. 1973.
Low, Y.L. et al., "Thermal network model for temperature prediction in hard disk drive", Microsyst Technol, 15: 1653-1656 (2009).
McAuley, "Recursive Time Trapping for Synchronization of Product and CHAMBER Profiles for Stress Test", Delphion, 3 pages (Jun. 1988), https://www.delphion.com/tdbs/tdb, (retrieved Mar. 18, 2009).
Morgenstern, Micropolis Drives Target High-end Apps; Technology Provides Higher Uninterrupted Data Transfer. (Applications; Microdisk AV LS 3020 and 1050AV and 1760AV LT Stackable Hard Drive Systems) (Product Announcement) MacWeek, vol. 8, No. 6, p. 8; Feb. 7, 1994.
Morris, "Zero Cost Power and Cooling Monitor System", 3 pages (Jun. 1994) https://www.delphion.com/tdbs/tdb (retrieved Jan. 15, 2008).
Nagarajan, "Survey of Cleaning and cleanliness Measurement in Disk Drive Manufacture", North Carolina Department of Environment and Natural Resources, 13-21 (Feb. 1997).
Park, "Vibration and Noise Reduction of an Optical Disk Drive by Using a Vibration Absorber Methods and Apparatus for Securing Disk Drives in a Disk", IEEE Transactions on Consumer Electronics. vol. 48. Nov. 2002.
Prater et al., "Thermal and Heat-Flow Aspects of Actuators for Hard Disk Drives", InterSociety Conference on Thermal Phenomena, pp. 261-268 1994.
Ruwart et al., "Performance Impact of External Vibration on Consumer-grade and enterprise-class Disk Drives", Proceedings of the 22nd IEEE/13th Goddard Conference on Mass Storage Systems and Technoloaies 2005.
Schroeder et al., "Disk Failures in the Real World: What does an MTTP of 1,000,000 hours mean to you?", in FAST'07: 5th USENIX Conference on File and Storage Technologies, San Jose, CA, Feb. 14-16, 2007.
Schulze et al., "How Reliable Is a Raid?," COMPCON Spring apos; 89, Thirty-Fourth IEEE Computer Society International Conference: Intellectual Leverage, Digest of papers; pp. 118-123. Feb. 27-Mar. 3, 1989.
Seagate Product Marketing, "Seagate's Advanced Multidrive System (SAMS) Rotational Vibration Feature", Publication TP-229D, Feb. 2000.
Suwa et al., "Evaluation System for Residual Vibration from HDD Mounting Mechanism" IEEE Transactions on Magnetics, vol. 35. No. 2, pp. 868-873. Mar. 1999.
Suwa et al., "Rotational Vibration Suppressor" IBM Technical Disclosure Bulletin Oct. 1991.
Terwiesch et al., "An Exploratory Study of International Product Transfer and Production Ramp-Up in the Data Storage Industry", The Information Storage Industry Center, University of California, pp. 1-31, 1999. www-iros.ucsd.edu/sloan/.
Tzeng, "Dynamic Torque Characteristics of Disk-Drive Spindle Bearings", ISPS—vol. 1, Advances in Information Storage and Processing Systems, pp. 57-63, ASME 1995.
Tzeng, "Measurements of Transient Thermal Strains in a Disk-Drive Actuator", InterSociety conference on Thermal Phenomena, pp. 269-274, 1994.
Wilson—7000 disk Drive Analyzer Product Literature, date accessed Jan. 28, 2009, 2 pages.
Winchester, "Automation Specialists Use Machine Vision as a System Development Tool", IEE Computing & Control Engineering, Jun./Jul. 2003.
Xyratex Product Test brochure, "Automated Production Test Solutions", 2006.
*Xyratex Technology, LTD.* V. *Teradyne, Inc.*, Amended Joint Trial Exhibit List of Xyratex and Teradvne. Case No. CV 08-04545 SJO (PLAx). Nov. 12, 2009.
*Xyratex Technology, LTD.* V. *Teradyne, Inc.*, Teradyne, Inc's Prior Art Notice Pursuant to 35; U.S.C. Section 282. Case No. CV 08-04545 SJO (PLAx), Oct. 16, 2009.
Xyratex to Debut its New Automated Test Solution for 2.5-inch Disk Drives at Diskcon USA 2004, PR Newswire Europe (2004).
Xyratex, "Continuous Innovation—Production Test Systems" www.xyratex.com/Products/production-test-system (1995-2008).
Xyratex, "Key Advantages—Production Test Systems" www.xyratex.com/Products/production-test-system (1995-2008).
Xyratex, "Process Challenges in the Hard Drive Industry" slide presentation, Asian Diskcon (2006).
Xyratex, "Production Test Systems" www.xyratex.com/Products/production-test-system (1995-2008).
Xyratex, "Single cell—Production Test Systems" www.xyratex.com/Products/production-test-system (1995-2008).
Xyratex, "Storage Infrastructure" www.xyratex.com/Products/storage-infrastructure/default.aspx (1995-2008).
Xyratex, "Testing Drives Colder—Production Test Systems" www.xyratex.com/Products/production-test-system (1995-2008).
International Search Report for International Patent Application No. PCT/US2021/055895, dated Feb. 4, 2022, (3 pages).
Written Opinion for International Patent Application No. PCT/US2021/055895, dated Feb. 4, 2022, (7 pages).

(56) References Cited

OTHER PUBLICATIONS

Action and Response History for U.S. Appl. No. 15/688,048, 183 pages.
Action and Response History for U.S. Appl. No. 15/688,073, 48 pages.
Action and Response History for U.S. Appl. No. 15/688,112, 251 pages.
Action and Response History for U.S. Appl. No. 15/688,104, 206 pages.
International Preliminary Report on Patentability for PCT/US2019/038909, 10 pages (dated Mar. 4, 2021).
International Search Report and Written Opinion for PCT/US2018/046725, 9 pages (dated Jan. 28, 2019).
International Search Report and Written Opinion for PCT/US2018/046734, 11 pages (dated Dec. 11, 2018).
International Search Report and Written Opinion for PCT/US2018/046740, 8 pages (dated Dec. 5, 2018).
International Search Report & Written Opinion for International Patent Application No. PCT/US2021/055898 , 9 pages (dated Feb. 11, 2022).
International Search Report & Written Opinion for International Patent Application No. PCT/US2021/055899 , 10 pages (dated Feb. 11, 2022).
International Search Report & Written Opinion for International Patent Application No. PCT/US2021/055901, 9 pages (dated Feb. 9, 2022).
International Search Report & Written Opinion for International Patent Application No. PCT/US2021/055903, 8 pages (dated Feb. 15, 2022).
Henderson, "Had High Aerial Densities Require Solid Test Fixtures", Flexstar Technology, 3 pages (Feb. 26, 2007).
U.S. Appl. No. 17/077,827, Vision System for an Automated Test System, filed Oct. 22, 2020.
U.S. Appl. No. 17/077,824, Automated Test System, filed Oct. 22, 2020.
U.S. Appl. No. 17/077,816, Thermal Control System for an Automated Test System, filed Oct. 22, 2020.
U.S. Appl. No. 17/077,834, Modular Automated Test System, filed Oct. 22, 2020.
U.S. Appl. No. 17/077,804, Test Site Configuration in an Automated Test System, filed Oct. 22, 2020.

* cited by examiner

- 130mm x 160mm test board sizes
- 88 total test sites

- 200mm x 250mm test board sizes
- 35 total test sites

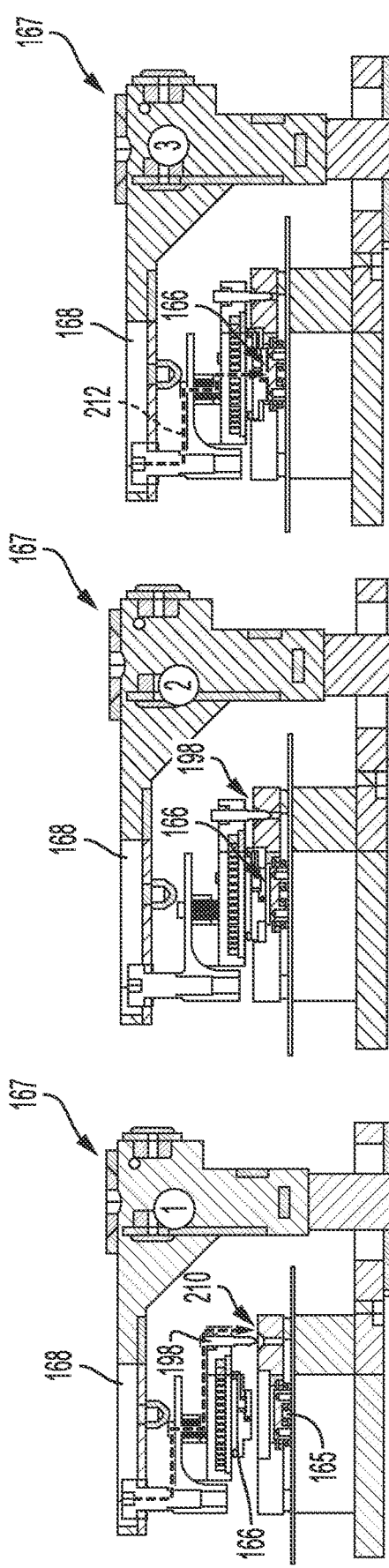
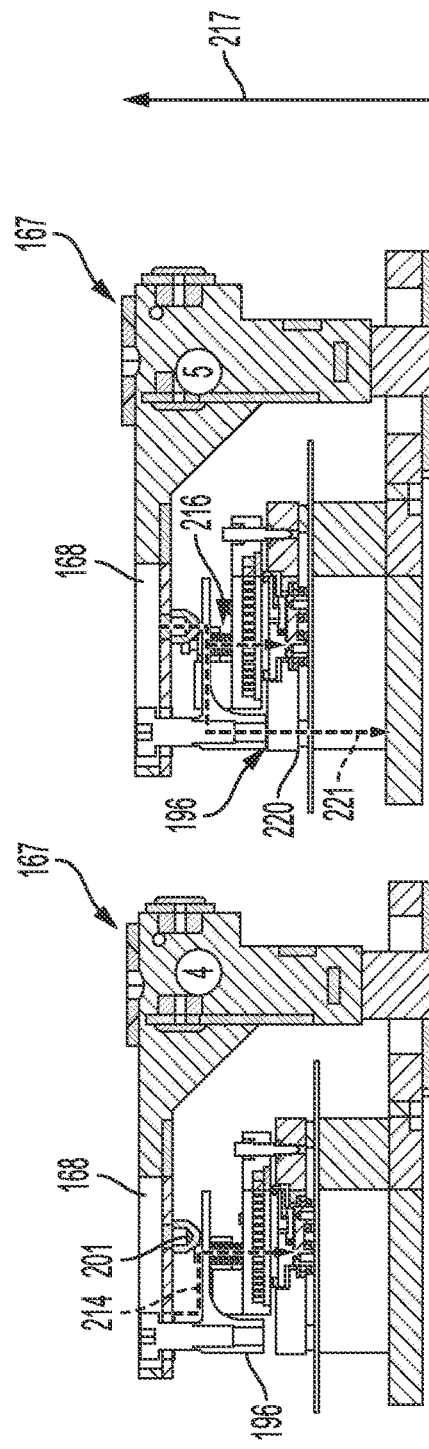
FIG. 53
FIG. 54
FIG. 55
FIG. 56
FIG. 57

VISION SYSTEM FOR AN AUTOMATED TEST SYSTEM

TECHNICAL FIELD

This specification relates generally to automated test systems and components thereof.

BACKGROUND

System-level testing (SLT) involves testing an entire device, rather than individual components of the device. If the device passes a battery of system-level tests, it is assumed that the individual components of the device are operating properly. SLT has become more prevalent as the complexity of, and number of components in, devices have increased. For example, a chip-implemented system, such as an application-specific integrated circuit (ASIC), may be tested on a system level in order to determine that components that comprise the system are functioning correctly.

SUMMARY

An example test system includes packs. The packs include test sockets for testing devices under test (DUTs) and at least some test electronics for performing tests on the DUTs in the test sockets. Different packs are configured to have different configurations. The different configurations include at least different numbers of test sockets arranged at different pitches. The example test system may include one or more of the following features, either alone or in combination.

The example test system may include pick-and-place automation configured to move the DUTs into and out of the test sockets. The pick-and-place automation may be configured at least to service the packs having different configurations. The pick-and-place automation may be configurable to transport different types of DUTs. The pick-and-place automation may be configurable based on test time and throughput.

Each of the packs may be modular and can be moved into and out of—for example, completely out of—the test system during operation of the pick-and-place automation on test sockets contained on a different pack. A pack may include one or more rows, with each row containing one or more test sockets. Each test socket may be associated with an actuator to place a lid over the test socket or to remove the lid from the test socket. At least two of the rows of a pack may be configurable to hold different types of DUTs. One or more of the packs—for example each pack—may be configured to hold and to test different types of DUTs.

The test system may include a cool atrium that houses the test sockets and that is supplied with cooled air, and a warm atrium arranged to receive air from the cool atrium that has been warmed as a result of testing the DUTs. The warm atrium may be one of multiple warm atriums, with each warm atrium being for a different pack. The test system may include an air-to-liquid heat exchanger to produce the cool air from circulated warm air from the warm atrium, and one or more fans to move the cool air into the cool atrium. The test system may include an ionized air supply and one or more fans to move ionized air from the ionized air supply over at least some of the test sockets. The test system may include a thermal control system to independently and asynchronously control a temperature of individual test sockets.

As noted, the pick-and-place automation may be configured to move the DUTs into and out of the test sockets and the pick-and-place automation may be configured at least to service the different configurations of the packs. The pick-and-place automation system may include pickers for picking DUTs from the test sockets and/or placing the DUTs into the test sockets and a gantry on which the pickers are mounted. The gantry may be configured to move the pickers relative to the test sockets to position the pickers for picking the DUTs from the test sockets or placing the DUTs into the test sockets. The pickers may be operable independently and simultaneously. The pickers and gantry are robotics for the test system and may be arranged in a layer above the test sockets The pickers and gantry may be the only robotics for the test system that are arranged in the layer above the test sockets. The test system may include trays having cells for holding at least one of DUTs to be tested or DUTs that have been tested. The pickers may be configured to pick the DUTs to be tested from the trays and to place the DUTs to be tested in the test sockets, and to pick the DUTs that have been tested from the test sockets and to place the DUTs that have been tested into the trays.

The test system may include a housing in which the pickers and the gantry are mounted and in which the packs are held. A pack may be movable into or out of the housing during operation of the pick-and-place automation on a different one of the packs. The pickers may be operable independently in four degrees of freedom. The pickers may each be operable independently in four degrees of freedom.

Testing performed on the DUTs by the test system may include system-level tests. A first one of the packs may include one or more test sockets and a second one of the packs may include two or more test sockets. The different configurations may accommodate different types of DUTs in the test system at a same time. The different configurations may support different types of DUTs having different form factors in the test system at a same time. The different configurations may support different types of DUTs having different electrical interfaces in the test system at a same time. The different configurations may support different types of DUTs having different thermal requirements in the test system at a same time. The different configurations may support different types of DUTs having different physical interfaces in the test system at a same time. The different configurations may support different types of DUTs having different wireless functionalities in the test system at a same time. The different configurations may support different types of DUTs having electro-mechanical interfaces in the test system at a same time.

An example test system includes a test socket for testing a DUT, a lid for the test socket, and an actuator configured to force the lid onto the test socket and to remove the lid from the test socket. The actuator includes an upper arm to move the lid, an attachment mechanism connected to the upper arm to contact the lid, where the attachment mechanism is configured to allow the lid to float relative to the test socket to enable alignment between the lid and the test socket, and a lower arm to anchor the actuator to a board containing the test socket. The actuator is configured to move the upper arm linearly towards and away from the test socket and to rotate the upper arm towards and away from the test socket. The example test system may include one or more of the following features, either alone or in combination.

The attachment mechanism may include one or more springs between the upper arm and the lid and a gimbal connected to the upper arm and arranged to contact a stop plate that connects to the lid and that limits movement of the lid. The lid may be, or be part of, a lid assembly that includes alignment pins to align the lid assembly to complementary holes associated with the test socket. The lid assembly may include a cap to contact the DUT, a thermoelectric cooler (TEC) in contact with the cap, a thermally-conductive plate in contact with the TEC, and the stop plate in contact with the thermally-conductive plate. The stop plate may be configured to make contact with a frame of the test socket when the actuator forces the lid onto the test socket.

The lid assembly may include a coolant line to bring liquid coolant to the thermally-conductive plate and a spring between the stop plate and the thermally-conductive plate. The lid assembly may include one or more heaters thermally connected to the thermally-conductive plate. The one or more heaters may be controllable to increase in temperature. The test system may also include a first temperature sensor at the cap to detect a temperature proximate to the DUT and a second temperature sensor at the cap to detect a temperature at the cap that is farther away from the DUT than the temperature detected by the first temperature sensor.

The upper arm may be part of an assembly that includes cable grommets to hold conduits that route at least one of electrical signals or liquid coolant to and from the lid.

The attachment mechanism may be configured to allow the lid to float in multiple degrees of freedom—for example, using the gimbal and spring. In examples, the attachment mechanism may be configured to allow the lid to float in at least three degrees of freedom, the attachment mechanism may be configured to allow the lid to float in at least four degrees of freedom, the attachment mechanism may be configured to allow the lid to float in at least five degrees of freedom, or the attachment mechanism may be configured to allow the lid to float in six degrees of freedom. During float, the attachment mechanism may be configured to allow the lid to move in a single dimension by an amount measured in triple-digit microns (single-digit millimeters) or less.

The lid may include a lid assembly. The lid assembly may include a TEC in thermal communication with the DUT, a thermally-conductive structure in contact with the TEC, and a stop structure such as the stop plate in contact with the thermally-conductive structure. The stop structure is configured to make contact with the frame of the test socket when the actuator forces the lid onto the test socket.

The test system may include an enclosure around the test socket. The enclosure may have an opening to allow the actuator to force the lid onto the test socket and to remove the lid from the test socket. The actuator may be configured to hold a cover to close the opening to hermetically seal the enclosure and to thermally isolate the enclosure when the opening is closed or plugged by the cover. The actuator may be configured to move the cover over the opening when the actuator forces the lid onto the test socket. The enclosure may include a port that is connectable to a vacuum source or to a gas source. The test socket may include one or more fins that extend upward and/or downward from the test socket for heat dissipation.

An example test system may include a test socket for testing a DUT, a lid for the test socket, and an actuator configured to force the lid onto the test socket and to remove the lid from the test socket. The actuator includes an upper arm to hold the lid and a lower arm to anchor the actuator to a board containing the test socket. The actuator is controllable based on proper placement of the DUT in the test socket to rotate the upper arm toward the test socket and to force the upper arm holding the lid towards the test socket in order to force the lid onto the test socket and against the DUT in the test socket.

An example method of placing a lid on a test socket of a test system includes the following operations: roughly aligning the lid and the test socket; following rough alignment, finely aligning the lid to the test socket by moving a cap of the lid over a complementary portion of the test socket containing a DUT; moving the lid downward into the test socket so that the cap contacts the DUT while the lid floats relative to the test socket, where floating includes multi-dimensional movement of the lid relative to the test socket; continuing to move the lid downward thereby forcing the lid against the DUT until a stop plate prevents further movement; and retaining the lid forced against the test socket during testing of the DUT by the test system. The example method may include one or more of the following features, either alone or in combination.

Roughly aligning may include rotating the lid into position over the test socket such that alignment pins associated with the lid align to corresponding alignment sockets on the test socket. Finely aligning may include adjusting a position the lid so that the lid is properly aligned to at least one of the DUT or the test socket.

An example test system includes test sites that include test sockets for testing DUTs and pickers for picking DUTs from the test sockets and/or for placing the DUTs into the test sockets. Each picker may include a picker head for holding a DUT. The test system also includes a gantry on which the pickers are mounted. The gantry may be configured to move the pickers relative to the test sites to position the pickers for picking the DUTs from the test sockets or placing the DUTs into the test sockets. The test sockets are arranged in at least one array that is accessible to the pickers on the gantry. The example test system may include one or more of the following features, either alone or in combination.

The gantry may include a beam that spans across the at least one array of test sockets and that is configured to move over the at least one array of test sockets in a direction perpendicular to the beam. The pickers may be arranged linearly along the beam and may be configured to move linearly along the beam. The pickers may be controllable to move linearly along the beam to change a pitch of the pickers along the beam. The pickers may be controllable to move linearly along the beam to change the pitch while the beam moves over the at least one array of test sockets in the direction perpendicular to the beam.

The test system may include packs that include the test sockets and at least some test electronics for performing tests on the DUTs in the test sockets. Different packs are configurable to have different configurations. The different configurations may include at least different numbers of test sockets arranged at different pitches. The pickers may be controllable to move linearly along the beam to change the pitch to match pitches of different sets of test sockets in different packs installed in the test system. The pickers may be configured to service multiple test sockets simultaneously, where servicing may include at least one of placing DUTs into the multiple test sockets or picking DUTs from the multiple test sockets. One or more of the pickers may be configured, through servo-control, to move at least partly perpendicularly or obliquely relative to the beam in order to finely align with one or more respective test sockets. Such movement is referred to as the Y-axis jog, as described herein.

The test system may include one or more temperature sensors configured to sense a temperature of at least one of the gantry or the test sockets and a control system that is servo-based to change a position of one or more of the pickers to compensate for thermal expansion of at least one of the gantry or the test sockets. The test system may include an encoder scale attached to a frame such as a force frame of the test system, and an encoder reader attached to the gantry. The control system is configured to identify vibrations in the test system based on an output of the encoder reader and to control operation of the test system to counteract the vibrations.

As noted, the test system may include packs that include the test sockets and at least some test electronics for performing tests on the DUTs in the test sockets. Different packs are configurable to have different configurations for DUTs having different characteristics. The pickers are controllable, and a number of the pickers is scalable, based on characteristics of the packs and/or the test sockets in the packs.

Each picker head may include a nozzle to hold a DUT using at least vacuum pressure. Examples of nozzles include, but are not limited to, of the following: a soft polymer vacuum cup that includes electrostatic-discharge (ESD) dissipative material, a hard plastic tip that includes ESD dissipative material, a hard material that includes an integrated ejection collar to accommodate roll and pitch changes of a DUT, or a soft polymer vacuum cup that includes an integrated ejection collar configured to reduce stiction between the nozzle and the DUT.

The test system may include a feeder configured to hold trays having cells for holding at least some DUTs to be tested or at least some DUTs that have been tested. The pickers may be configured to pick the DUTs to be tested from some of the cells and to place the DUTs that have been tested into others of the cells. The trays may be arranged in a plane that is parallel to, or a co-planar with, a plane in which at least some (for example, some or all) of the test sockets are arranged.

The gantry that holds the pickers in the test system may include a first beam that spans across the at least one array of test sockets and that is configured to move relative to the test sockets and a second beam that spans across the at least one array of test sockets and that is configured to move relative to the test sockets. One or more of the pickers may be arranged linearly along the first beam and one or more of the pickers may be arranged linearly along the second beam. The gantry that holds the pickers may be a main gantry and the test system may also include a LASER cleaning assembly and an auxiliary gantry built onto a same bearing system as the main gantry. The LASER cleaning assembly may be connected to the auxiliary gantry. The auxiliary gantry may be configured to move the LASER cleaning assembly relative to the test sockets in order to clean the test sockets using LASER light.

A pack in the test system may include test sockets and at least some test electronics for performing tests on the DUTs in the test sockets. The pack may be one of multiple different packs that are installed in the test system and that support at least one of different types of DUTs, different configurations of DUTs, different numbers of DUTs, DUTs having different physical interfaces, DUTs having different electrical interfaces, DUTs having different form factors, or DUTs having different sizes. A control system may be configured to control the auxiliary gantry and the LASER cleaning assembly to clean the test sockets while the pack is installed in the test system.

The pickers may be controllable to move in three or more degrees of freedom relative to the test sockets. The three or more degrees of freedom may include left-right, forward-backward, up-down, and rotation. The test system may include a machine vision system configured to detect placement of a DUT in a test socket, a picker holding a DUT, and a configuration and orientation of a test socket. The gantry may have a settling time that is at most +/−10 microns in less than 20 milliseconds.

The pickers may be or include linear actuators. Each linear actuator may be configured to extend or to retract a respective picker head. When a picker head is retracted, the picker has sufficient clearance to pass over the test sockets including when the test sockets contain DUTs. Each picker may be configured for linear movement along part of the gantry to adjust for different center-to-center distances between DUTs in the test sockets or DUTs in trays included in the test system. Linear magnetic motors may be controlled by the control system to position the gantry for DUT pick-up, placement, and measurement operations. Linear magnetic motors may be controlled by the control system to position the pickers perpendicularly or obliquely to motion of the gantry for DUT pick-up, placement, and measurement operations.

An example test system includes test sites that include sockets for testing DUTs, pickers for picking DUTs from the sockets or placing the DUTs in the sockets, and a gantry on which the pickers are mounted. The gantry is configured to move the pickers relative to the test sites to position the pickers for picking the DUTs from the sockets or for placing the DUTs into the sockets. The test system also includes one or more LASER range finders mounted on the gantry for movement over the DUTs in the sockets and in conjunction with movement of the pickers. A LASER range finder among the one or more LASER range finders mounted on the gantry is configured to detect a distance to a DUT placed into a socket. The example test system may include one or more of the following features, either alone or in combination.

A control system may be configured to determine a plane of the DUT based on multiple distances detected by the LASER range finder, and to determine whether the DUT has been placed properly in the socket based on the plane of the DUT. The control system may be configured to determine whether or not to place a lid over the socket based on whether the DUT has been placed properly into the socket. The control system may be configured to control movement of the lid to be placed over the socket when the DUT has been placed properly in the socket. The control system may be configured to control the lid not to be placed over the socket when the DUT has been placed improperly in the socket.

The LASER range finder may include a one-dimensional (1D) LASER range finder. Each LASER range finder may be mounted on to a respective picker. The LASER range finder may be configured to detect distances to the DUT placed into the socket in parallel with movement of the gantry following placement of the DUT into the socket.

An example test system includes test sites that include sockets for testing DUTs, pickers for picking DUTs from the sockets or placing the DUTs into the sockets, and a gantry on which the pickers are mounted. The gantry may be configured to move the pickers relative to the sockets to position the pickers for picking the DUTs from the sockets or placing the DUTs into the sockets. A scanner may be configured to face the sockets and to move over the sockets. The scanner may be configured to capture three-dimensional data (3D) representing a structure of at least part of a socket. A camera may be configured to face the sockets and to move over the sockets. The scanner or camera may be configured to capture 3D representing a structure of at least part of a socket. The example test system may include one or more of the following features, either alone or in combination.

The example test system may include a control system to determine a location and an orientation of the socket based on the 3D data. The control system may be configured to determine a plane of the socket, a roll and pitch of the plane, and a height of the plane relative to a base holding the sockets. The control system may be configured to determine Cartesian X, Y, and Z coordinates of the plane and a yaw of the plane. The control system may be configured to determine the Cartesian X, Y, and Z coordinates of the plane and the yaw of the plane based on features associated with the socket. The control system may be configured to control a picker to place a DUT into the socket based on the location and orientation of the socket. The control system may be configured to control the picker to place the DUT into the socket at a precision measured in single-digit microns ($\mu m$). The 3D data may include a 3D point cloud.

An example test system includes trays that include cells for holding at least one of devices to be tested or devices that have been tested, pickers for picking the devices to be tested from the trays and for placing the devices that have been tested into the trays, and a gantry on which the pickers are mounted. The gantry is configured to move the pickers relative to the cells to position the pickers for picking the devices to be tested or for placing the devices that have been tested. The test system also includes a scanner configured for movement over the trays. The scanner may be configured to capture 3D representing structures of the trays and the presence or absence of devices in at least some of the cells. A control system is configured to determine, based on the 3D data, which of the cells contains devices and whether devices in the cells are placed properly. The example test system may include one or more of the following features, either alone or in combination.

For a tray or each tray, the control system may be configured to perform a comparison based on 3D data for the tray and a predefined model of the model of the tray. For a tray or each, the control system may be configured to compare a representation of the tray based on the 3D data to a predefined model of the tray. Determining whether a device in a cell is placed properly may include determining whether the device in the cell is at a prescribed orientation or with an acceptable tolerance of the prescribed orientation. The 3D data may include a 3D point cloud. The scanner may include a 3D scanner mounted on a linear motorized axis over the trays. In some implementations, a 3D camera may replace the 3D scanner.

An example test system includes test sites that include sockets for testing DUTs, pickers for picking DUTs from the sockets or placing the DUTs in the sockets, and a gantry on which the pickers are mounted. The gantry may be configured to move the pickers relative to the sockets to position the pickers for picking the DUTs from the sockets or for placing the DUTs into the sockets. The test system may also include a scanner. The scanner may be configured to face towards (e.g., upwards towards) a DUT held by a picker that is controlled to place the DUT in a socket at a test site. The scanner may be configured to capture 3D representing the picker holding the DUT prior to placement of the DUT in the socket. A control system is configured to determine, based on the 3D data, whether the DUT is properly oriented for placement in the socket. The example test system may include one or more of the following features, either alone or in combination.

The scanner may include a 3D scanner that is oriented to face upwards toward a bottom of the DUT. The scanner may be a first scanner and the 3D data may be first 3D data. The test system may also include a second scanner configured for movement over the sockets. The second scanner may be configured to capture second 3D data representing a structure of at least part of the socket. The control system may be configured to control the picker to place the DUT into the socket based on the first 3D data and the second 3D data. The control system may be configured to control the picker to place the DUT into the socket at a precision measured in single-digit microns ($\mu m$), double-digit microns, or triple-digit microns.

The 3D data may include Cartesian X, Y, and Z coordinates for the DUT being held by the picker prior to placement in the socket. The 3D data may include pitch, yaw, and roll information for the DUT being held by the picker prior to placement in the socket. The first scanner and/or the second scanner may be fixed in place.

An example test system includes a strobe light, test sites that include sockets for testing DUTs, pickers for picking DUTs from the sockets and/or placing the DUTs in the sockets, and a gantry on which the pickers are mounted. The gantry may be configured to move the pickers relative to the sockets to position the pickers for picking the DUTs from the sockets or placing the DUTs into the sockets. A camera may be configured to face towards a DUT held by a picker controlled to place the DUT in a socket at the test site. The camera may be configured to capture an image of the picker holding the DUT prior to placement of the DUT in the socket. A control system may be configured to control operation of the gantry to reduce a speed of the picker as the picker approaches the camera, to control operation of the strobe light and the camera to capture an image of the picker holding the DUT prior to placement of the DUT in the socket, and to use the image to determine a position and an orientation of the DUT relative to the socket. The example test system may include one or more of the following features, either alone or in combination.

Controlling the strobe light and the camera may include causing the strobe light to illuminate at a time that the camera is controlled to capture the image. The speed of the picker may be reduced to, or changed to, a constant speed. The test system may include a single camera to capture an image of each picker holding a DUT. The test system may include multiple cameras, each facing an underside of the DUT. Each of the multiple cameras may be associated with a different test site and may be configured to face towards a DUT held by a picker controlled to place the DUT in a socket. Each camera may be configured to capture an image of the picker holding the DUT prior to placement of the DUT in a socket of the different test site.

An example test system includes test sites that include sockets for testing DUTs, pickers for picking DUTs from the sockets or placing the DUTs in the sockets, and a gantry on which the pickers are mounted. The gantry is configured to move the pickers relative to the test sites to position the pickers for picking the DUTs from the sockets or placing the DUTs into the sockets. A camera is configured for positioning over a socket using servo control to capture an image of the socket or of a device in the socket. A control system is configured to implement the servo control of the camera and to use the image to control placing the DUT into the socket or picking the DUT from the socket. The example test system may include one or more of the following features, either alone or in combination.

The camera may include a 3D camera to capture 3D image data representing at least the socket. The 3D camera may include an imaging device comprised of two or more lenses that enables perception of depth in captured images to produce a 3D image. The 3D camera may include a two-dimensional (2D) camera to capture 2D data of at least the socket and a pointing laser to capture a third dimension of data for at least the socket. The 2D data and the third dimension of the data may be the 3D image data. The 3D data from the camera may be used by the control system, along with 3D data from one or more of the preceding cameras facing an underside of the DUT, to control positioning of the DUT in the socket.

An example test system includes test sites for testing DUTs, where the test sites include a test site configured to hold a DUT for testing. The test system includes a thermal control system to control a temperature of the DUT separately from control over temperatures of other DUTs in other test sites. The thermal control system includes a TEC and a structure that is thermally conductive. The TEC is in thermal communication with the DUT to control the temperature of the DUT by transferring heat between the DUT and the structure. The example test system may include one or more of the following features, either alone or in combination.

The thermal control system may include liquid coolant to flow through the structure to reduce a temperature of the structure. The thermal control system may include one or more conduits to transport the liquid coolant between the structure and a supply of the liquid coolant and one or more valves to control a flow of the liquid coolant through the one or more conduits. The liquid coolant may have a flow to each test site that is independently controllable to reduce a temperature of a DUT in each test site.

The thermal control system may include one or more temperature sensors to detect a temperature of the DUT and a control system to control the thermal control system based on active feedback of the temperature detected at the DUT. The thermal control system may include one or more heaters in thermal contact with the structure, where the one or more heaters are operable to increase a temperature of the structure.

The structure may be or include a plate and the thermal control system may include conduits to transport the liquid coolant between the plate and a supply of the liquid coolant, a valve along a conduit to control a flow of the liquid coolant through the one or more conduits, and the heaters embedded in the plate. The heaters are operable to increase a temperature of the plate.

The thermal control system may include an enclosure to house the DUT. The enclosure may be configured to enable creation of a thermal path that allows thermal conductivity between the TEC and the DUT. The enclosure may physically isolate the DUT from DUTs in other test sites. At least a combination of the liquid coolant and the physical isolation produced by the enclosure may enable the test system to test the DUT independently of, and asynchronously from, testing of other DUTs in others of the test sites. The enclosure may enable indirect contact between the TEC and the DUT.

The thermal control system may include a conduit leading from the enclosure to a vacuum source. A valve along the conduit may be controllable to open to provide vacuum from the vacuum source to the enclosure and may be controllable to close to prevent vacuum from the vacuum source from reaching the enclosure. The thermal control system may include a conduit leading from the enclosure to a purge gas source. A valve along the conduit may be controllable to open to provide a gas purge to the enclosure. The enclosure may be at least partly thermally sealed.

As noted above, the thermal control system may include one or more conduits to transport the liquid coolant between the structure that is thermally conductive and a source of the liquid coolant. The liquid coolant may be above a dew point temperature of an environment in the test system. For example, the liquid coolant may be maintained above a dew point temperature of the sealed enclosure.

The test system may include pickers for picking DUTs from the test sites and for placing the DUTs in the test sites and a gantry on which the pickers are mounted. The gantry may be configured to move the pickers relative to the test sites and to change a pitch of the pickers during movement to match a pitch of the test sites. The test system may include packs holding electronics for testing groups of the test sites. The packs may be movable into and out of the test system (for example, completely out of the test system) during movement of the gantry and the pickers. The test system may include a temperature sensor at the test site to detect a temperature at a socket of the test site; one or more temperature sensors on the gantry to detect a temperature at the gantry; and a control system to change a position of one or more of the pickers based on the temperature at the socket and the temperature at the gantry.

The thermal control systems may include (i) a heater that is controllable to heat the structure and (ii) the liquid coolant to flow through the structure to reduce a temperature of the structure. The test system may include a control system to control the heater to heat the structure during heated testing of the DUT and, following heated testing, to control a flow of the liquid coolant through the structure to cool the structure to a handling temperature. As noted, the liquid coolant being may be above a dew point temperature of an environment in the test system. The control system may control a flow of the liquid coolant through the structure while the TEC conducts heat from the DUT thereby bringing a temperature of the DUT below a predefined temperature for testing. One or more of heaters may be controllable to heat the structure as noted. The control system may be configured to control the one or more heaters to heat the structure at greater than or equal to a predefined rate for testing.

The thermal control system may be configured to control the temperature of the DUT in a range from below 0° Celsius (C) to at least 150° C.

An example method of controlling a temperature of a device under test (DUT) includes changing a temperature of a plate that is thermally conductive by controlling an amount of liquid coolant that flows through the plate, controlling a temperature of the plate by controlling operation of heaters in contact with the plate, and controlling a TEC, where the TEC transfers heat between the plate and the DUT to control the temperature of the DUT. The method may include one or more of the following features, either alone or in combination.

Controlling the amount of liquid coolant that flows through the plate may include preventing liquid coolant from flowing through the plate. Controlling operation of the heaters may include turning the heaters on to increase a temperature of the plate. The TEC may control the temperature of the DUT by transferring heat from the plate to the DUT. The operation of the heaters may be controlled to heat the DUT at a rate that is greater than or equal to a predefined rate.

Controlling the amount of liquid coolant that flows through the plate may include allowing liquid coolant to flow through the plate. Controlling operation of the heaters may include turning the heaters off to reduce or to prevent heating of the plate. The TEC may control the temperature of the DUT by transferring heat from the DUT to the plate. In an example, the liquid coolant is not below a dew point of an environment in a test system which the method is performed. The TEC may transfer an amount of heat from the DUT to the plate to cause the DUT to be below a predefined temperature during testing. The DUT may be in an enclosure that is thermally insulated from, and hermetically sealed from, other enclosures containing other DUTs. The method may include controlling a dew point temperature in a micro-environment within the enclosure and controlling a temperature of the plate so that the temperature of the plate remains above the dew point temperature in the micro-environment. The temperature of the plate and the dew point temperature may change over a range; however, over the entirety of the range, the temperature of the plate remains above the dew point temperature.

The heaters may be controlled to heat the structure to implement heated testing on the DUT. Following heated testing, the heaters may be turned-off and the liquid coolant may be controlled to flow through the structure to cool the structure down to a handling temperature.

Any two or more of the features described in this specification, including in this summary section, can be combined to form implementations not specifically described herein.

The systems, techniques, and processes described herein, or portions thereof, can be implemented as and/or controlled by a computer program product that includes instructions that are stored on one or more non-transitory machine-readable storage media, and that are executable on one or more processing devices to control (e.g., coordinate) the operations described herein. The systems, techniques, and processes described herein, or portions thereof, can be implemented as an apparatus, method, or electronic system that can include one or more processing devices and memory to store executable instructions to implement various operations. The systems, techniques, processes, and/or components described herein may be configured, for example, through design, construction, arrangement, placement, programming, operation, activation, deactivation, and/or control.

The details of one or more implementations are set forth in the accompanying drawings and the description below. Other features, objects, and advantages will be apparent from the description and drawings, and from the claims.

DESCRIPTION OF THE DRAWINGS

FIGS. 53 to 57 are cut-away side views showing a sequence of operations performed by the actuator to place and hold a lid on a test socket.

Like reference numerals in different figures indicate like elements.

DETAILED DESCRIPTION

Figure 1:
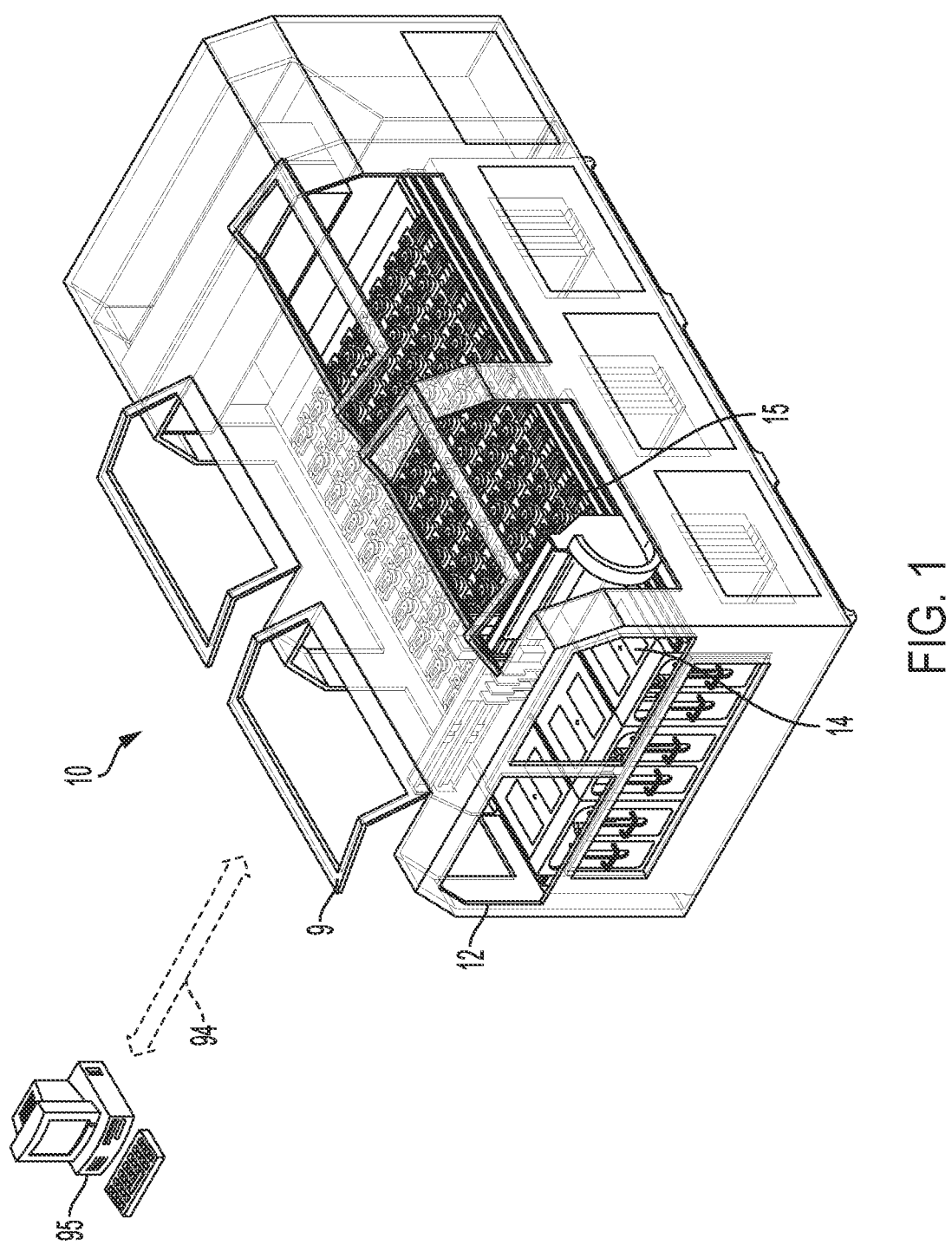
FIG. 1 is a perspective view of an example test system.

Described herein are example implementations of a test system and components thereof. In some implementations, the test system is constrained in size, without sacrificing speed or throughput. However, the example test system described herein is not limited to any particular size, testing speed, or throughput. In some implementations, the test system is an SLT system; however, the components and features described herein may be implemented in any appropriate testing context. As noted, SLT involves testing an entire device, rather than individual components of the device. If the device passes a battery of system-level tests, it is assumed that the individual components of the device are operating properly. An overview of an example test system is provided followed by more in-depth descriptions of the various components of the test system introduced in the overview.

The example test system includes multiple subsystems. In this regard, the test system includes a frame that holds an automated gantry and primary pick-and-place automation. A tray feeder contains automation to move trays that hold devices to be tested and/or devices that have been tested into and out of the system. Packs that are movable into and out of the frame contain test electronics for testing devices held in test sockets. The packs may be movable into and out of the system during device testing. An example pack includes electrical test support infrastructure and at least one liquid-to-air heat exchanger. In some implementations, the liquid-to-air heat exchanger may be omitted from, or external to, the pack. An example pack contains one or more rows of test sockets, which are part of test sites in the test system and which hold devices under test (DUT). The test sites may each contain an end-user's test site board. The end-user's test site board contains the test socket that holds the DUT in some implementations. Each row in a pack can contain N customer test sites, where N is an integer between one and however many sites can fit in a row based on system size. Each test site may include an actuator to hold the DUT in the test socket. The actuator can be replaced as needed and to accommodate a device's force requirements.

The example test system also includes a service module that houses system infrastructure and electronics used for liquid cooling, power, and test computations and other processing. A housing, also referred to as a "skin" or "outer shell", encloses at least part of the system and holds cool air generated by the system and circulated down across the test sites and test electronics boards. Additionally, ionized air may be circulated over the test sites before, during, and/or after testing to mitigate electrostatic charge buildup and to reduce or to prevent electrostatic discharge (ESD) events.

The layout of the example test system may be considered advantageous. For example, the test electronics, customer site electronics, and device automation can be configured in a stack. As a result, the test system can be extended to whatever length is required for a testing application, which may enable an efficient usage of the automation. Furthermore, the test system may include a single layer of pick-and-place automation to place DUTs in test sockets and to remove the DUTs from the test sockets. This single layer of pick-and-place automation may reduce the need for multiple automation exchanges found in other test systems, which may improve the test system's reliability. The site-row-pack model also may enhance system configurability and modularity and may reduce the cost of test and serviceability.

Figure 2:
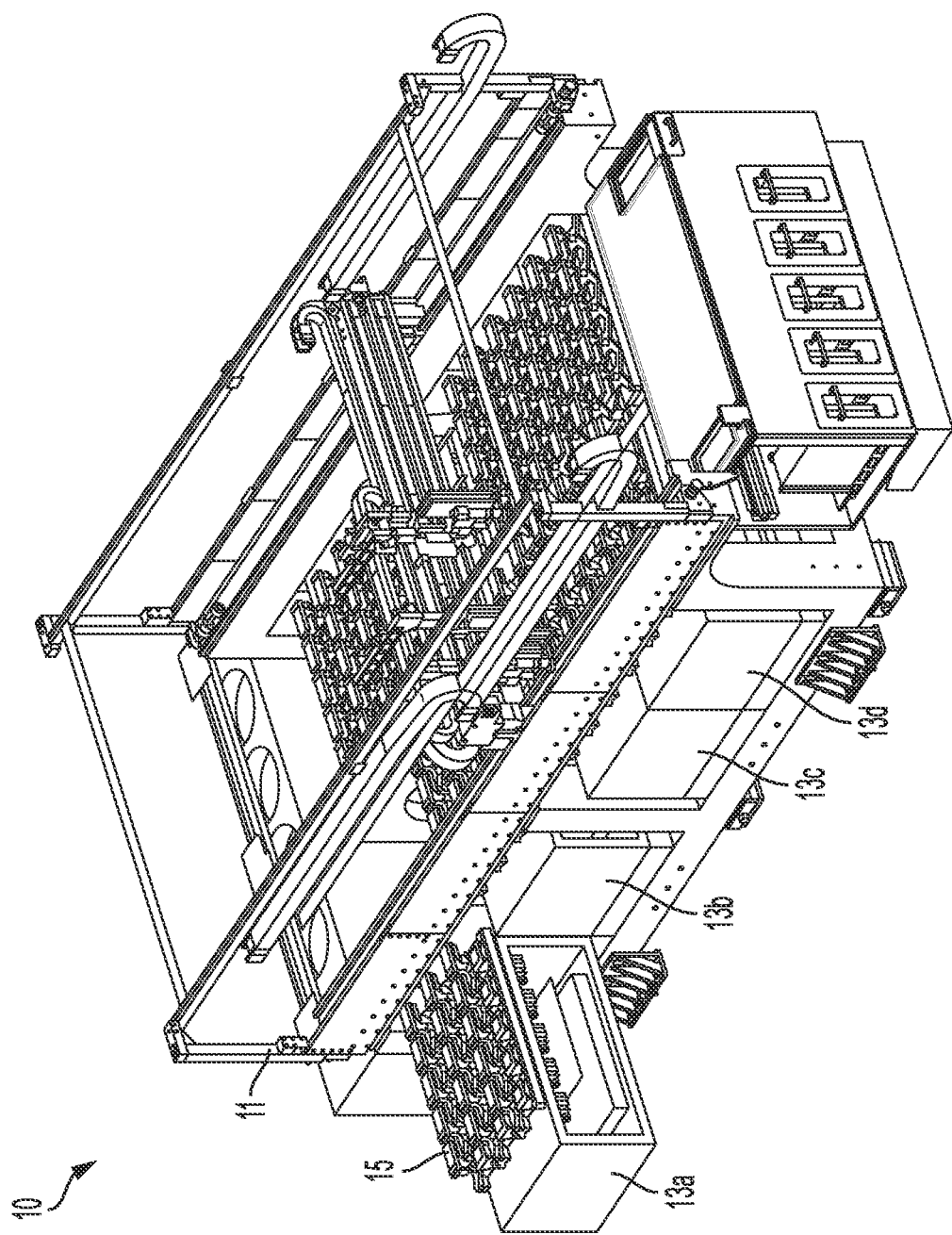
FIG. 2 is a perspective view of the example test system absent its housing to show internal components of the test system.

FIG. 1 shows an example implementation of a test system 10 of the type described in the preceding paragraphs. In FIG. 1, four doors including door 9 are opened to expose the array of test sites in the test system. FIG. 2 shows parts of test system 10 absent its housing or "skin". As noted, example test system 10 is modular, which may enable the test system to accommodate various testing applications. As shown in FIGS. 1 and 2, test system 10 includes a frame 11 and housing 12 that, in this example, hold eight packs, including packs 13*a*, 13*b*, 13*c*, and 13*d*. As described in more detail below, each pack may be customized for testing a different type of DUT. The packs may each include multiple test sites for testing DUTs. Each test site may include a test socket for holding a DUT, an actuator and lid assembly, and one or more sensors. Example implementations of these features are described below.

Different packs may include test sockets that are sized to hold DUTs having different characteristics, such as different sizes, interfaces, or form factors. For example, the test sockets in one pack 13*a* may be configured to hold DUTs that have a 10 millimeter (mm) dimension (for example, length, width, or diagonal) and test sockets in another pack 13*b* may be configured to hold DUTs having a 6 mm dimension. The test sockets may be organized in one or more rows, each containing one or more test sockets. In rows that contain more than one test socket, the test sockets may be arranged at different pitches. A pitch may include the distance between the centers of two adjacent test sockets. For example, the pitch may be the distance between the centers of two adjacent test sockets. The packs may also include test electronics configured to test DUTs held in the test sockets. The test electronics may be customized to test features that are unique to a DUT. The test electronics may include, but are not limited to, pin electronics, parametric measurement units, programmable logic, and/or a microcontroller or other processing device(s). The test electronics may execute, or be used to implement, one or more test routines on each DUT in a test socket.

Test system 10 includes trays 14. In some implementations, each tray includes cells for holding devices to be tested or cells for holding devices that have been tested. The cells may be sized and shaped to hold devices having different sizes, shapes, or form factors. For example, one tray may be configured to hold devices that have a 10 mm dimension and another tray may be configured to hold devices having a 6 mm dimension. In some implementations, there may be two or more trays for each different type of device being tested—for example, one tray containing devices to be tested and one tray containing devices that have been tested, or one tray containing devices to be tested, one tray containing devices that have passed testing, and one tray containing devices that have failed testing. In the example of FIG. 1, there are six trays; however, any appropriate number of trays may be included in the test system. As shown in the figure, the trays may be arranged in a plane that is parallel to, or a co-planar with, a plane in which at some or all of the test sockets 15 are arranged.

Figure 3:
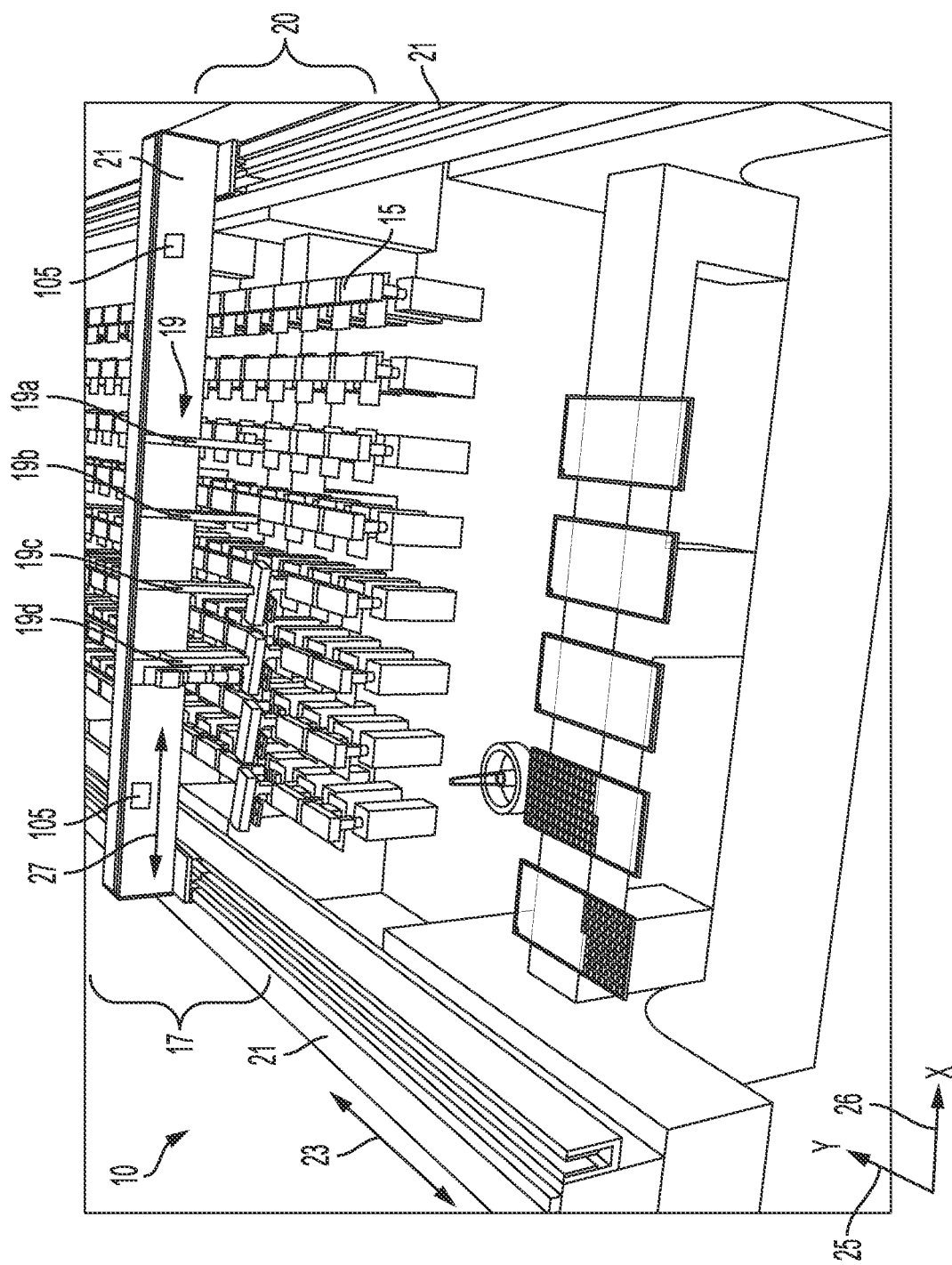
FIG. 3 is a perspective view of parts of pick-and-place automation that may be part of an example test system like that of FIG. 1.

Test system 10 includes pick-and-place automation, which is also referred to as "pick-and-place robotics". As shown in FIG. 3, pick-and-place robotics 17 may include linear actuators 19, also called "actuators" or "pickers". Multiple pickers may be configured to service multiple test sockets independently and/or simultaneously or contemporaneously, where servicing includes at least one of placing DUTs into the multiple test sockets or picking DUTs from the multiple test sockets. Servicing may also include simultaneously picking or placing DUTs into one or more of the trays, as described in more detail below. In the example of FIG. 3, there are four pickers; however, any appropriate number of pickers may be used. That number may be configurable; for example, one or more pickers may be added to or removed from test 10 system to accommodate different testing application requirements. In this example, a picker 19a includes an arm that extends and retracts relative to the test slots. The arm includes a head or nozzle that holds a DUT during movement between cells in the trays and test sockets in the packs. In some examples, a device is picked-up and held on the nozzle during movement using pneumatics, for example a vacuum pressure. In some examples, the device is released by releasing the vacuum pressure and/or by mechanical mechanisms, as described herein.

Pickers are mounted on a robotic gantry ("gantry") 20 that includes a movable gantry beam 21 that spans across an array of test sockets 15, rails 21 over which the gantry beam moves, and one or more motors (not shown) to control such movement. Gantry beam 21 is configured to move over the test sockets in the directions of arrow 23 (the Y-dimension 25), which are arranged in rows that are perpendicular to the gantry beam. Pickers 19a to 19d are arranged linearly along gantry beam 21 so that the test sockets are accessible to the pickers during system operation. The pickers are also configured to move linearly along the gantry beam to move to different locations and to change a pitch of the pickers along the gantry beam to service different types of DUTs. Accordingly, in this example, pickers 19a to 19d are configured to move in the Cartesian X dimension 26 (arrow 27) and gantry beam 21 is configured to move in the Cartesian Y dimension 25 (arrow 23). Pickers 19a to 19d thus move in a single plane that is substantially parallel to a plane or planes containing test sites 15. Pickers 19a to 19d mounted to gantry beam 21 move along with the gantry beam and are sized and operated so that, with their arms extended or retracted, the pickers clear—that is, do not touch—test sockets that are empty or full. In other words, automation 17 is configured to move anywhere within a defined work area and to pass over all sockets, regardless of the state of the socket (open or closed). This includes clearance for the pickers when they are fully retracted. Linear magnetic motors ("linear motors"), which are not shown in FIG. 3, may control movement of both the gantry beam and the pickers.

In some implementations, the pickers perform picking or placing into different packs. For example, two packs on opposite sides of the system, such as packs 81b and 81d of FIG. 31, can have their rows of test sockets aligned in such a way that the pickers can pick and place some DUTs in one pack and others in the other pack simultaneously. Given the two packs facing each other on opposite sides' scenario, the "row" accessible by the pick-and-place robotics becomes the sum of the two rows from these two packs. In an example of six sites per row in one pack, the system-level row has 12 sites. The "Y-axis jog" capability described below may be particularly useful partly because the rows on two opposing packs facing each other may not be perfectly aligned due to various tolerances. The Y-axis job capability—which allows for independent Y-axis movement of the pickers relative to the gantry beam—allows the test system to accommodate for a misalignment of the rows, thereby enabling the system to continue to perform simultaneous pick and place operations.

FIGS. 4 to 28 show a sequence of operations performed by an example test system 30 of the type described with respect to FIGS. 1 to 3 in the preceding paragraphs. The operational positions depicted are random but sequential and are intended to illustrate test system operation. The particular operations depicted are not intended to imply any required operations or sequence of operations.

Figure 4:
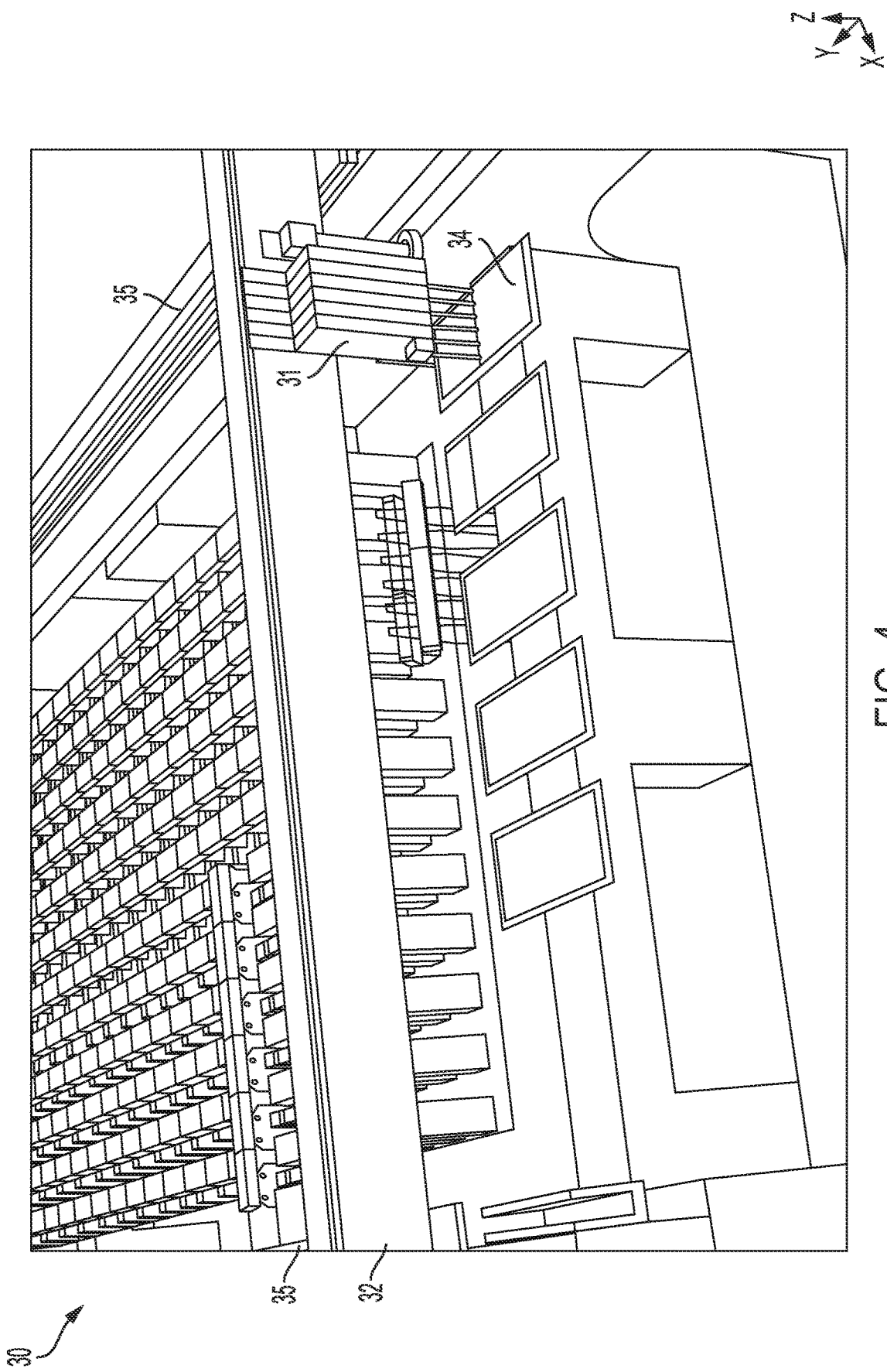
FIGS. 4 through 28 are perspective views of parts of pick-and-place automation that may be part of an example test system like that of FIG. 1, which are shown at various points in time during an operational sequence.

In FIG. 4, pickers 31 are moved by gantry beam 32 into position over tray 34 containing devices to be tested ("DUTs"). More specifically, in this example, pickers 31 are controlled to move linearly along gantry beam 32 and the gantry beam is controlled to move linearly along tracks 35 to position pickers 31 at tray 24. One or more linear motors (not shown), which are controlled by a control system described below, may be operated to position the gantry beam and the pickers.

Figure 5:
Figure 6:
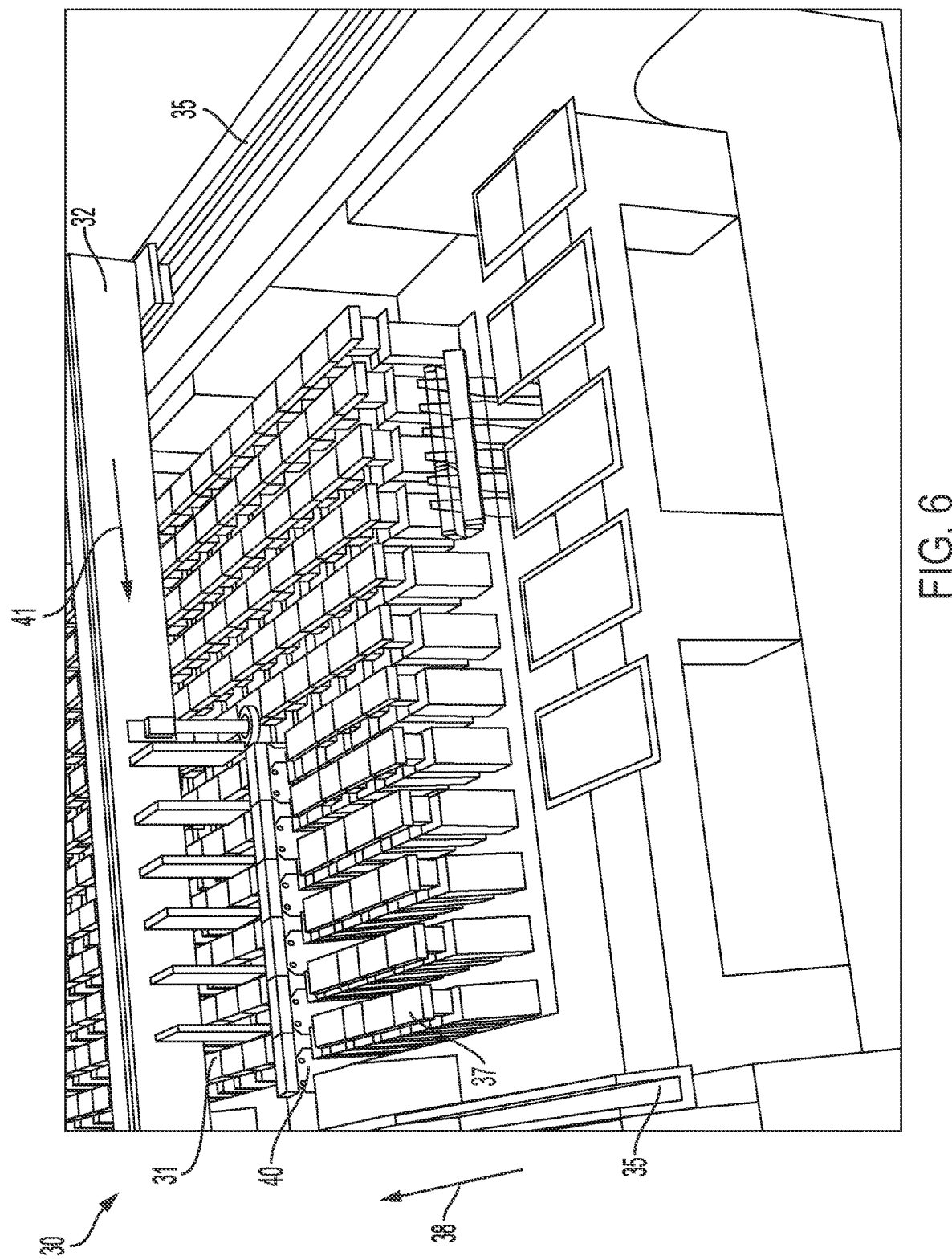

In this example, there are six pickers 31. The six pickers 31 may pick-up or remove six devices or fewer than six devices from tray 34 concurrently or in parallel. In some examples, each picker picks-up a single device; however, not every picker need pick-up a device. As shown in FIGS. 5 and 6, six picked-up devices are transported across one or more arrays of test sockets 37 in the direction of arrow 38 to target test sockets 40 in which the device are to be placed. As shown in FIGS. 5 to 6, the pitch of the pickers 31 along gantry beam 32 is controlled to change to match the pitch of the target test sockets 40. This change may be fluid in that pickers 32 may be controlled to move linearly along gantry beam 32 in the directions of arrow 41 while—for example, at the same time as—gantry beam 38 is controlled to move along tracks 35.

As described in more detail below, each test socket includes a lid configured—for example, constructed, controlled and/or arranged—to fit over the test socket when a device (a DUT) is placed in the test socket. In example implementations, the lid rotates away from a test socket to expose the test socket and/or a device in the test socket and thereby allow a picker to place a device into the test socket or to remove a device from the test socket. After a device has been placed in the test socket, the lid is controlled to move over the test socket and to apply a force to the device in the test socket that creates, maintains, or both creates and maintains electrical and mechanical connection between the device and the test socket. For example, in FIG. 6 the lids of test socket 40 are open—for example, rotated and/or moved to expose each test socket—to allow pickers 31 to place the devices they are holding into respective test sockets 40. In some implementations, lids of the test sockets may be controlled to open during gantry movement towards the test sockets and may be controlled to close during gantry movement away from the test sockets. In some implementations, lids of the test sockets may be controlled to open independently of—for example, not during—gantry movement towards the test sockets and may be controlled to close independently of—for example, not during—during gantry movement away from the test sockets.

Figure 7:
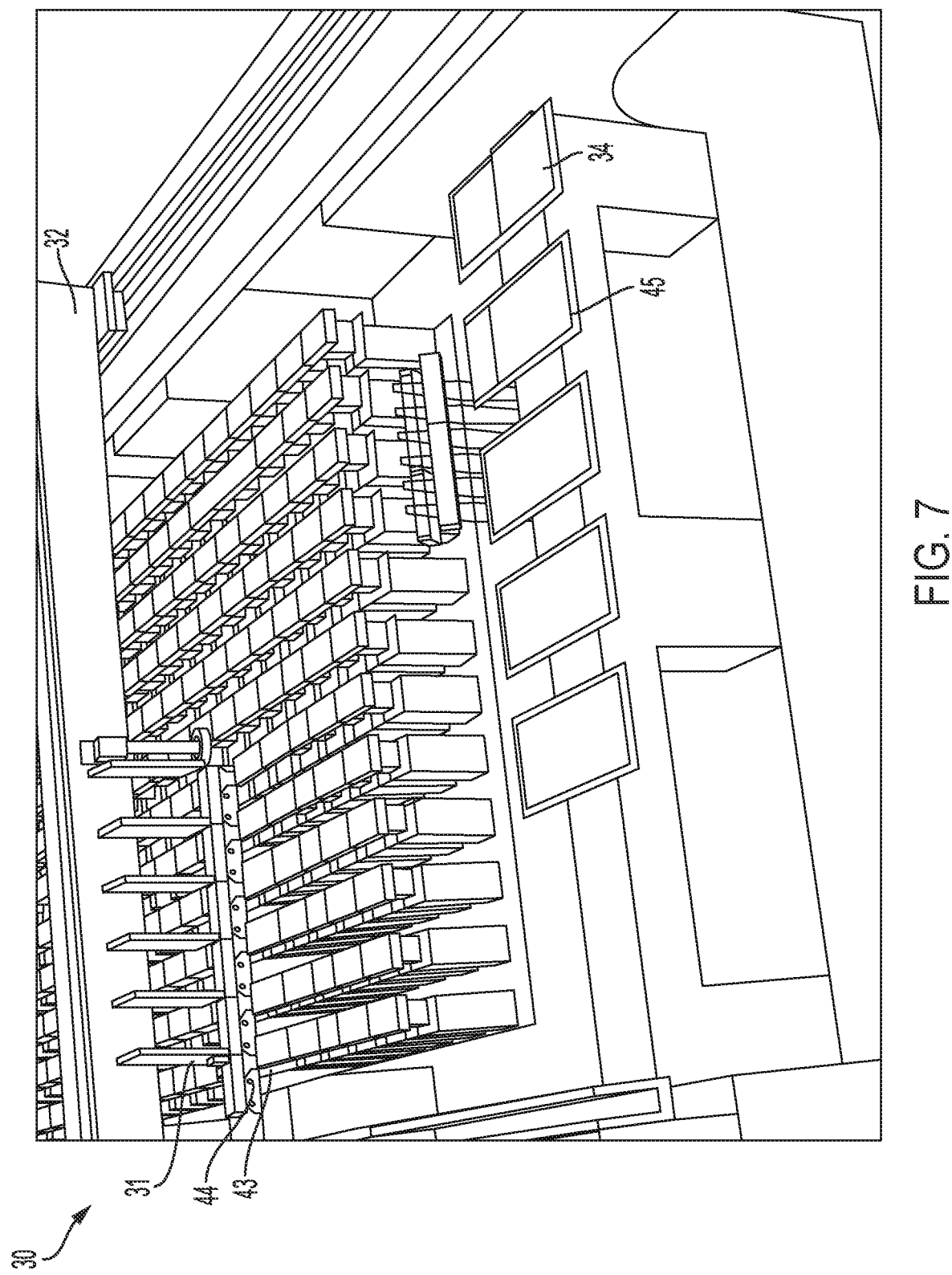
Figure 8:
Figure 9:
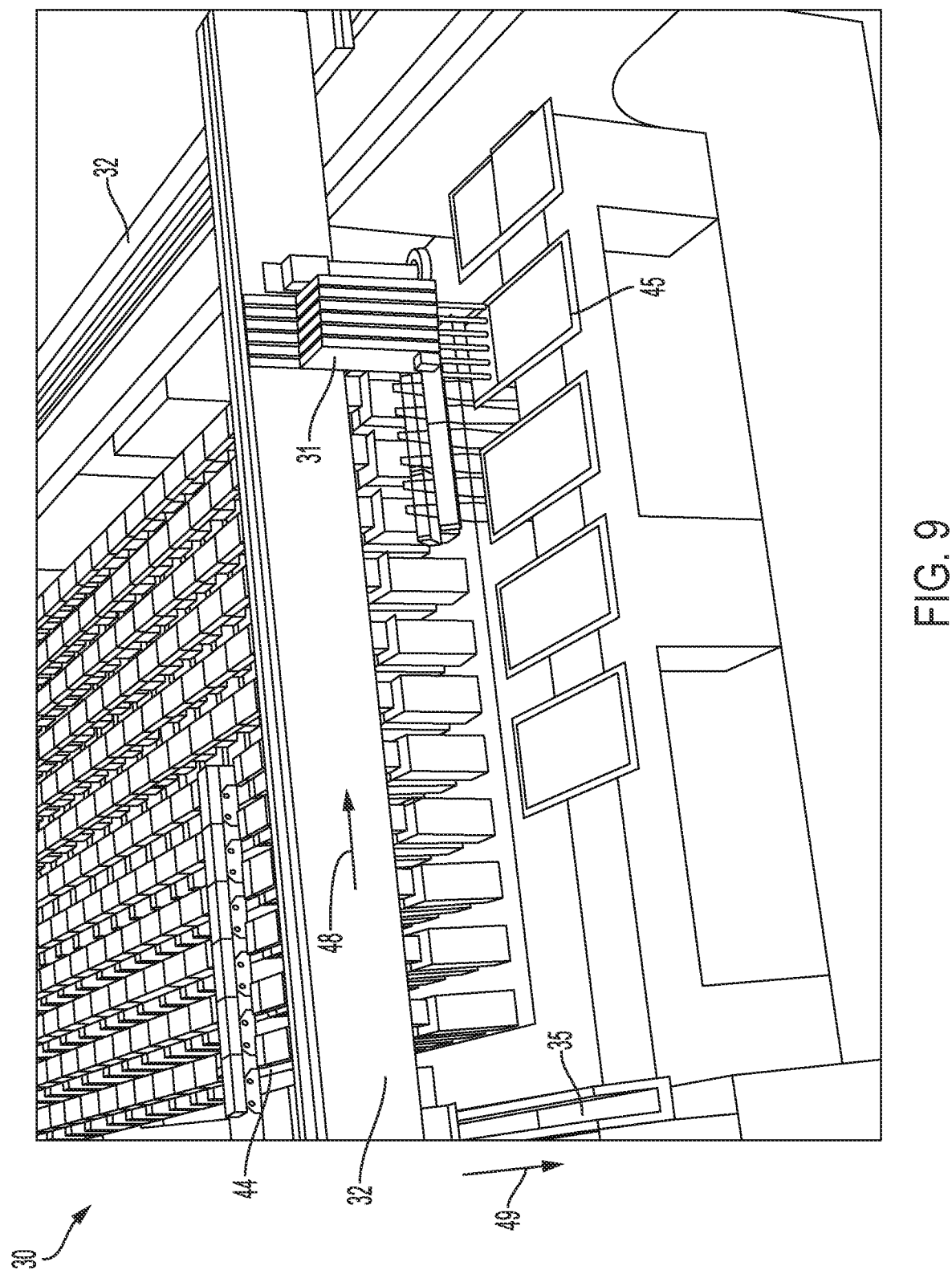

In FIG. 7, after the pickers place the devices into test sockets 40, the lids of those test sockets close over the test sockets. This movement is represented in FIG. 7 by the slightly angled lids 43 moving into place over test sockets 40. Meanwhile, pickers 31 and gantry beam 32 are controlled to move to a row of test sockets 44 to pick-up (that is, to remove) devices that have been tested from those test sockets and then to transfer those devices that have been tested to tray 45. This transport is shown in FIGS. 8 and 9. As shown, the pitch of pickers 31 is controlled to change from a pitch that is the same as, or approximate to, a pitch of test sockets 44 to a pitch that is the same as or approximate to a pitch of cells in tray 45. As explained above, this change may be fluid in that pickers 31 may be controlled to move linearly along gantry beam 32 in the direction of arrow 48 during movement of gantry beam 32 along tracks 35 in the direction of arrow 49. Pickers 31 may place or deposit the devices that have been tested into respective cells in tray 45 by releasing vacuum pressure, using the mechanical mechanisms described herein, or a combination of the two.

Figure 10:
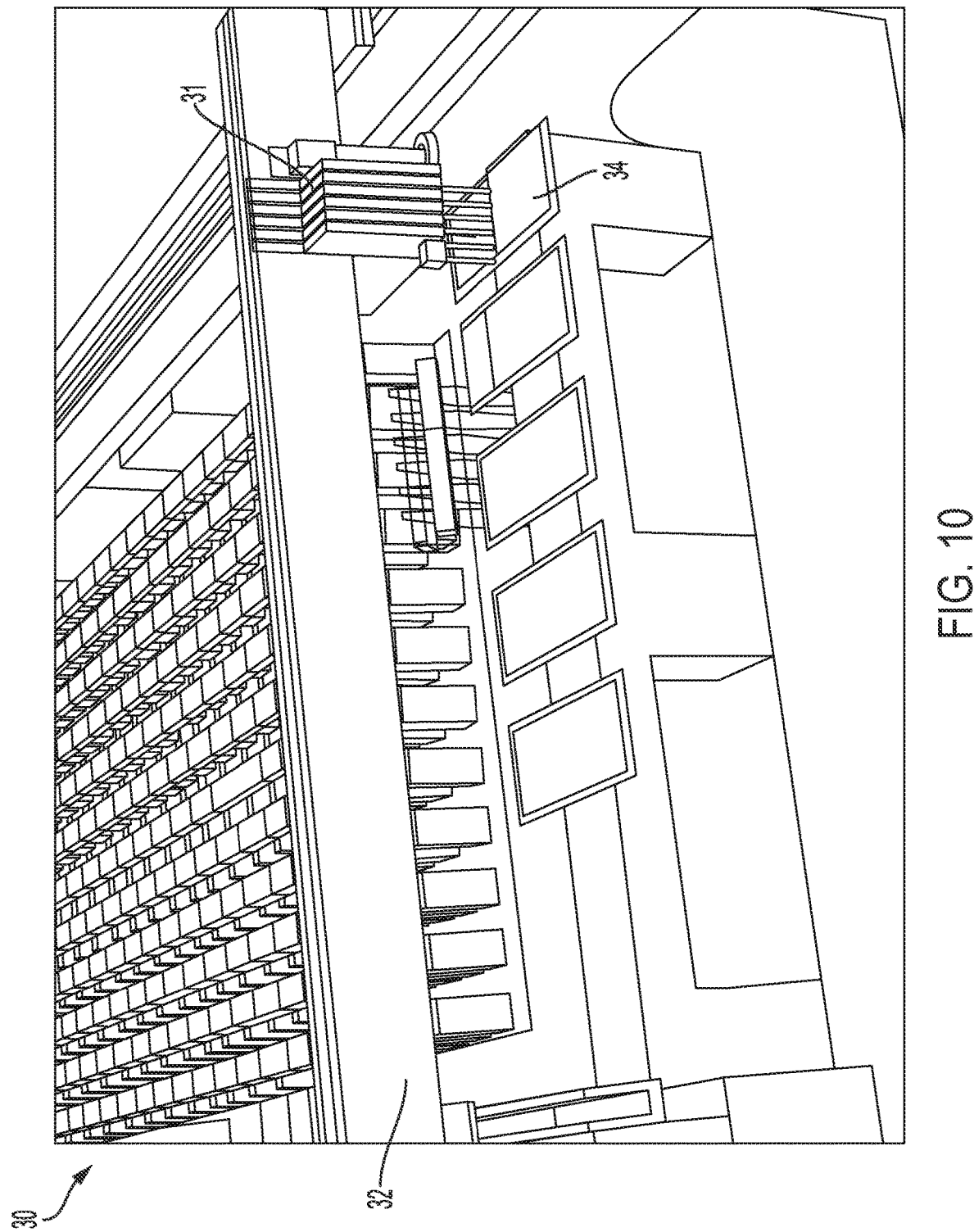
Figure 11:
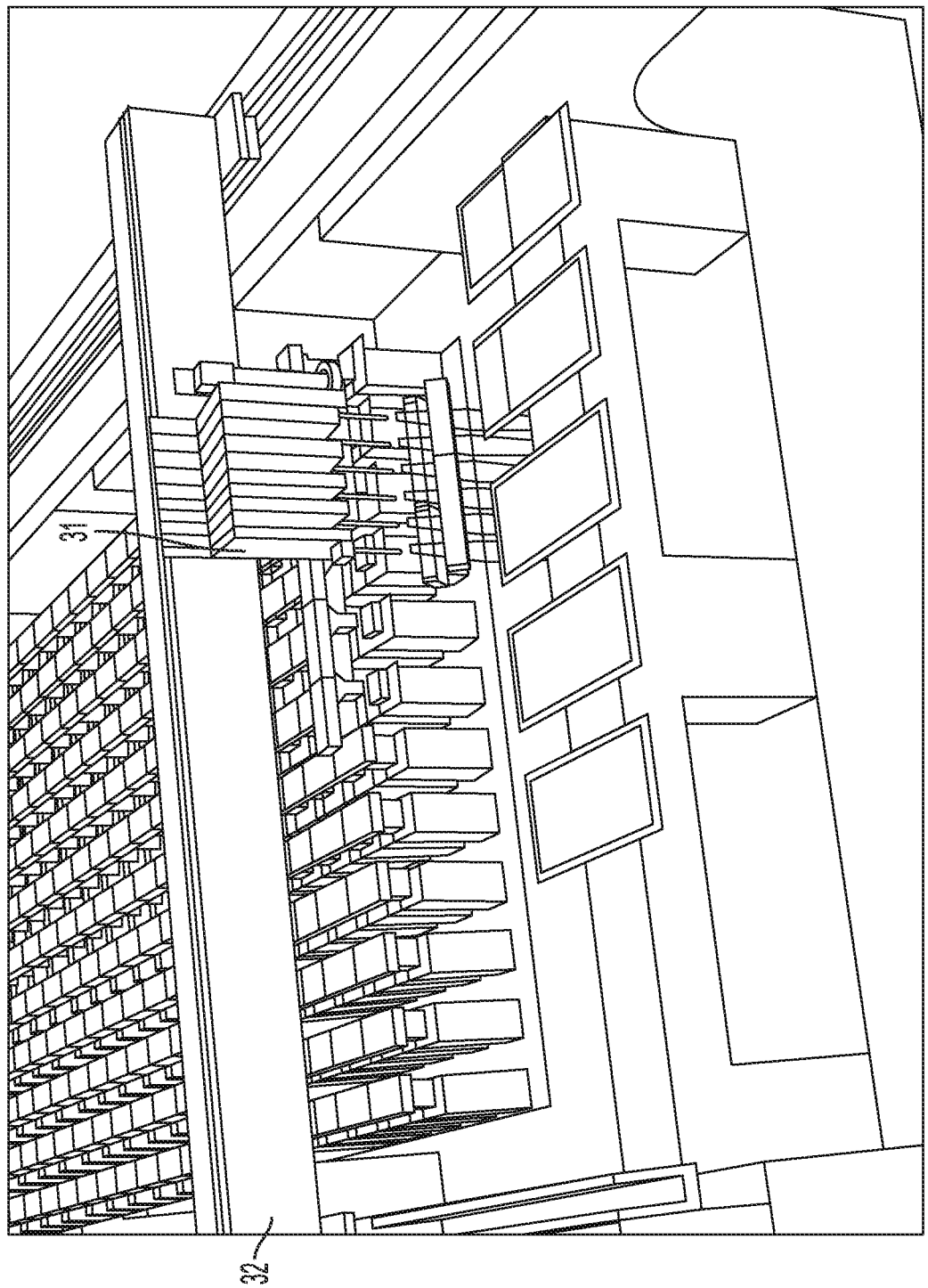
Figure 12:
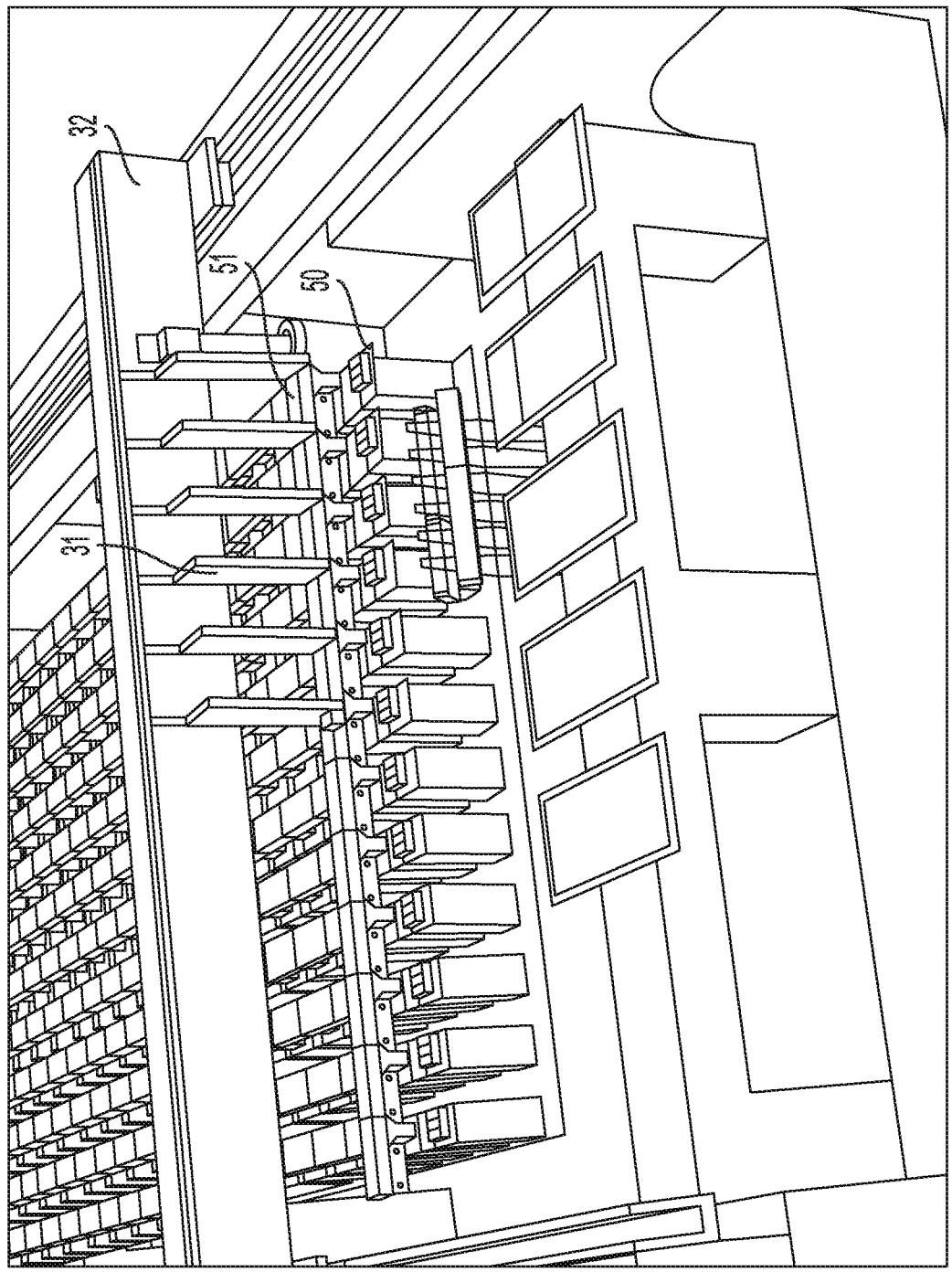
Figure 13:
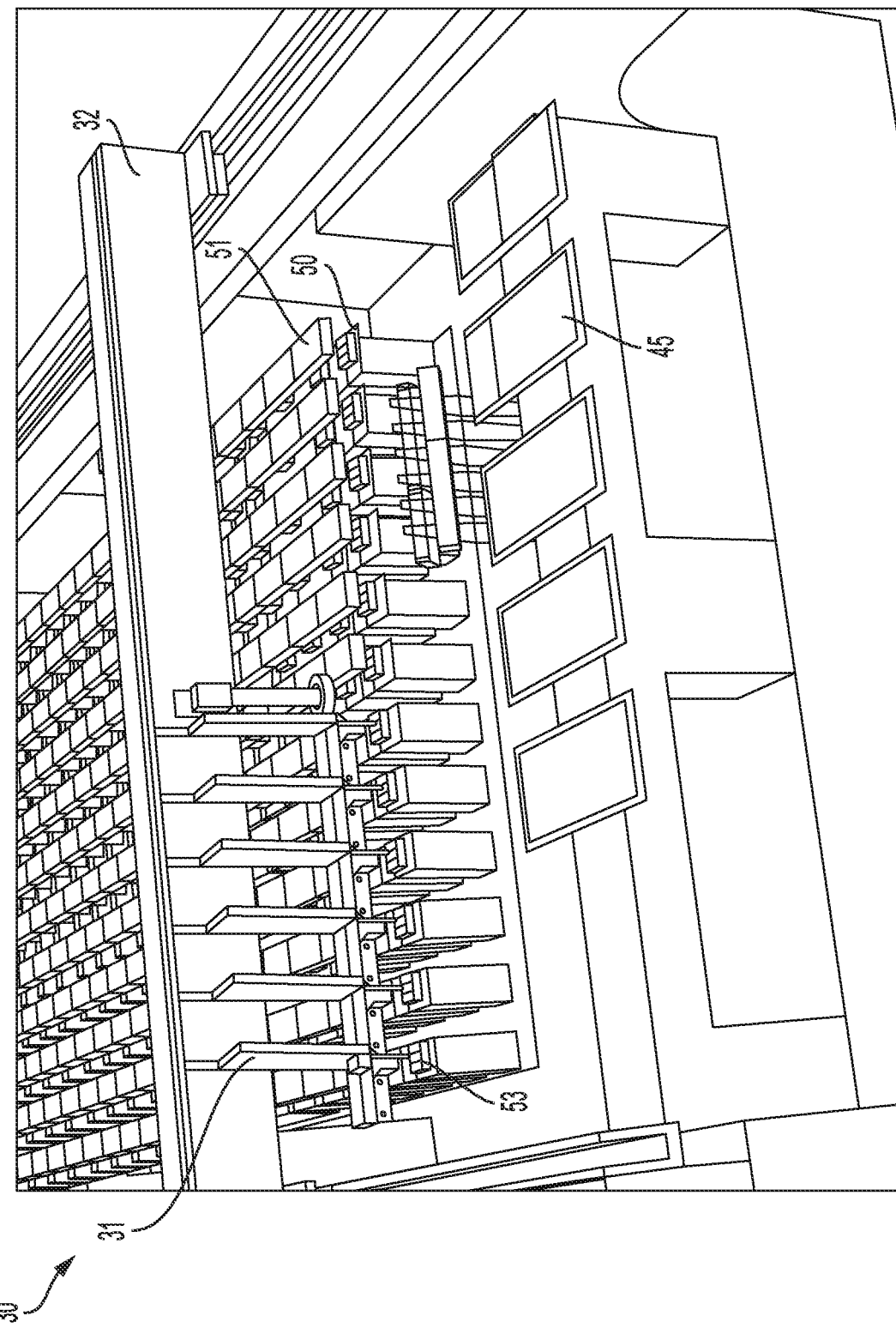

As shown in FIG. 10, pickers 31 and gantry beam 32 are next controlled to move so that the pickers align to a new row of cells in tray 34 containing devices to be tested. Pickers 31 pick-up the devices in that row as described herein and, with gantry beam 32, transport those devices to test sockets 50, as shown in FIGS. 11 and 12. In FIG. 12, lids 51 of test sockets 50 are opened to allow the pickers to place the devices to be tested into the test sockets. As shown in FIG. 13, after or while pickers 31 and/or gantry beam 32 are controlled to move away from test sockets 50 to next destination test sockets, lids 51 are controlled to close to cover devices in test sockets 30.

In FIG. 13, pickers 31 are controlled to pick-up devices that have been tested from test sockets 53. Those devices that have tested are moved to, and placed into, cells on tray 45. As described above, the pitch of pickers 31 is controlled to change—in this example, to narrow—from a pitch equal to or approximate to a pitch of test sockets 53 to a pitch that is equal or approximate to a pitch of the cells of tray 45 in order to place the devices that have been tested into the cells.

Figure 14:
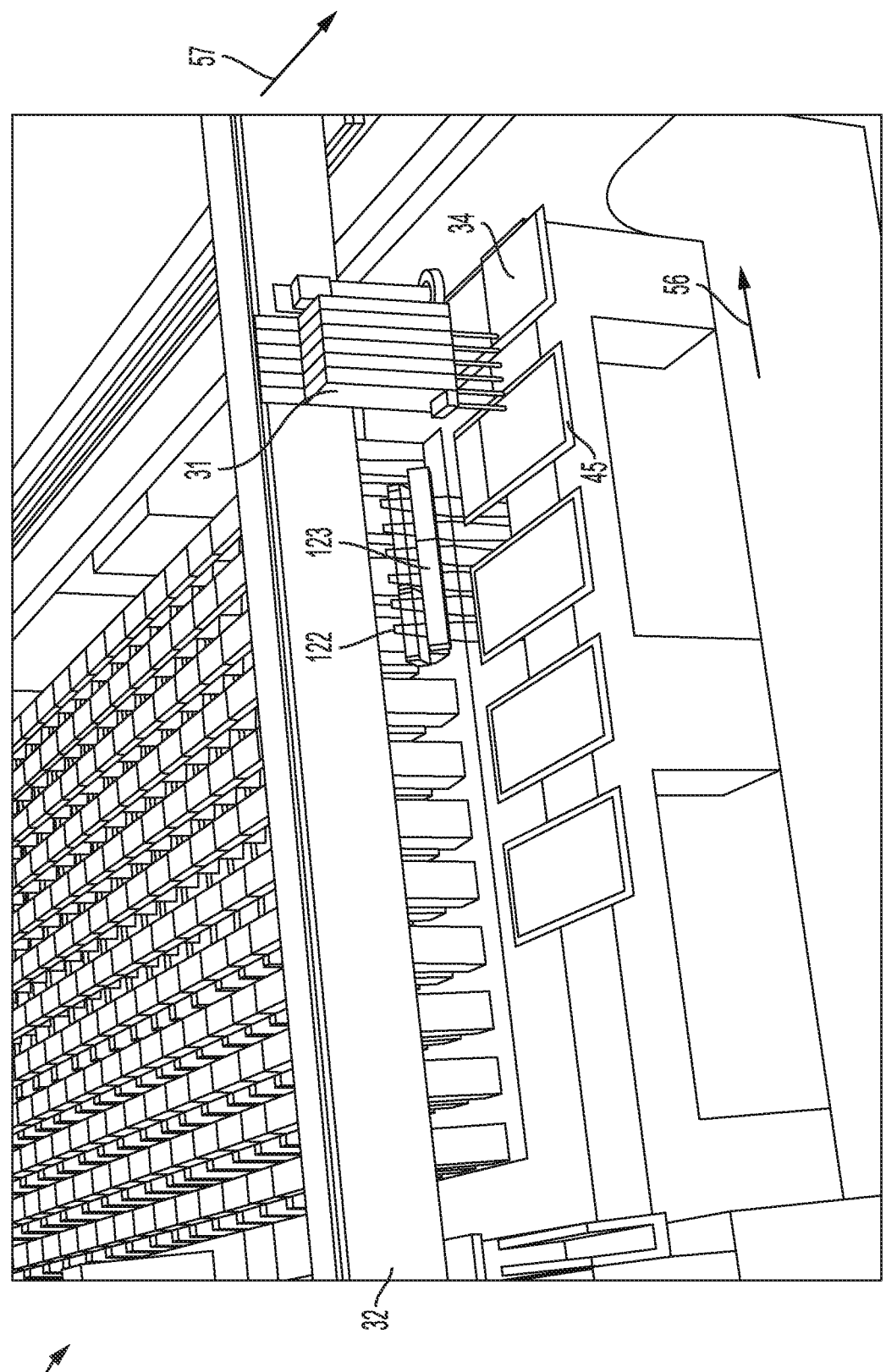
Figure 15:
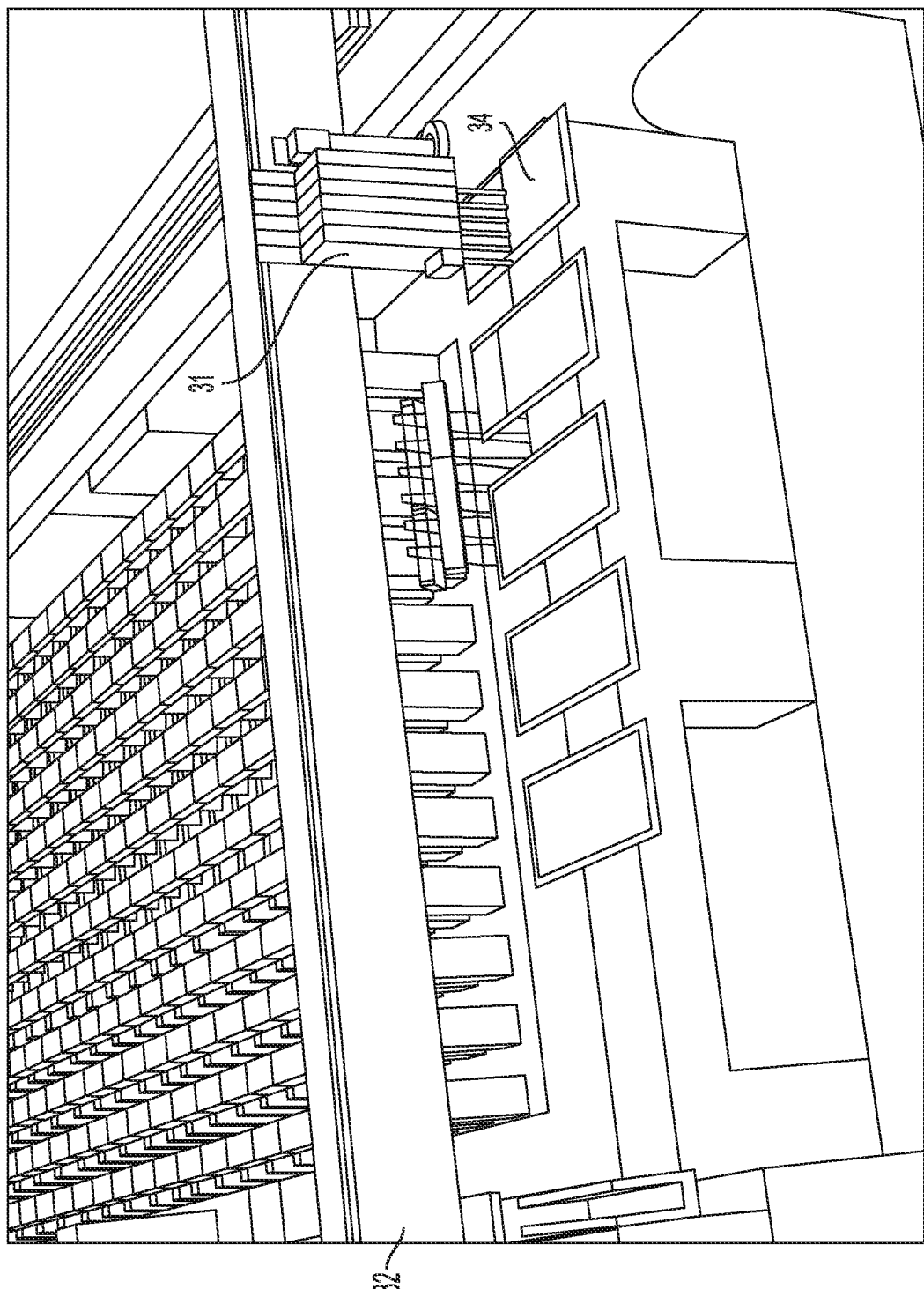
Figure 16:
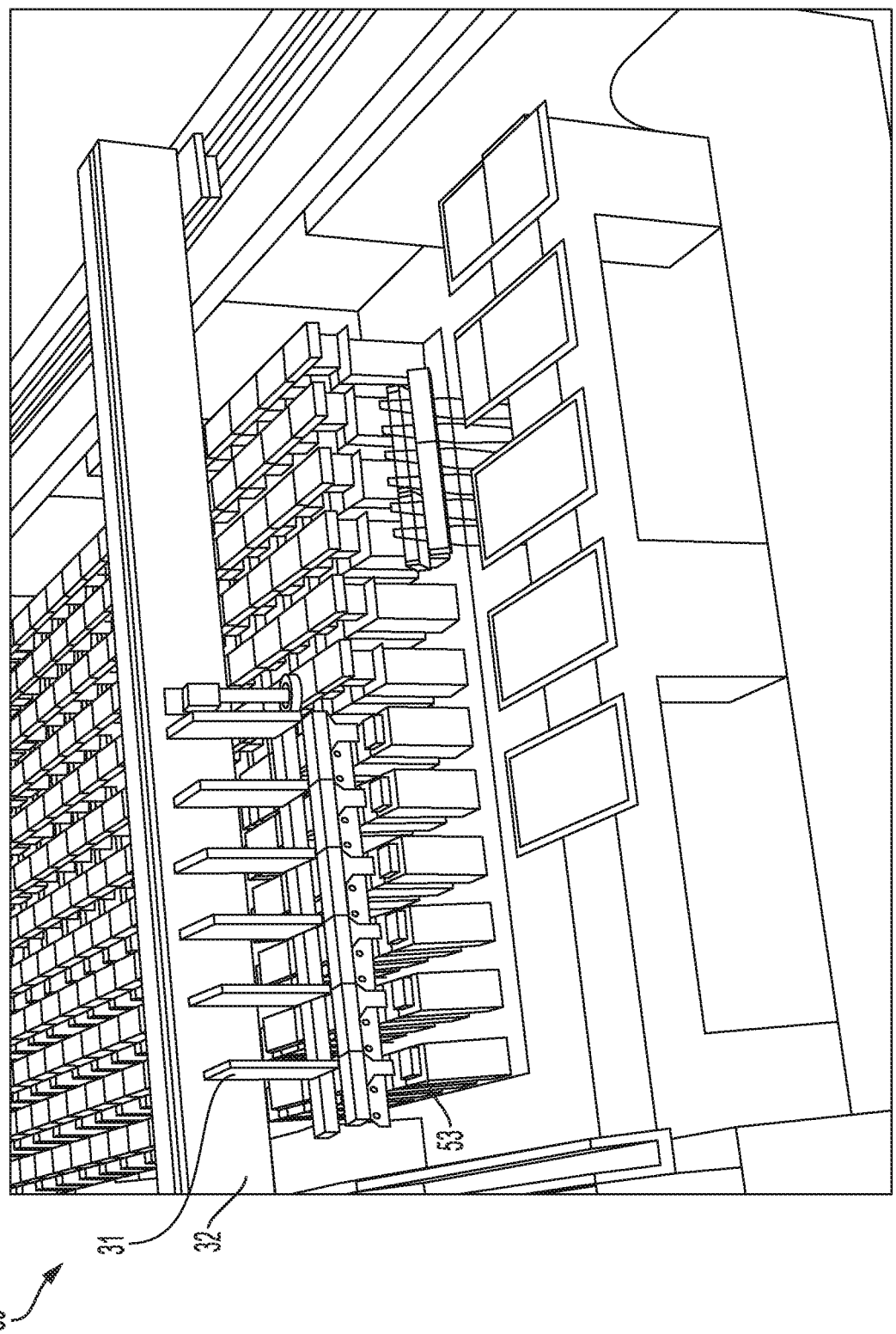
Figure 17:
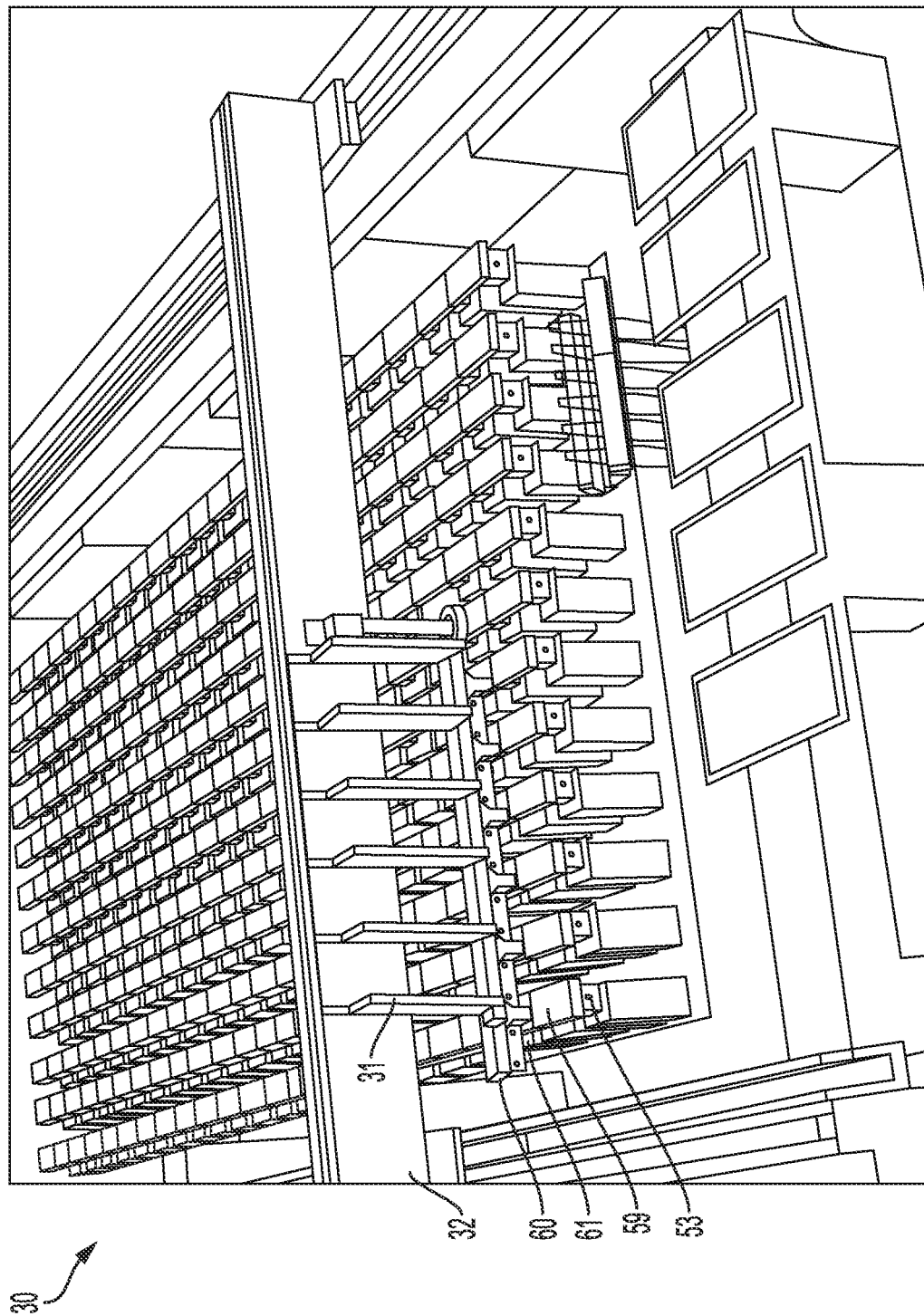

As shown in FIG. 14, pickers 31 are then controlled move from tray 45 to tray 34 in order to pick-up devices to be tested from tray 34 and to transport those devices to test sockets for testing. Specifically, pickers 31 are controlled to move linearly in the direction of arrow 56 and gantry beam 32 is controlled to move linearly in the direction of arrow 57 to pick up devices to be tested from tray 34. Pickers 31 are positioned as shown in FIG. 15 to pick up devices to be tested from tray 34. Then, both pickers 31 and gantry beam 32 are controlled to move to the position shown in FIG. 16 to place those devices from tray 34 into empty test sockets 53 (which were evacuated in the operations described with respect to FIG. 13). As shown, the lids of those empty test sockets are moved—for example, rotated—out of the way of pickers 31 to expose test socket 53 and thereby allow pickers 31 to place the devices into the test sockets for testing. Next, in FIG. 17, lids 59 close over devices in test sockets 53, while lids 60 over test sockets 61 are controlled to open to allow pickers 31 to access, and to pick-up, devices that have been tested from those test sockets 61.

Figure 18:
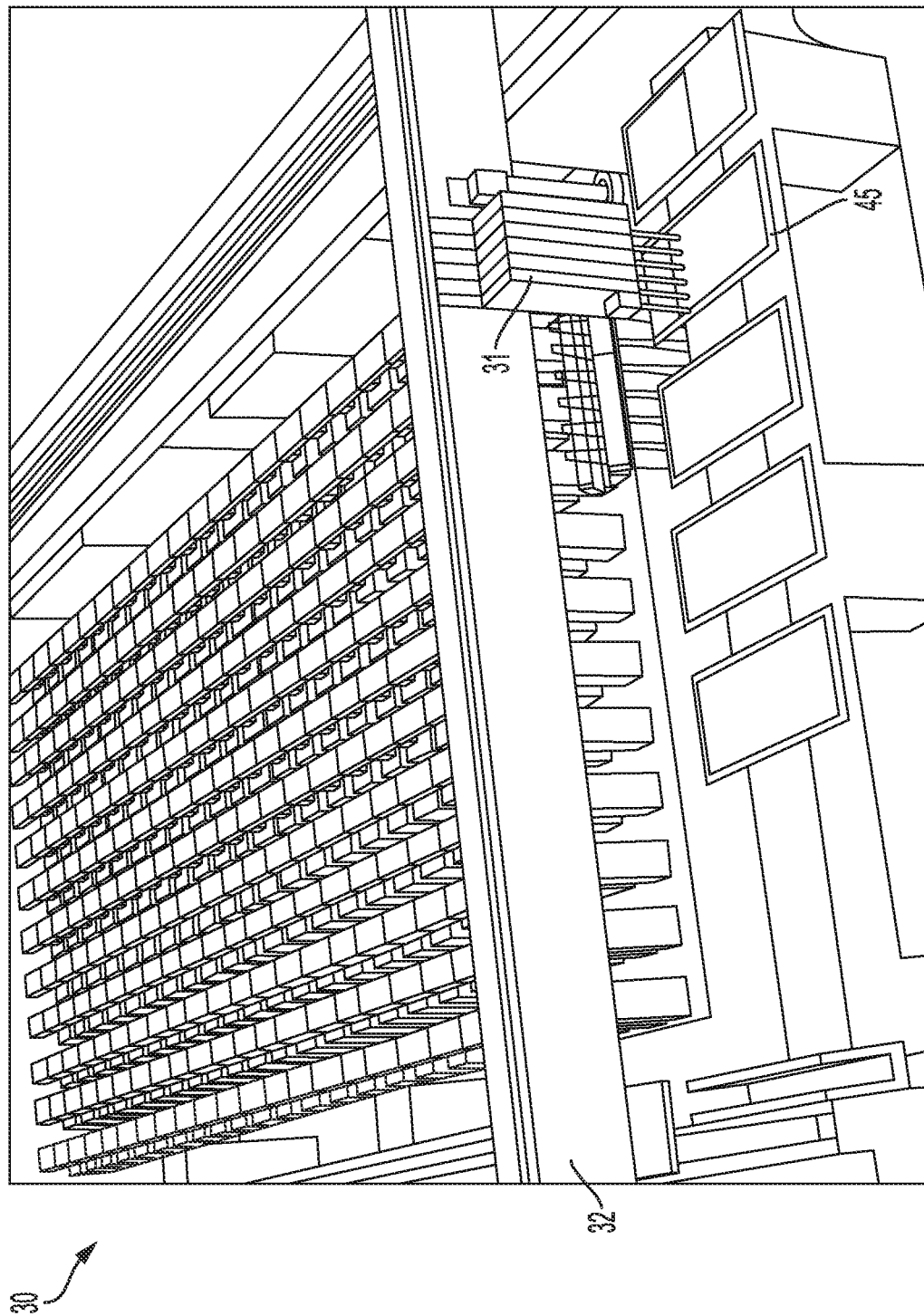
Figure 19:
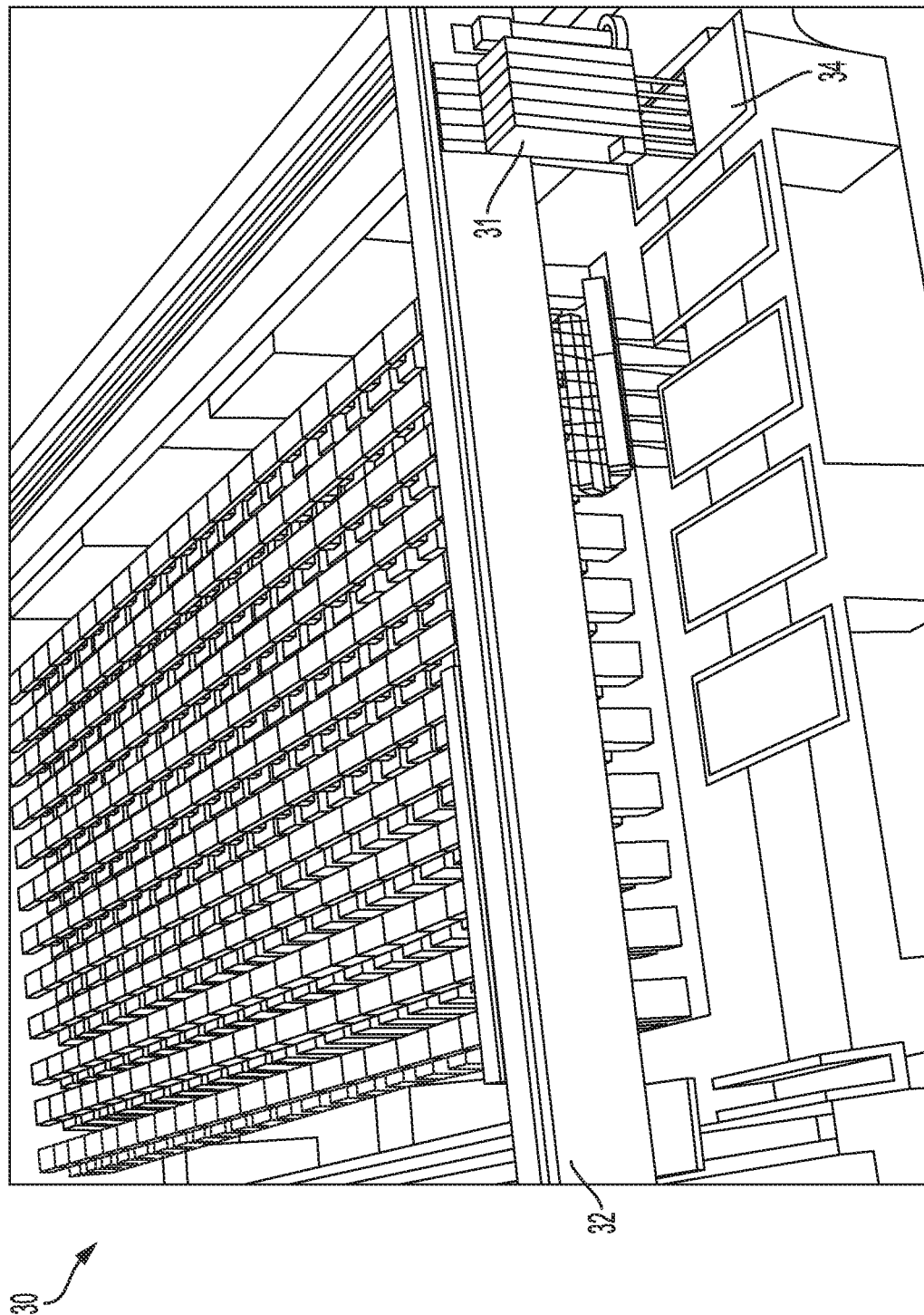
Figure 20:
Figure 21:
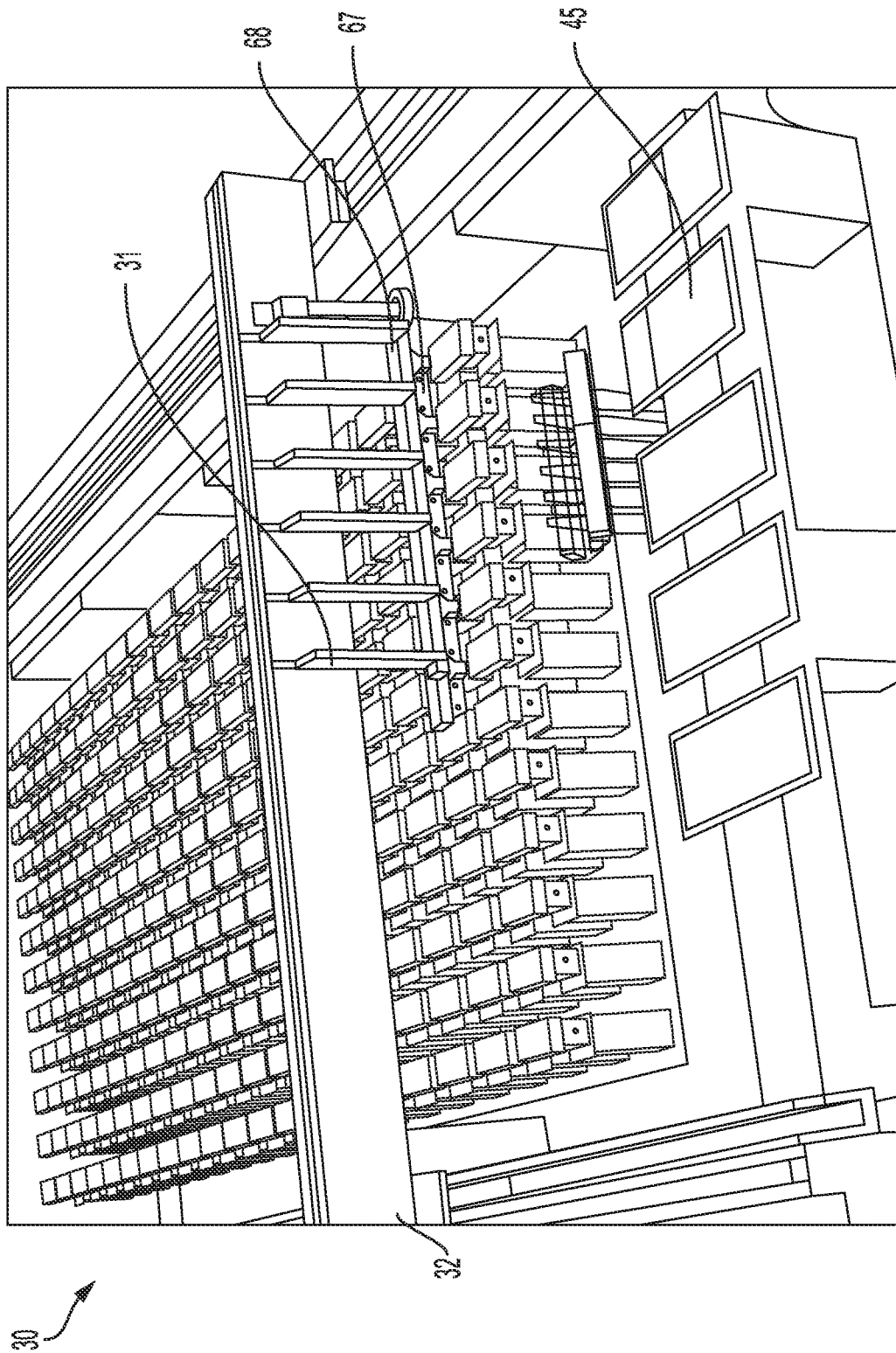
Figure 22:
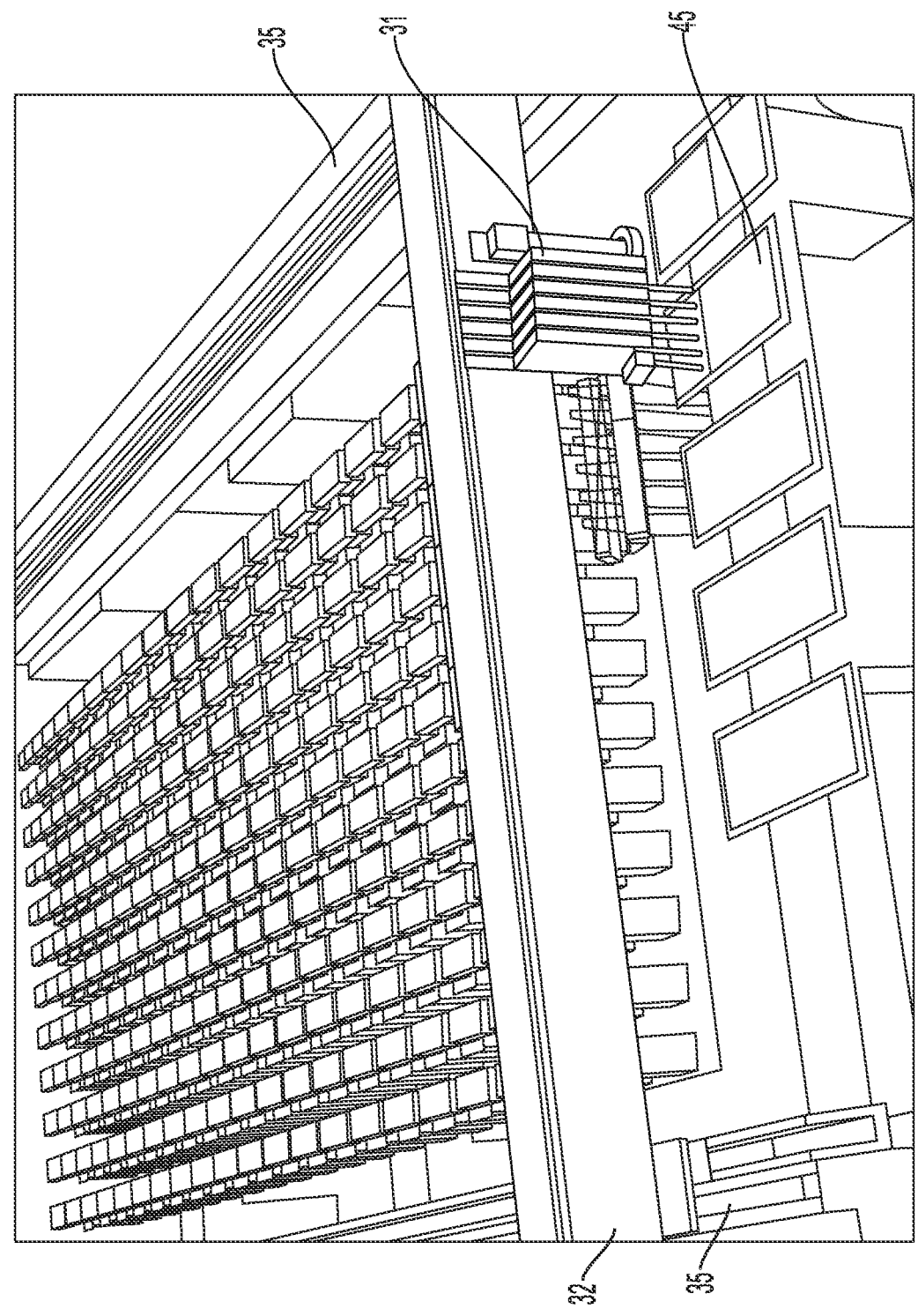
Figure 23:
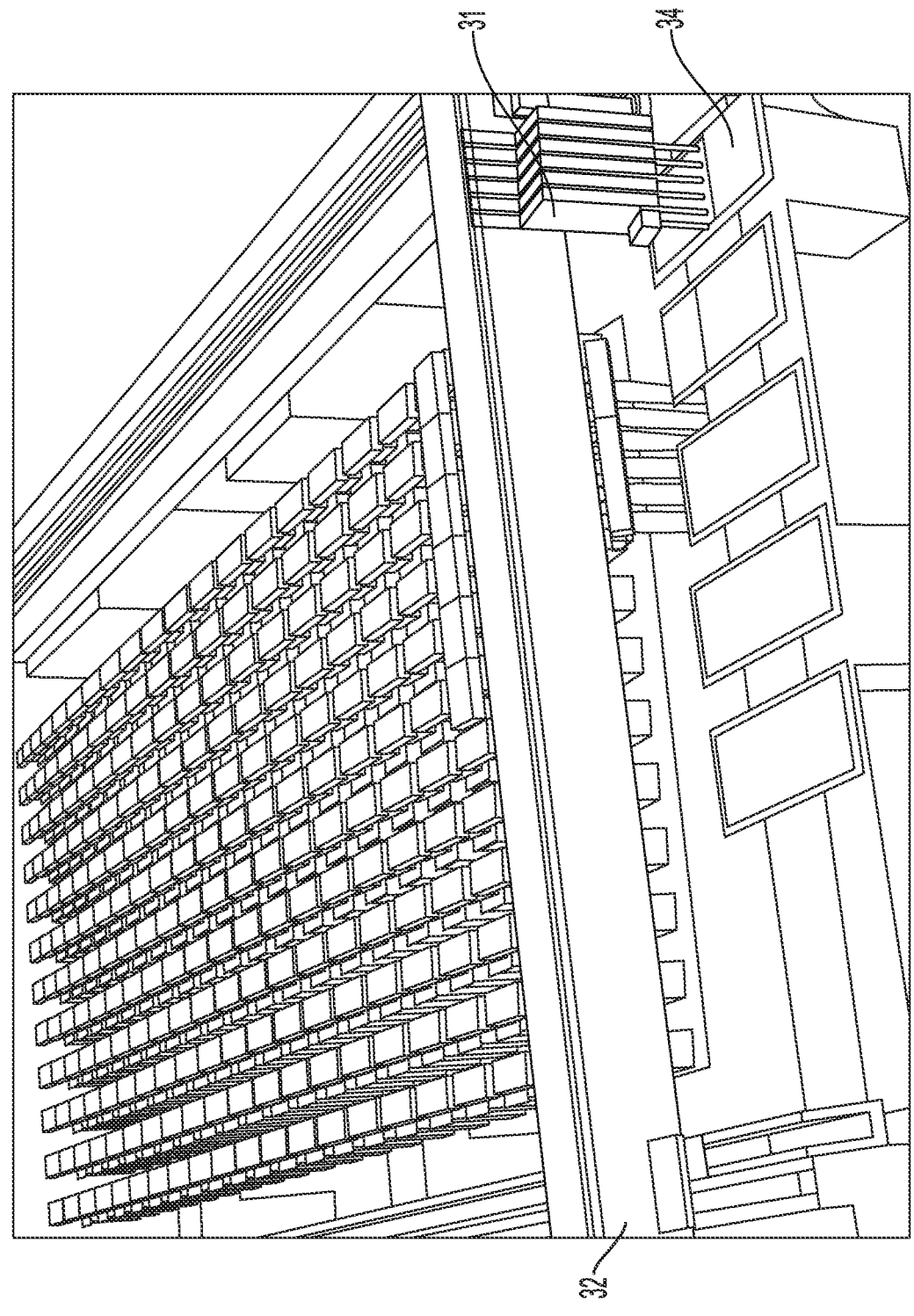
Figure 24:
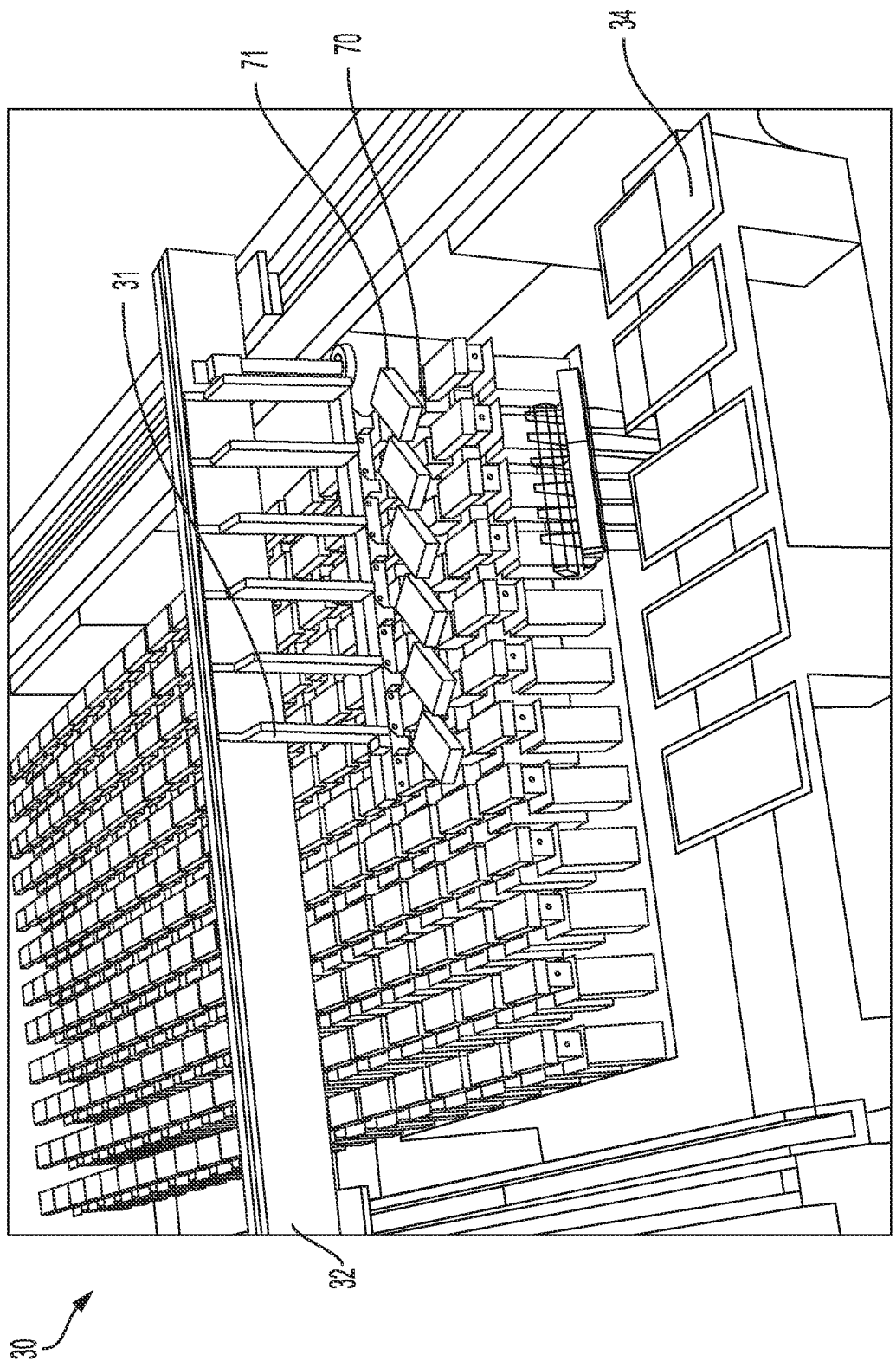

Devices that have been tested are removed from test sockets 61 and placed into tray 45 as shown in FIG. 18. Pickers 31 and gantry beam 32 are then controlled to move linearly to position pickers 31 as shown in FIG. 19 to pick up devices to be tested from tray 34. Pickers 31 and gantry beam 32 are then moved into position to place those devices to be tested into test sockets 63. As shown in FIG. 20, the lids 64 of test sockets 63 are moved to expose the test sockets 63 and to enable the pickers to place the devices into test sockets 63. Next, as shown in FIG. 21, pickers 31 and gantry beam 32 are each controlled to move linearly to position pickers 31 to pick up devices that have been tested from test sockets 67 for transport to tray 45. As shown, in FIG. 21, the lids 68 of those test sockets 67 are controlled to open to expose the devices for pick-up by pickers 31. As shown in FIG. 22, the devices that have been tested are moved into tray 45 and placed there by pickers 31. Next, in FIG. 23, pickers 31 are moved to tray 34 to pick-up devices that have not been tested. That is, pickers 31 and gantry beam 32 are each controlled to move linearly to position pickers 31 as shown in FIG. 23 to pick up devices to be tested from tray 34. Referring next to FIG. 24, pickers 31 and gantry beam 32 are controlled to move to place those devices to be tested that were picked-up from tray 34 into test sockets 70 for testing. Placement is not shown in FIG. 24.

Figure 25:
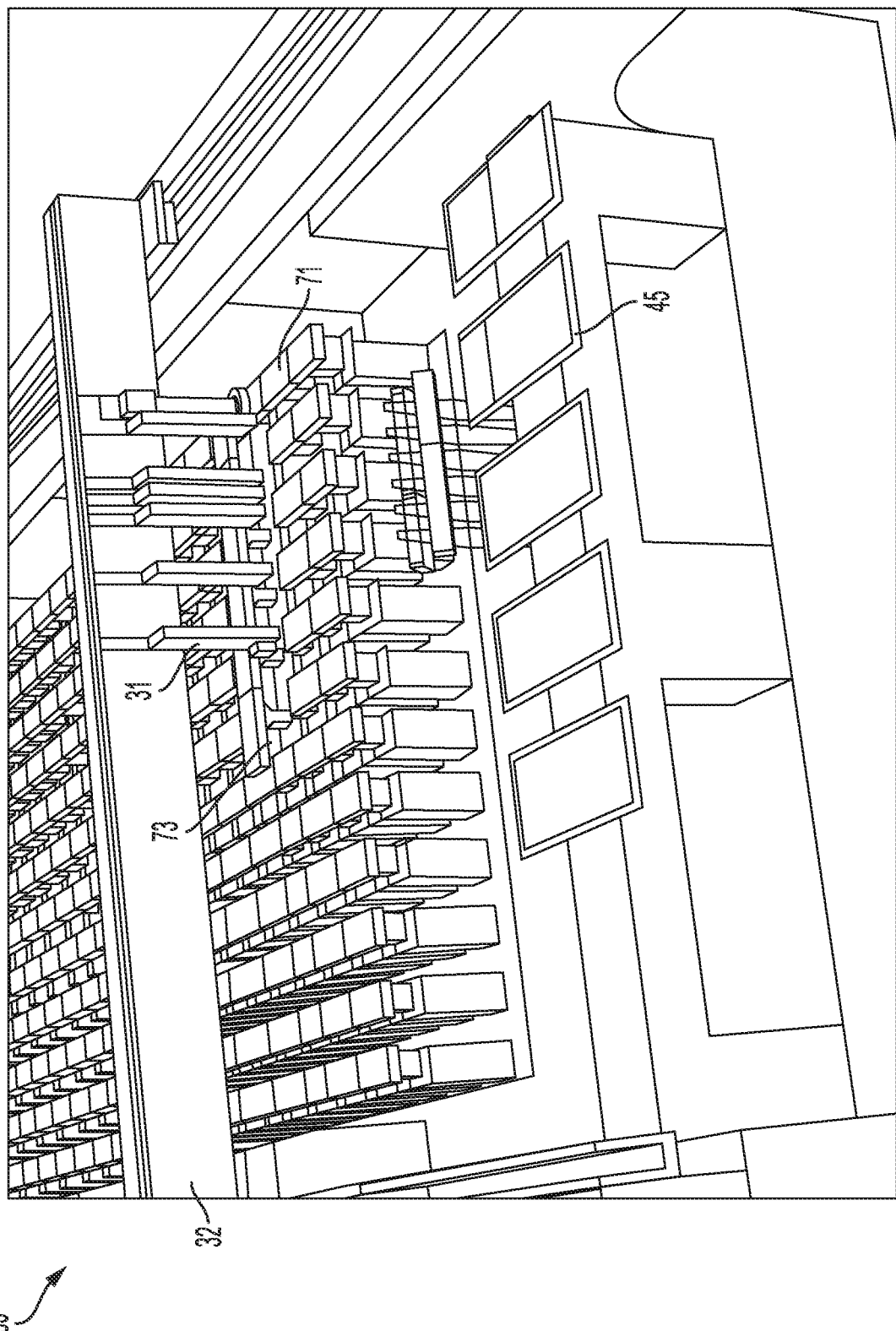
Figure 26:
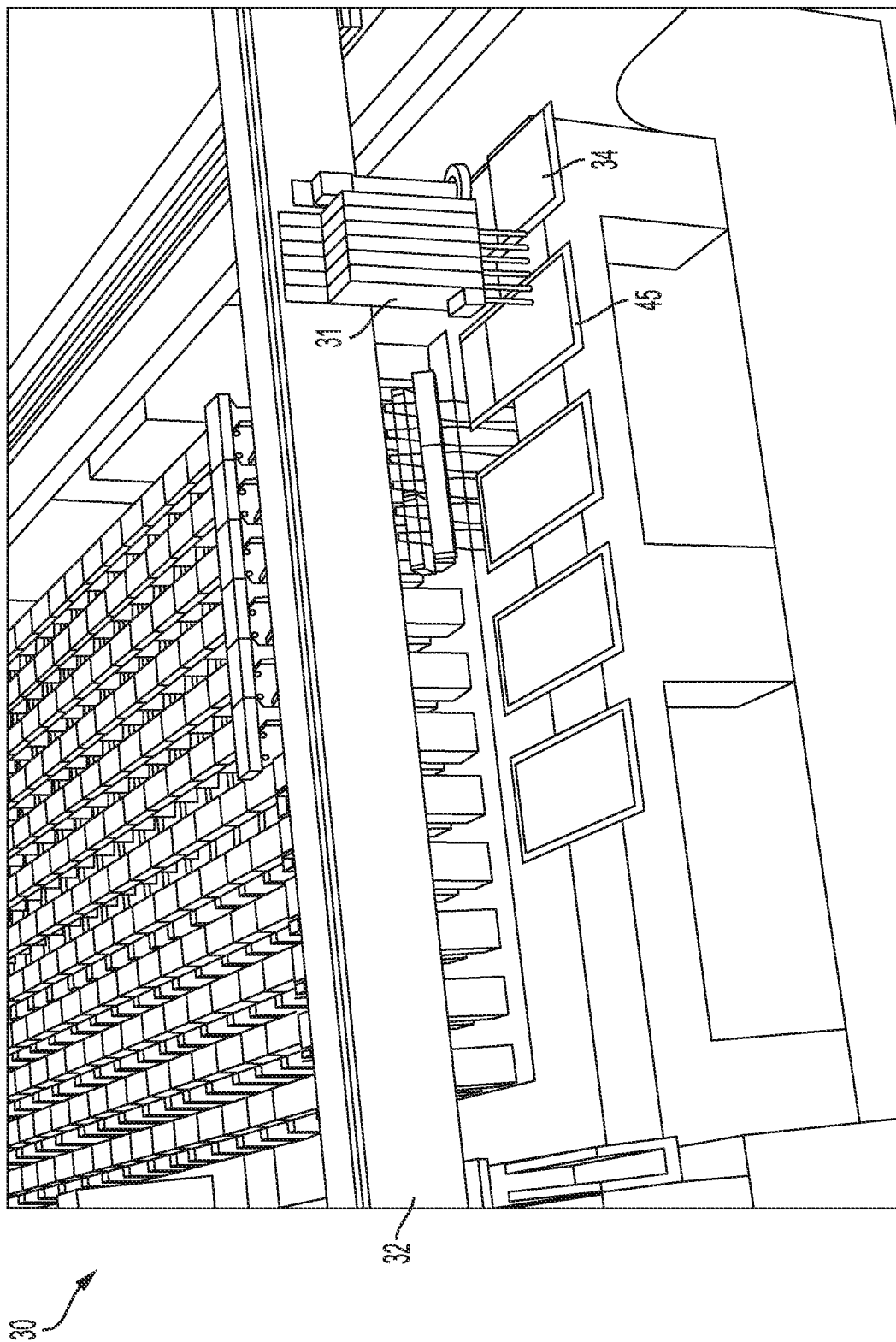
Figure 27:
Figure 28:
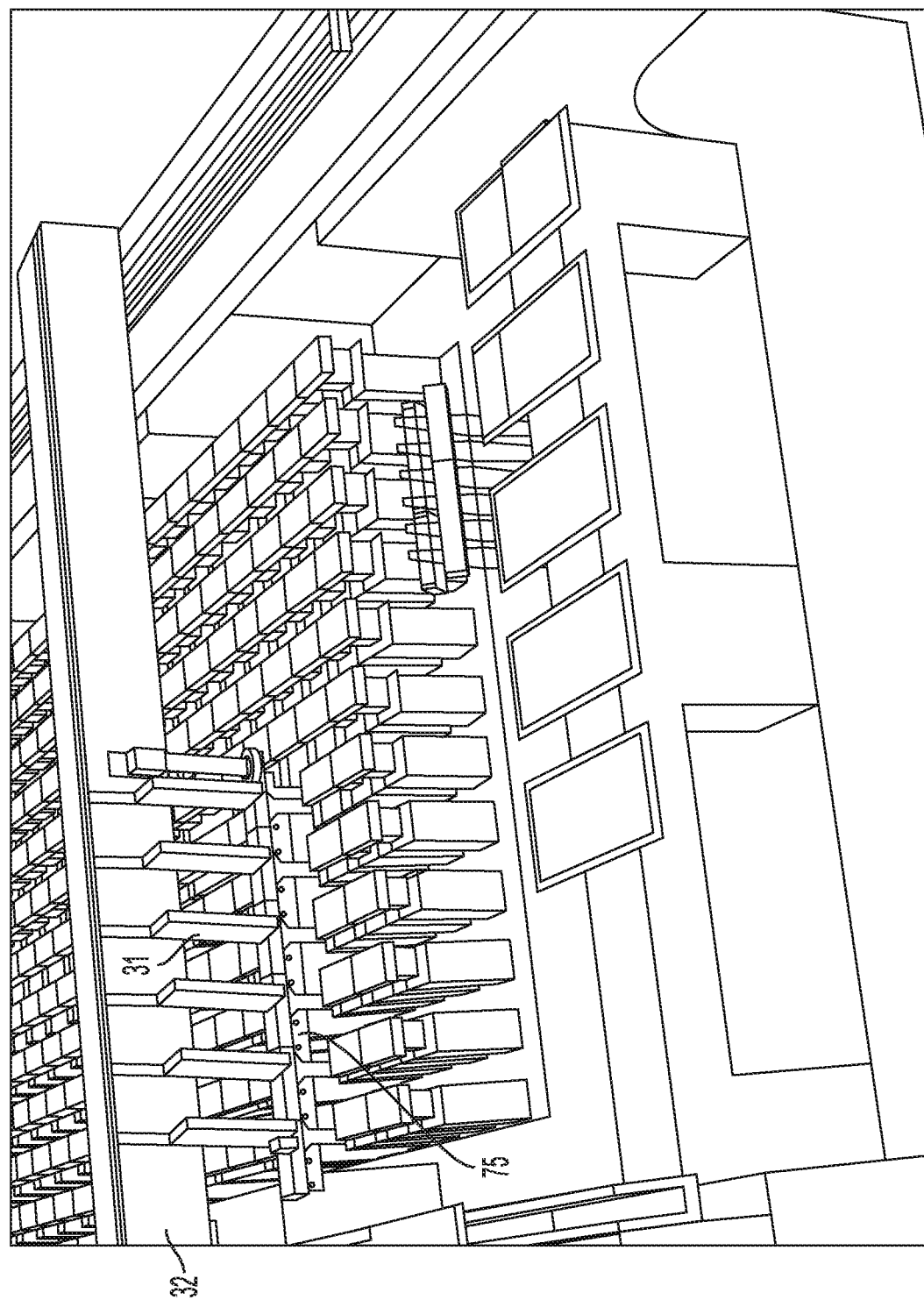

However, as partially depicted in FIG. 24, in this example lids 71 rotate in one direction to allow pickers 31 to place devices to be tested into respective test sockets 70 and rotate in the opposite direction to cover the devices after they have been placed, as shown in FIG. 25. Pickers 31 and gantry beam 32 are then controlled to move to a new row 73 to pick-up devices that have been tested from test sockets in that row and to transport those devices to tray 45. After that, as shown in FIG. 26, pickers 31 and gantry beam 32 are controlled to move the pickers from tray 45 to tray 34 to pick-up devices that have not been tested. As shown in FIG. 27, pickers 31 and gantry beam 32 are then controlled to move to place those untested devices into test sockets 73 which were previously evacuated as described with respect to FIG. 25. Then, pickers 31 and gantry beam 32 are controlled to move to pick-up devices that have been tested from test sockets 75, as shown in FIG. 28. Operation of the pick-and-place robotics shown in FIGS. 4 to 28 may continue in this manner until testing has completed.

In some implementations, a number (for example, six) DUTs to be picked-up (or locations where DUTs are to be placed) are not in the same row. As a result, the pickers would not pick or place the DUTs concurrently or in parallel. Instead, the pickers and the gantry are controlled by the control system to perform picking or placing using as many steps as needed. For example, the pickers and/or the gantry may be controlled to pick-up two DUTs in parallel on one tray row, then move to pick-up four more DUTS in parallel on a different tray row, then move to place three of those DUTs in parallel into sockets that are aligned in one row, and then move again to place the remaining three DUTs into a different set of sockets aligned in another row.

FIGS. 4 to 28 show rows of test sockets having the same pitch. However, as explained previously, the test system may test devices having different sizes, shapes, and/or form factors in parallel, contemporaneously, and/or concurrently. Accordingly, groups or arrays of the test sockets in the same or different packs may have different pitches but nevertheless share the same pick-and-place robotics and be tested by the system in parallel, synchronously, or asynchronously. The groups or arrays of the test sockets in the same or different packs may be tested using the pick-and-place robotics simultaneously contemporaneously, or concurrently.

In this regard, as explained with respect to FIGS. 1 and 2, test sockets are held on packs, such as packs 13a to 13d, that are movable into and out of frame 12 and housing 11 of test system 10. T summarize, the example test system incorporates a pack architecture and a modular base frame. The pick-and-place robotics supports various numbers and configurations of packs. The pick-and-place robotics is configured to service different configurations of the packs. For example, the pick-and-place robotics may be configured to move DUTs into and out of different types of packs that are installed in the test system at the same time. In other words, the same automation can be used on differently-configured packs. These different types of packs may have test sockets of different size, height, pitch, and so forth.

In the examples of FIGS. 3 to 28, the pick-and-place robotics are arranged on a horizontal plane in a modular increment within the pack architecture. The test sockets are installed on a horizontal plane and are arranged in a rectangular array as part of the pack architecture. The number of test sockets in a pack may be based on the size of a DUT to be tested. The number of test sites in a pack may be based on the size of a test board to be tested. In an example, each pack may contain anywhere from one test socket up to 24 test sockets depending on the size of the test board. However, in other implementations, different numbers of test sockets—for example, more than 24 test sockets or fewer than 24 test sockets—may be included per pack. For example, in some implementations, a pack may have up to six test sockets or test sites in a row; for example, in some implementations, a pack may have up to eight six test sockets or test sites in a row; for example, in some implementations, a pack may have up to ten test sockets or test sites in a row; for example, in some implementations, a pack may have up to twelve six test sockets or test sites in a row; and so forth.

The number of packs to be used may be based on DUT test time and the gantry cycle time to achieve greater tester socket utilization and/or automation gantry utilization. The pack can be fully removed from the frame, as shown with respect to FIGS. 2 and 31 to 33 described below. Each pack is removable from the frame and passes under the frame structure that supports the gantry. Each pack may be supported on its own internal wheels. When a pack is removed from the test system, the pack can thus be rolled across a factory floor. The packs may be mechanically aligned to the frame so that when they are removed and replaced, the sockets will line-up in order to allow the gantry can reach all packs in the same row at the same time.

Figure 29:
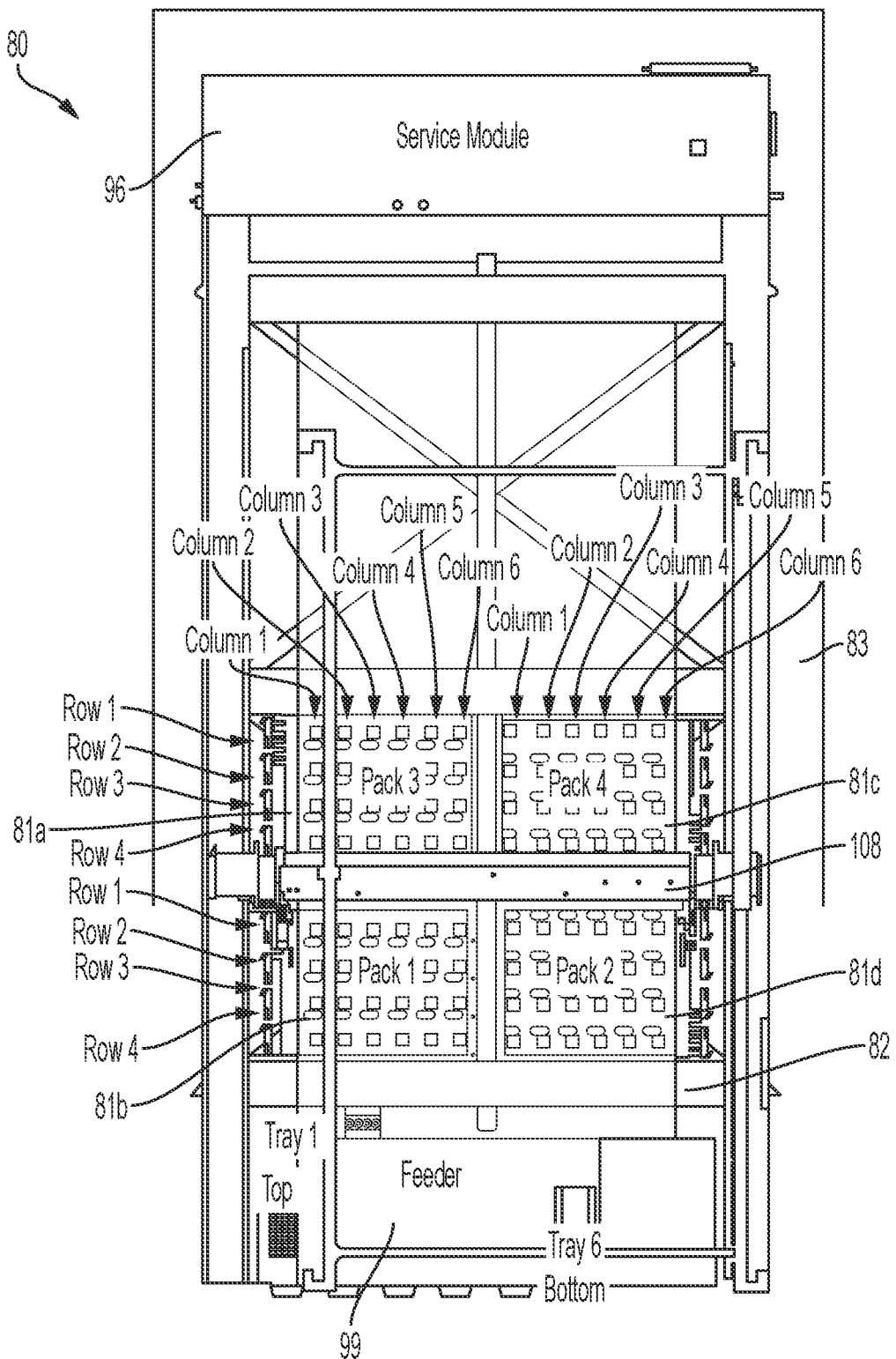
FIG. 29 is a top cut-away view of an example test system absent its housing showing internal components of the test system.
Figure 30:
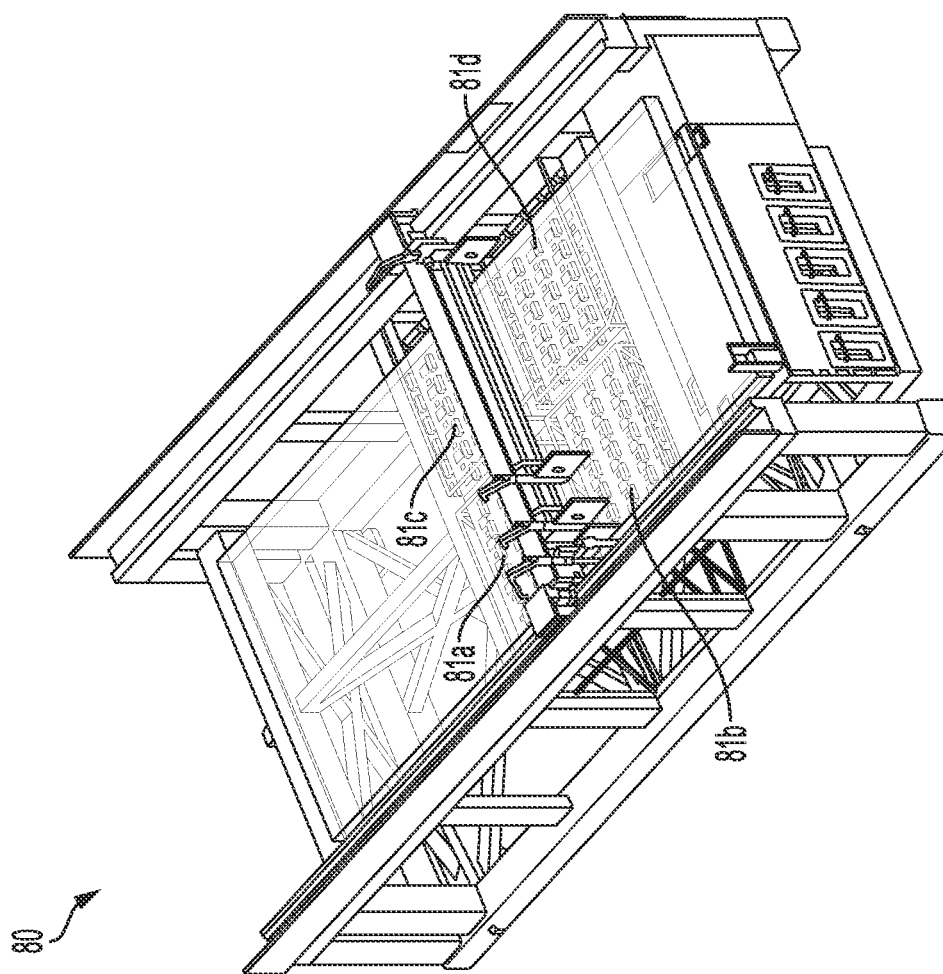
FIG. 30 is a perspective view of the example test system of FIG. 29 absent its housing to show internal components of the test system.
Figure 31:
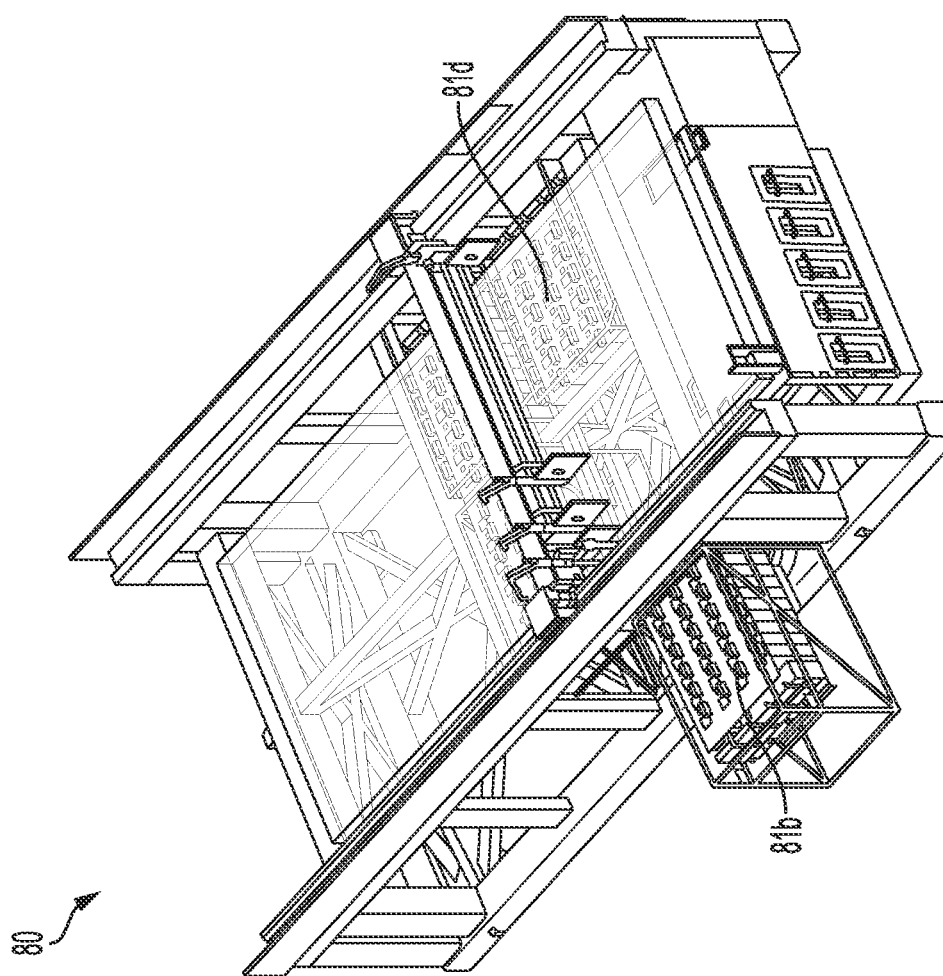
FIG. 31 is a perspective view of the example test system of FIG. 30 absent its housing to show movement of a pack into or out of the test system.
Figure 32:
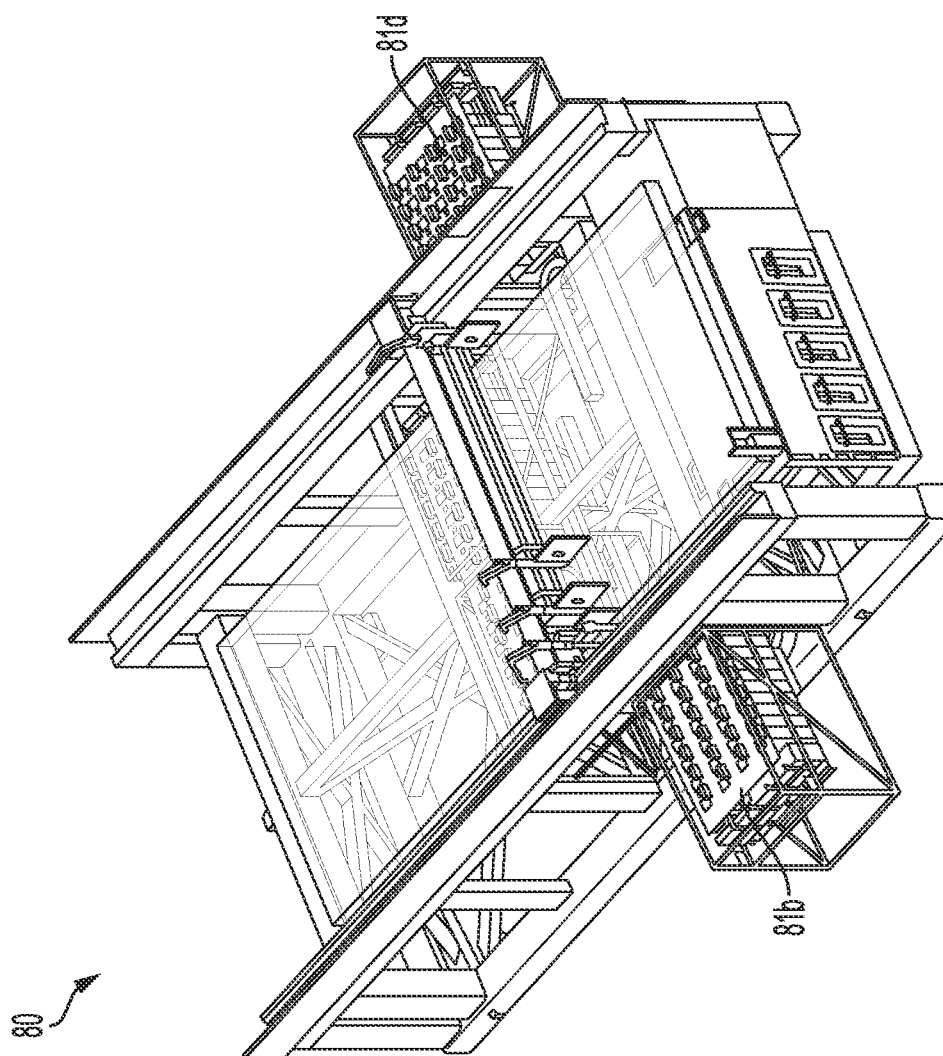
FIG. 32 is a perspective view of the example test system of FIG. 30 absent its housing to show movement of two opposing packs into or out of the test system.

FIG. 29 shows a top view of components of example test system 80, which may be of the type described respect to FIGS. 1 to 28. In this example, test system 80 contains four packs 81a to 81d held on rack 82 within housing 83. The sockets included in the packs are aligned in rows and columns. FIGS. 30 to 32 show perspective views of example test system 80. As shown in FIGS. 31 and 32, one or more individual packs such as packs 81b and 81d are removable from the test system. In this example, removable includes fully removable from the test system. Those packs are then replaceable with the same type of packs or with different packs. Test system 80 is therefore modular in the sense that a pack can be replaced in the test system in order to test different or the same types of devices in test sockets on the packs. In this regard, the test system is configured to operate with or without a full complement of packs. Packs may be replaced without reconfiguring software and/or hardware in the system. In some implementations, packs can be replaced during operation of the pick-and-place robotics in a so-called "hot swap". For example, testing on a pack 81a may be ongoing while pack 81b is being removed or replaced without interrupted testing on pack 81a.

Figure 33:
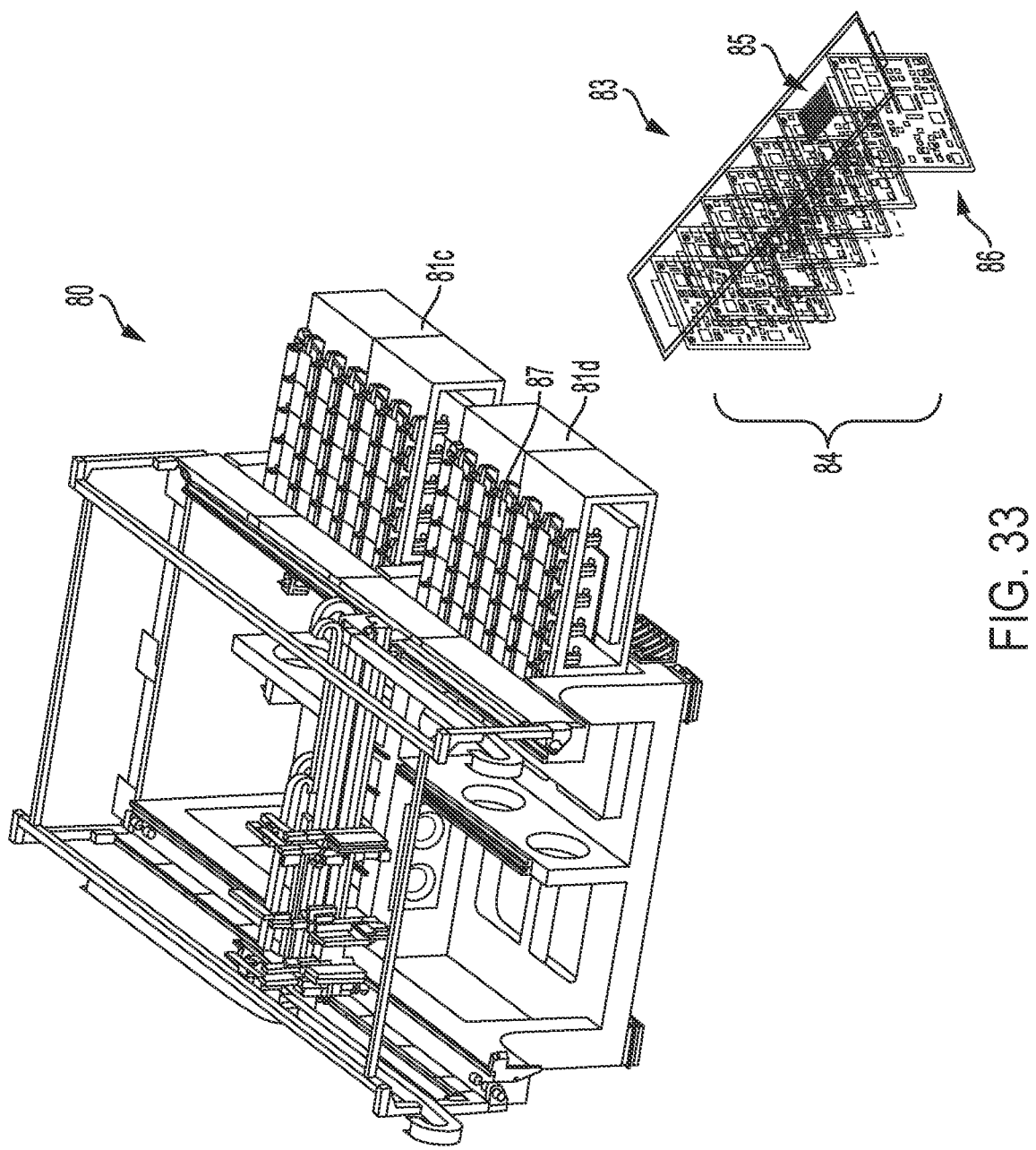
FIG. 33 includes a perspective view of the example test system of FIG. 30 absent its housing to show movement of two adjacent packs into or out of the test system, and also includes a perspective view of example pack electronics.

FIG. 33 also shows components of test system 80. In particular, FIG. 33 shows example electronics 83 that may reside in and/or on each pack, such as pack 81d. In this example, pack 81d contains test electronics 84, interface electronics 85, a controller board 86, and test sockets 87. Interface electronics 85 may include, but is not limited to, a midplane circuit board; standard, semi-custom, or custom customer interface circuitry; and standard board-to-board internal interface circuitry. Test electronics 84 may reside on one or more function boards that plug into the midplane. Controller board 86 may include a microprocessor, microcontroller, or other processing device(s) to control testing performed by the pack and to communicate external to the pack.

As noted, the test sockets may be configured to hold devices that are to be tested. Different packs may be configured—for example, constructed, arranged, programmed, and/or controlled—to test different types of devices. Accordingly, the test sockets may have different configurations to accommodate different types and/or numbers of devices, to support different types of devices having different form factors, to support different types of devices having different electrical interfaces, to support different types of devices having different thermal requirements, to support different types of devices having different physical interfaces, to support different types of devices having different wireless functionalities, and/or to support different types of devices having electro-mechanical interfaces. In an example, different packs may include, but are not limited to, different numbers of test sockets arranged at different pitches. Furthermore, the test sockets on an individual pack may be configured and/or reconfigured to accommodate different types and/or numbers of devices, to support different types of devices having different form factors, to support different types of devices having different electrical interfaces, to support different types of devices having different thermal requirements, to support different types of devices having different physical interfaces, to support different types of devices having different wireless functionalities, and/or to support different types of devices having electro-mechanical interfaces. Accordingly, arrays or groups of test sockets may differ across different packs or across rows or other subsections of the same pack.

Figure 34:
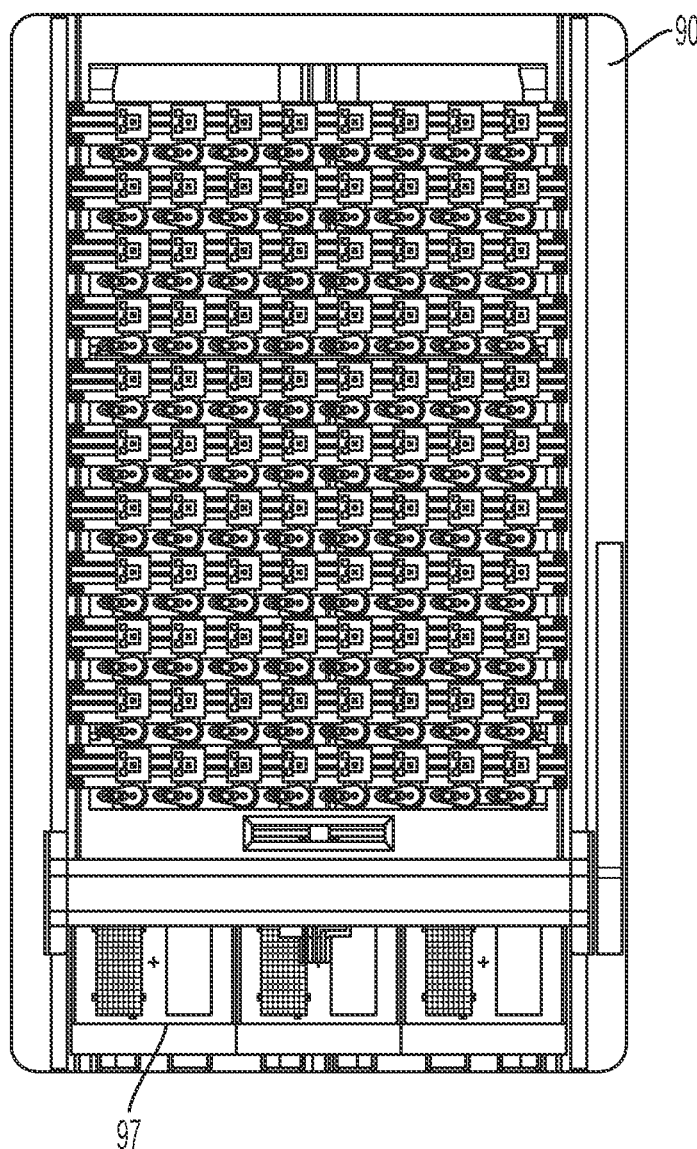
FIG. 34 is a top view of an example arrangement of test sockets on a pack.
Figure 35:
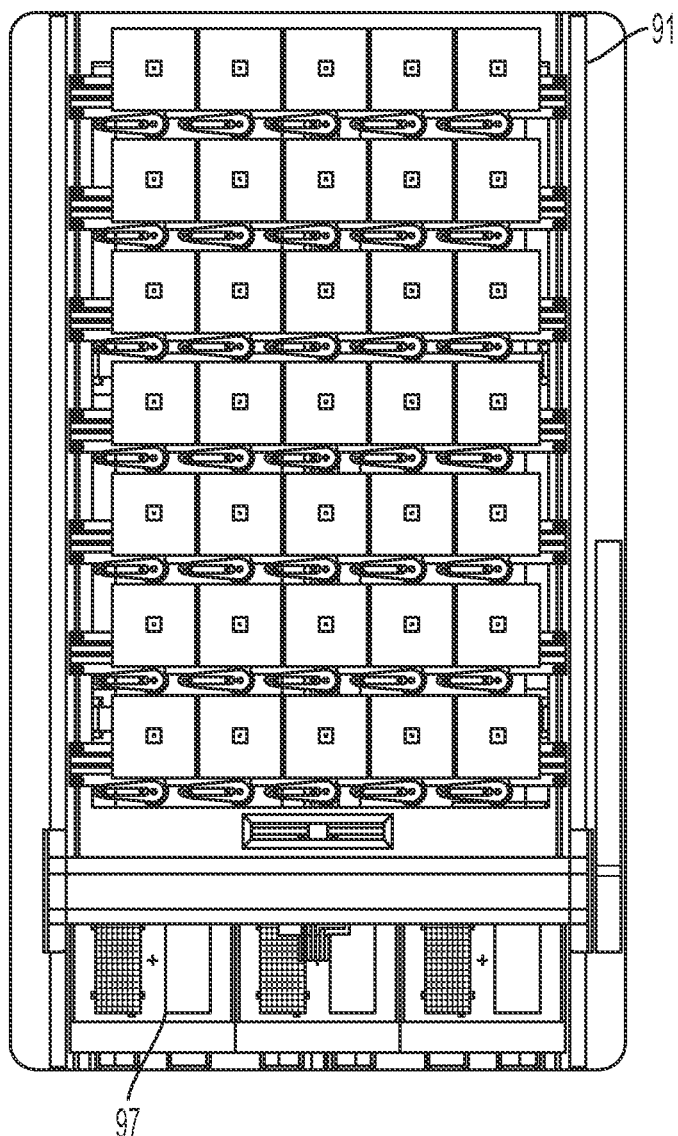
FIG. 35 is a top view of an example arrangement of test sockets on a pack.

By way of example, FIGS. 34 and 35 show test sockets in test packs configured and/or reconfigured to accommodate different sized devices for testing on the test system. In the example of FIG. 34, example test pack 90 is configured to hold test boards (DUTs) that are 130 mm×160 mm in size resulting in a total of 88 test sites containing 88 test sockets. In the example of FIG. 35, example test pack 91 is configured to hold test boards (DUTs) that are 200 mm×250 mm in size resulting in a total of 35 test sites containing 35 test sockets.

As noted, the test electronics on a pack may include, but are not limited to, pin electronics, parametric measurement unit(s), programmable logic, and/or a microcontroller or other processing device(s). The test electronics may execute, or be used to implement, one or more test routines on devices in test sockets contained on the pack. In this regard, in some implementations, the test electronics may be customizable or reconfigurable based on the DUTs to be tested by the pack.

The interface electronics enables connection between a pack and a backplane of the test system. This connection enables communication between the test system and test electronics on the packs. Example protocols that may be supported on the connections include, but are not limited to, Peripheral Component Interconnect Express (PCIe), Universal Serial Bus (USB), and the Joint Test Action Group (JTAG) standard.

Figure 36:
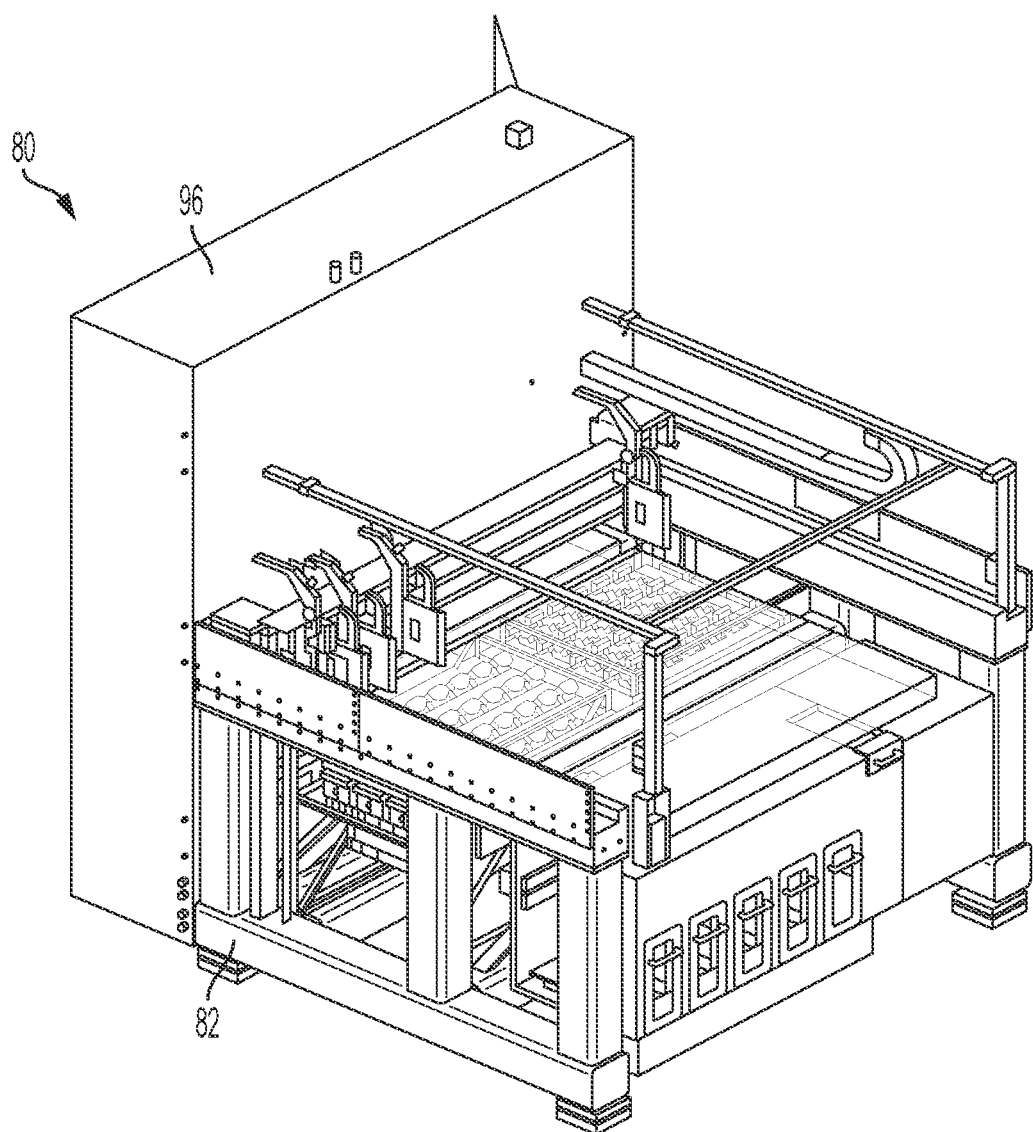
FIG. 36 is a front perspective view of the example test system of FIG. 29 absent its housing and in combination with a service module.
Figure 37:
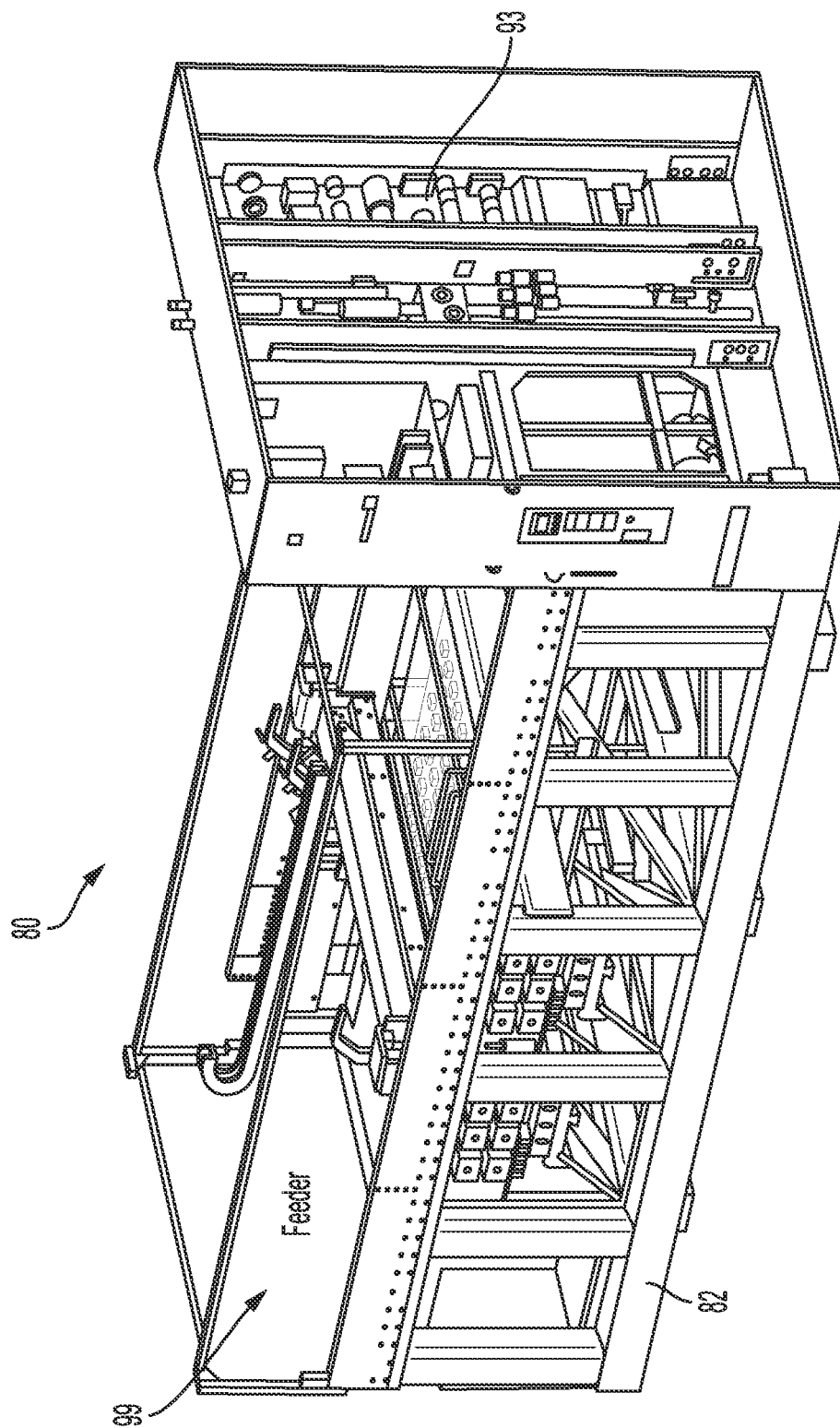
FIG. 37 is a back perspective view of the example test system of FIG. 37 absent its housing and with electronics in the service module exposed.

Referring to FIGS. 36 and 37, example test system 80 may include electronics 93 to enable communication between the packs and/or the DUTs and a control system, to provide power to the various packs, and to control servicing and other functionalities, such as LASER ("light amplification by the stimulated emission of radiation") scanning, image capture, and cleaning described below.

In this regard, test system 80 may include a control system. The control system may include circuitry and/or on-board electronics 93 to control operations of test-system 80. The circuitry or on-board electronics are "on-board" in the sense that they are located within the housing of the test system itself. The on-board electronics may include, for example, one or more microcontrollers, one or more microprocessors, programmable logic such as a field-programmable gate array (FPGA), one or application-specific integrated circuits (ASICs), solid state circuitry, or any appropriate combination of two or more of these types of circuitry or processing devices.

In some implementations, on-board components of the control system communicate with a remote computing system 95 (FIG. 1), which may be part of the control system. This computing system is remote in the sense that it is not located in the housing of the test system. For example, the control system can also include computing resources distributed to a remote location—for example, at a manufacturer's facility—at least a portion of which is not within the test system housing. Connection 94 between the test system on-board components and the remote computing system may be over a computer network, such as an Ethernet network or a wireless network. Commands provide by the remote computing system may be transferred for execution by the on-board electronics. In some implementations, the control system includes only on-board components. In some implementations, the control system includes a combination of on-board components and the remote computing system. In some implementations, the control system may be configured—for example programmed—to implement control functions based at least in part on input from a person. Test results and other information generated by the test system may be stored in computer memory within the housing or they may be transmitted to the remote computing system.

The control system may include a servo controller or servo control functionality to control the position and velocity of the gantry beam and/or the pickers. An example servo controller may operate to regulate the velocities and positions of motors controlling the gantry beam and pickers based on feedback signals. In general, a servo controller executes a servo loop to generate a command to minimize an error between a commanded value and feedback value, such as a commanded velocity and feedback velocity value. The servo controller may also implement position control in addition to velocity control. To implement position control, a position loop may be added in series with the velocity loop.

In some implementations, a proportional-integral-derivative (PID) position provides position and velocity control absent a separate velocity loop.

In some implementations, the control system may be implemented in or be part of a service module 96, which is shown in FIGS. 29 and 36. In the example of FIGS. 29 and 36, the service module is connected physically to the frame 82 of test system 80; however, that is not a requirement. In some implementations, service module 96 may include test electronics of the type described herein for performing or assisting in tests performed on devices in the sockets. Service module 92 may also include electronics, such as one or more processing devices, for maintaining the test system. For example, as described herein, a LASER-based cleaning system may be used to clean the test sockets. Electronics to operate this system may be part of the service module. All or part of the control system described herein may reside in the service module.

As explained previously, devices to be tested and devices that have been tested are stored in trays that are serviced by the pick-and-place robotics. Example trays that may be used include, but are not limited to, Joint Electron Device Engineering Council (JEDEC) trays. In the examples of FIGS. 29 and 37, a feeder 99 is configured to receive trays of tested devices, and to provide trays of untested devices to the test system. In an example, the feeder is configured to pass trays into a support window-frame that promotes tray flatness and to provide a repeatable Z-dimension position of the tray In the example of test system 10 (FIG. 1), there are six trays (see also trays 97 of FIGS. 34 and 35); however, the test systems described herein are not limited to use with six trays. In the example of test system 30 (FIGS. 4 to 28), there are five trays in use; however, the system is not limited to use with five trays. In a six-tray system, a first tray may contain untested devices having a first type and a second tray may contain tested devices having the first type. A third tray may contain untested devices having a second type and a fourth tray may contain tested devices having the second type. A fifth tray may contain untested devices having a third type and a sixth tray may contain tested devices having the third type. In this example, the first, second, and third types of devices are different in at least one respect and are tested using different packs inserted into the test system housing. In some implementations, different trays may be designated for devices that have passed testing and for devices that have failed testing. For example, rather than having a single tray for each type of tested device, there may be two trays for each type of tested device—one tray to hold devices that have passed testing and one tray to hold devices that have failed testing, along with one tray for holding devices of the type that have not yet been tested. In some implementations, there may be more than one feeder to move trays into and out of the system and the number of trays may be different. The feeders may be loaded and unloaded manually or using automation (not shown) that connects to the test system.

The pickers described herein, such as pickers 31, may include linear magnetic motors that allow their arms to extend or to retract relative to a test socket. Each picker may include a picker nozzle that is configured to hold a device to be tested or a device that has been tested for transport between the trays and the sockets. In an example, there are six pickers configured to pick-up from one to six devices concurrently from a tray or a socket array. In other examples, however, there may be more than six pickers or fewer than six pickers. The number of pickers in the test system is scalable—for example, one or more pickers may be added to, or removed from, the test system. For example, the number of pickers may be scalable based on characteristics of the packs and on characteristics of the test sockets in the packs. For example, if a pack contains 12 test sockets in a row, the number of pickers may be a factor of 12. In this regard, the pick-and-place automation, such as the number of pickers, can be configured differently depending on DUT test time—different DUT types can take different time to test. Automation configuration does affect maximum throughput in some implementations. For example, if the automation is configured with more pickers, a maximum number of DUTs that can move through the test system per hour will be greater.

Figure 38:
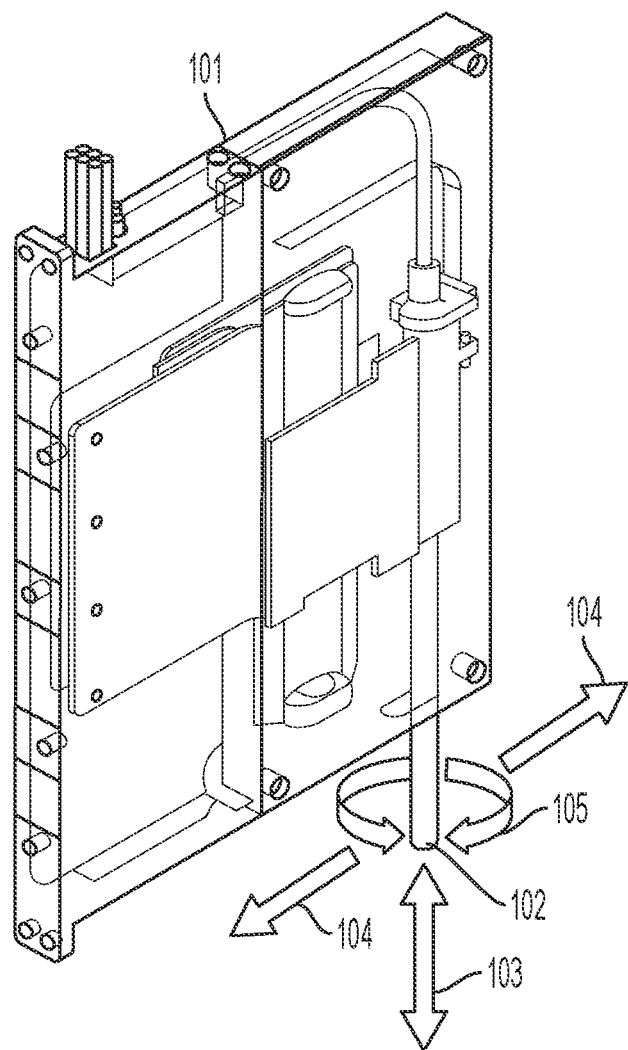
FIG. 38 is a perspective view of an example picker.

In some implementations, at least part of each picker is configured to operate in three degrees of freedom in concert with other pickers in a group of pickers or independently of the other pickers in the group. For example, at least part of each picker may be configured to move forward-backward (the Y dimension of FIG. 4) independent of and with gantry movement, left-right (the X dimension of FIG. 4), and up-down (the Z dimension of FIG. 4). In the example of FIG. 38, example picker 101—which may be of the same type as a picker 19 or 31—includes an arm 102 having a nozzle at the end of the arm to hold a DUT. The arm is movable up-down 103 in the Z-dimension and forward-backward 104 in the Y-dimension (which is the Y-axis jog described below). In this example, arm 102 containing the nozzle is also rotatable 105 both in the counterclockwise direction and in the clockwise direction. This rotation constitutes movement in a fourth degree of freedom.

In some implementations, an individual picker or each picker in a group is configured to operate in four degrees of freedom independently of all other pickers. For example, at least part of a picker may be configured for independent movement as follows: forward-backward (the Y dimension of FIG. 4) (the Y-axis jog), left-right (the X dimension of FIG. 4) (movement along the gantry beam), up-down (the Z dimension of FIG. 4) (the picking and placing actions) and, rotation as shown in FIG. 38, which may be used to position DUTs for pick-up, for placement, or for both.

The pickers are configured to move linearly along the gantry in the X dimension and to move along with the gantry in the Y-dimension as described previously, for example, with respect to FIGS. 3 to 28. Furthermore, each picker is also configured to move at least partly perpendicularly or obliquely relative to the gantry beam in order to finely align with one or more respective test sockets independently of Y-dimension movement produced by the gantry. For example, each picker may be configured to move in the Y-dimension or partly in the Y-dimension to enable parallel or concurrent device pick-up or placement. This Y-dimension movement may be separate from, and independent of, movement of other pickers in a group of pickers mounted on a gantry beam. This movement is referred to as "Y-axis jog" as noted above. Linear magnetic motors may be controlled by the control system to implement the Y-axis jog movement.

The Y-axis jog capability may accommodate mechanical tolerances in the test system Y-dimension positions of test sockets in packs and/or of rows of tray cells. For example, within a row of test sockets, individual devices and/or test sockets may be out of line—for example, off-center relative to other devices and/or test sockets in the row. For example, within a row of cells in a tray, individual devices and/or cells may be out of line—for example, off-center relative to other devices and/or cells in the row. The deviation in both cases may be measured in single-digit microns to single-digit millimeters, for example. The arms of pickers may be controlled to move in the Y-axis to account for such deviations. For example, the arms of the pickers may be controlled to move each nozzle to a center of its respective target socket or DUT to ensure that each picker places its DUT at the center of the target socket or picks-up the DUT at its center. The deviations may be detected by the vision system described herein and the pickers each may be controlled individually and independently by the control system described herein. In an example, the movement in the Y-dimension may be on the order of single-digit microns to single-digit millimeters; however, the Y-axis jog movement is not limited to this numerical range. To reiterate, the Y-axis jog movement of each picker is separate from Y-axis movement of the gantry beam and is relative to the gantry beam. Following DUT placement or pick-up, the Y-axis jog may be used to re-align the pickers during movement of the gantry beam.

As also described herein, individual pickers may be controlled to move along the gantry beam in the X-dimension to change the pitch between two or more adjacent pickers. In this regard, in some implementations, each picker may be mounted on an individual servo-controlled axis that enables the picker to dynamically adjust to—for example to match substantially—the center-to-center distance between test sockets and the center-to-center distance between tray cells. Examples of this dynamic adjustment are described with respect to FIGS. 4 and 28.

The picker nozzle is mounted on the picker arm, which extends and retracts in the Z-dimension—for example, vertically—as described herein. The picker nozzle is the contact point between the picker assembly and the DUT. Each nozzle may be configured to hold a DUT using vacuum pressure, for example. The nozzle may be a soft polymer vacuum cup comprised of ESD-dissipative material, a hard plastic tip comprised of ESD-dissipative material, a hard material comprising an integrated ejection collar to accommodate roll and pitch changes of a DUT, or a soft polymer vacuum cup comprising an integrated ejection collar configured to reduce stiction between the nozzle and the DUT. Other types of nozzles may be used. In some examples, mechanical ejection of DUT from the nozzle using an injection collar or other appropriate type of mechanical ejection mechanism may speed throughput and increase the accuracy at which DUTs are placed in the test sockets.

In some implementations, thermally induced expansion or contraction of the gantry beam and/or the test sockets affects positioning of the pickers. For example, the gantry beam may expand in the presence of excess heat or contract in the presence of cold, which can cause the positions of the pickers to change. In an example, the pitch of the pickers and/or the pitch of the test sockets may increase due to thermally induced expansion. In an example, the pitch of the pickers and/or the pitch of the test sockets may decrease due to thermally induced contraction. In this regard, in some implementations, one or more temperature sensors 105 may be attached to the gantry—for example, to gantry beam 21 of FIG. 3. The temperatures sensors may be distributed across the gantry beam and their values may be averaged or otherwise processed to obtain an estimated temperature of the gantry beam. The temperature sensors may detect one or more temperatures of the gantry beam during operation of the test system and report the temperature(s) to the control system. The control system may execute processes to adjust the servo axes of the pickers in response to the thermally induced expansion or contraction of the gantry. For example, the control system may dynamically decrease the pitch of the pickers to counteract thermal expansion or dynamically increase the pitch of the pickers to counteract thermal contraction. The dynamic adjustment may occur during testing—for example, testing is not interrupted and the positions of the pickers is adjusted during gantry beam movement.

In some implementations, one or more temperature sensors may mounted in each test socket as described herein. The temperatures sensors may be distributed in any appropriate manner and their values may be averaged or otherwise processed to obtain an estimated temperature of the sockets. The temperature sensors may detect the temperatures of the test sockets during operation of the test system and report the temperatures to the control system. The control system may execute processes to adjust the servo axes of the pickers in response to the thermally induced expansion or contraction of the sockets. For example, the control system may dynamically increase the pitch of the pickers to adjust for thermal expansion of the sockets causing a greater pitch between the sockets or dynamically decrease the pitch of the pickers to adjust for thermal contraction reducing pitch between the sockets.

In some implementations, multiple temperature sensors may indicate different amounts of expansion or contraction at different test sockets. In this case, the pitches of individual pickers may be adjusted accordingly to account for these different amounts of expansion or contraction. In some implementations, multiple temperature sensors may indicate different amounts of expansion or contraction at different points along the gantry beam. In this case, the pitches of individual pickers may be adjusted accordingly to counteract these different amounts of expansion or contraction. For example, in a group of pickers, the pitch between two pickers may be increased while the pitch between two other pickers may be decreased, depending upon circumstances.

In this regard, some or all components of the test system may expand and contract due to thermal effects. In some implementations, temperatures are measured at the test sites in the packs as described herein and also on the gantry as described above. The control system may be configured to execute instructions to obtain the temperature data from sensors at the test sites and at the gantry beam and to process those temperatures to determine the net thermal expansion and contraction of these two systems components. The control system may be configured to execute instructions to make the adjustments to the positions of the pickers to place DUTs into the test sockets or to pick-up DUTs from the test sockets in a manner that accounts for the relative thermal expansion or contraction of these and potentially other components of the test system. For example, the gantry beam may expand by a first amount and the sockets may expand by a second amount that is different from the first amount. The differences between the amounts of expansion may be used to calculate a net expansion. The control system may use the net expansion to adjust the pitches between pickers and, in some implementations, the magnitude of the Y-axis jog. Similar processes may be performed to account for a net contraction. In some cases, one component may expand and the other component may contract. A net difference may be determined by the controller based on the amounts of expansion and contraction and the resulting net difference may be used to adjust the positions of the pickers to account for the net difference. In some implementations, the amount of change in the adjusted pitches between pickers may vary. For example, in the case of six pickers, the first two adjacent pickers may have a first net change in pitch, the next two adjacent pickers may have a second net change in pitch, and the third two adjacent pickers may have a third net change in pitch. The first net change, the second net change, and the third net change may each be different. These different changes may be dictated by different amounts of thermal expansion at different locations.

In some implementations, temperature sensors may be included in the trays described herein and the control system may be configured to execute instructions to make the adjustments to the positions of the pickers to place DUTs into the trays or pick-up DUTs from the trays in a manner that accounts for relative thermal expansion and/or contraction of the gantry beam and the trays as described above.

The preceding adjustments to picker positions may be beneficial in example test system that use one or more down-pointing cameras (described below) to determine the positions of the test sites relative to the gantry automation including the gantry beam. Some such systems rely on one or more images captured by one or more down-pointing cameras to determine the positions of the test sites during initial system setup. These images may be captured before testing commences. In some implementations, one or more down-pointing laser scanner may be used in place of the one or more down-pointing cameras to determine the positions of the test sites during initial system setup. Because of the high throughput of the test system in some examples, a down-pointing camera may not capture an image every time a DUT is placed in a socket. In some examples, one or more up-pointing cameras capture images taken of every DUT to determine the position of that DUT relative to the picker. This may be done in real-time for each DUT on a picker, and this action may little time. During normal operation of the example test system, the control system uses data representing the last known position of a test socket captured by the down-pointing camera and stored in memory, and moves the gantry based on that last known position. If the temperature of the gantry and/or the temperature of test socket changes, then the last known position will be wrong. The temperature compensation described herein, along with the camera systems, may ensure, or at least increase the chances that, the picker will be accurately positioned for DUT placement operations and for DUT pick-up operations.

In some implementations, temperature compensation may include detecting temperatures of the test sockets as described herein. The temperature values may be processed—for example averaged—to obtain a value that is compared to a threshold. In some examples, the temperature values may be compared individually to one or more threshold values and it may be determined if a sufficient number of temperature values exceeds a threshold. In either case, if the threshold is exceeded or the number of temperature values exceeds the threshold, the down-pointing camera(s) or laser scanner(s) may be controlled to capture new image(s) of the test sockets that have been subjected to the thermal expansion. In the case of thermal contraction, the control system may determine if the processed temperature value is below a threshold or a number of individual temperatures is below the threshold. If so, then the down-pointing camera(s) or laser scanner(s) may be controlled to capture new image(s) of the test sockets that have been subjected to the thermal contraction. Testing may be interrupted to capture these new images or the new images may be captured during testing. These new images may be used to control the position and operation of the gantry beam and the pickers. In examples such as this, the dynamic adjustment of picker pitch described in the preceding paragraphs may not be performed at all. In some examples such as this, the dynamic adjustment of picker pitch described in the preceding paragraphs may be performed following new image capture.

As explained previously, the pickers are mounted on gantry. The gantry includes, among other things, the tracks, the gantry beam that holds the pickers, and one or more motors. The motors may be linear motors that are configured and controlled by the control system to move the gantry beam along the tracks as described with respect to FIGS. 4 to 28. In some implementations, the gantry is a high-speed gantry system directed by machine vision (described below) having coordinated high-speed movement capability and relatively short settling times. In this regard, the pick-and-place robotics of the example test systems described herein may be configured to move a large quantity of DUTs through the test system in a relatively short amount of time. This is called "throughput" or Units Per Hour (UPH). In order to achieve targeted throughput and test times, the pick-and-place robotics may be configured to move quickly and may also be configured to be precise in how they places\ the DUTs into the test sockets. One measure of precision is not just how accurately the robotics places the device, but also how quickly the robotics can be precise. This "timely precision" is measured using a factor called "settling time". If the settling time is reduced or minimized, the robotics can perform more actions without waiting for the system to settle into its precise position. In this regard, all dynamic systems vibrate when they move and bounce like a spring when the start and stop. The starting and stopping is achieved through acceleration and deceleration. When the robotics—for example, the gantry—accelerates or decelerates, the entire automation structure and base mounting frame may shake. The servo controller described herein operates to counteract the vibrations caused, for example, by this acceleration or deceleration. The way that the servo controller knows where and when the robot moves or shakes is through use of an encoder device. The encoder device includes an encoder scale and an encoder reader head. The encoder scale is attached to the frame of the test system, and the encoder reader head is attached to the moving axis of the robotics—for example, the gantry beam. The encoder head reads the encoder scale to identify vibrations. For example, vibrations can be detected if the encoder head moves relative to the scale.

If the encoder scale is also shaking due to the vibrations of the frame induced by acceleration of the robotics, then the servo controller may not be able to decipher the difference between movements of the robotics and shaking of the frame. To address this problem, a force frame may be used in the test system. The force frame is a physical mechanism to separate the mounting of the encoder scale and the robotics' linear motors. The encoder scale is mounted to a segregated frame (the force frame) that does not contain motors or robotics. This force frame remains stable even if the frame that holds the motors vibrates. This mechanical mechanism may improve the settling time of the robot in that settling can be addressed by the servo motor even in cases where the frame holding the robotics' linear motors vibrates. The force frame may be segregated from the main Y-axis of a dual-motor gantry robot has the largest accelerations and vibrations and has the most impact on the settling time.

Implementations of the example test system described herein include a vision system. An example vision system may include cameras, LASER scanners, or a combination of cameras and LASER scanners of the type described below.

Figure 39:
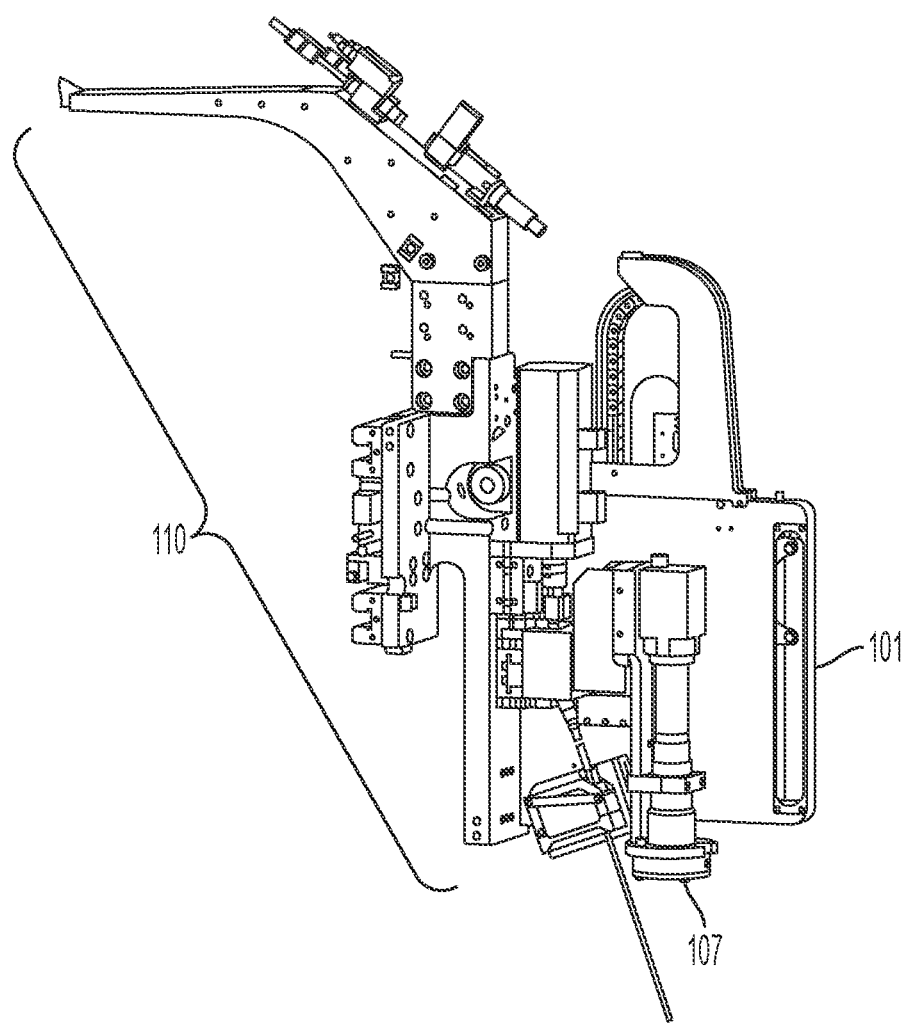
FIG. 39 is perspective view of an example camera and an example picker.
Figure 40:
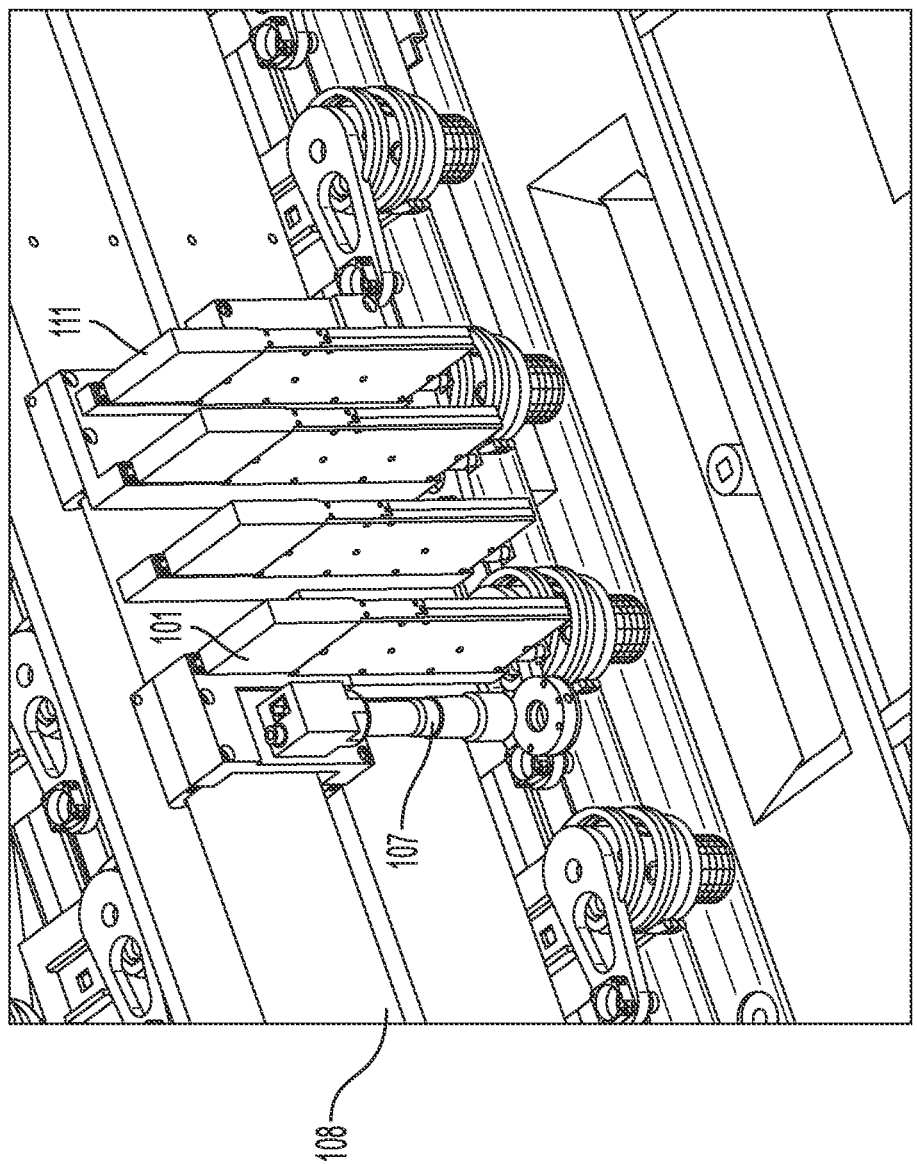
FIG. 40 is a perspective view of an example group of pickers and a camera mounted on a gantry beam of an automated gantry in a test system.

Referring to FIGS. 29, 39, and 40, test system 80 may include a camera 107, such as a three-dimensional (3D) camera, that is mounted to gantry beam 108 via mounting structure 110. In some implementations, the 3D camera may be implemented using an imaging device, which may include two or more lenses, that enables perception of depth in captured images to produce a 3D image. In some implementations, the 3D camera may be implemented or approximated using a two-dimensional (2D) camera in combination with a point LASER. In this type of 3D camera, two dimensions (for example, Cartesian X and Y) are captured with the 2D camera and depth is captured using the point LASER, an example of which is the one-dimensional (1D) LASER range finder of FIG. 43. Accordingly, for purposes described herein, a 3D camera may include any electronics and/or optics that is capable of capturing images having three dimensions, such as length, width, and depth.

Camera 107 is down-pointing, meaning that it is configured to capture images of surfaces and objects below it. Camera 107 is mounted near a group of pickers 111 including picker 101, which are also mounted on gantry beam 108. Camera 107 is configured and controllable to move linearly across the gantry beam along with the pickers. Although only one such camera is shown in the figures, the test system may include more than one such camera. For example, there may be one camera per picker. Camera 107 may have an adjustable height relative to the gantry beam. For example, a lens of camera 107 may be movable in the Z-dimension towards or away from the surface that the camera is imaging. Moving the lens or camera farther away from the surface increases its field of view, thereby allowing it to capture data over a larger area than when the lens or camera is moved closer to the surface. For example, based on the position of the camera and gantry beam, the camera may capture images of one or more empty test sockets not covered by their lids, one or more occupied test sockets not covered by their lids, or one or more occupied test sockets covered by their lids. For example, based on the position of the camera and the gantry beam, the camera may capture one or more cells in a tray that do, or do not, hold DUTs.

Image data from camera 107 may be 3D data representing a test socket and, in some cases, a test socket containing a DUT. The 3D contains data representing the X, Y, and Z dimensions. This data is sent by the camera to the control system wirelessly or over one or more system buses. The control system is configured—for example, programmed— to analyze the data received from camera 107. The data may be used to calibrate the camera and/or to position the pickers. For example, the data may identify a location of the test socket and/or a location of a device in the test socket such as when a lid is off the test socket. The control system may compare this information to expected locations of the test socket and/or the device, and adjust the locations of the pickers accordingly, either through movement along the gantry beam or using the Y-axis jog described previously. For example, the data may identify a location of the cell in a tray and/or a location of a device in the cell. The control system may compare this information to expected locations of the cell and/or the device, and adjust the locations of the pickers accordingly, either through movement along the gantry beam or using the Y-axis jog described previously. The adjustments may be performed in real-time. In this example, real-time may be during test operations. Real-time may include actions that occur on a continuous basis or track each other in time, taking into account delays associated with processing, data transmission, hardware, and the like.

Figure 46:
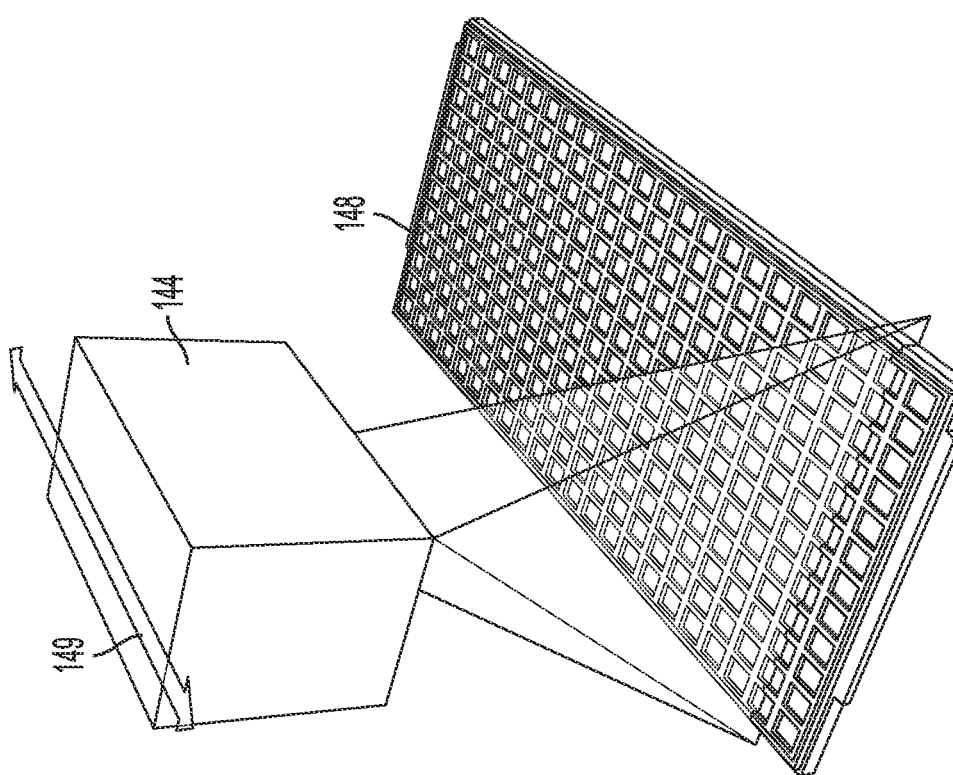
FIG. 46 is a block diagram of an example LASER scanning system for scanning device trays.

In some implementations, the vision system includes a 3D LASER scanner that is down-pointing and that is configured—for example mounted, directed, and/or controlled—to scan across the array of test sockets in the test system in a manner similar to the LASER scanner described with respect to FIG. 46. Scanning may be performed on empty test sockets not covered by their lids, occupied test sockets not covered by their lids, or occupied test sockets covered by their lids. In some implementations, scanning may be performed prior to testing in and the resulting data may be stored in memory and used to position the pickers as described above. The down-pointing 3D scanner may be mounted on one or more motorized axes and may capture 3D data that forms a 3D point cloud representation of the test sockets. In some implementations, a 3D camera may replace the 3D laser scanner.

This 3D data obtained by the laser scanner or camera may be sent to the control system in the manner described previously. The control system may be configured—for example, programmed—to process the 3D data to determine, for example, the roll and pitch of a single test socket plane as well as a test socket height (Z value). The control system may be configured to process the 3D data determine the roll and pitch of a plane containing some or all test sockets and the average height of test sockets in the plane. The control system may be configured to process the 3D data to determine the X, Y, and Z coordinates of, and yaw information for, an individual test socket by taking into account identifiable features of the test socket such as a 2D array of spring-loaded connector (e.g., Pogo pin) holes shown in the 3D data. The X, Y, Z coordinates and yaw information may be used by the control system to control the pickers. For example, the 3D data may identify a location of the test socket and/or a location of a device in the test socket when lid is off the test socket. The control system may use such information to control the positions of the pickers, either through movement along the gantry beam or using the Y-axis jog described previously. The control system may compare this information to expected locations of the test sockets and/or the devices, and adjust the locations of the pickers accordingly, either through movement along the gantry beam or using the Y-axis jog described previously. In some implementations, the pickers may be adjusted in this manner during or prior to testing operations.

In some implementations, the preceding 3D scanning may be performed during pick-and-place operations implemented during system operation. In this case, the 3D data from the one or more 3D scanners may be used as described herein to control operations of the pickers in real-time. In some implementations, the preceding 3D scanning may be performed prior to pick-and-place operations implemented during system operation. The information about test socket and device placement may be used instead of, or in addition to, the information captured by the 3D camera of FIG. 40. For example, the information from the 3D scanner may augment the information from the 3D camera or the information from the 3D camera may augment the information from the 3D scanner, and the resulting information may be used to control the pickers in real-time. For example, the information from the 3D scanner and the 3D camera may be averaged by the control system and the control system may use this averaged information to control the pickers in real-time. In some implementations, one or more 3D scanners may replace the one or more 3D cameras of FIG. 40. Some implementations may not include down-pointing 3D scanners of this type.

Figure 41:
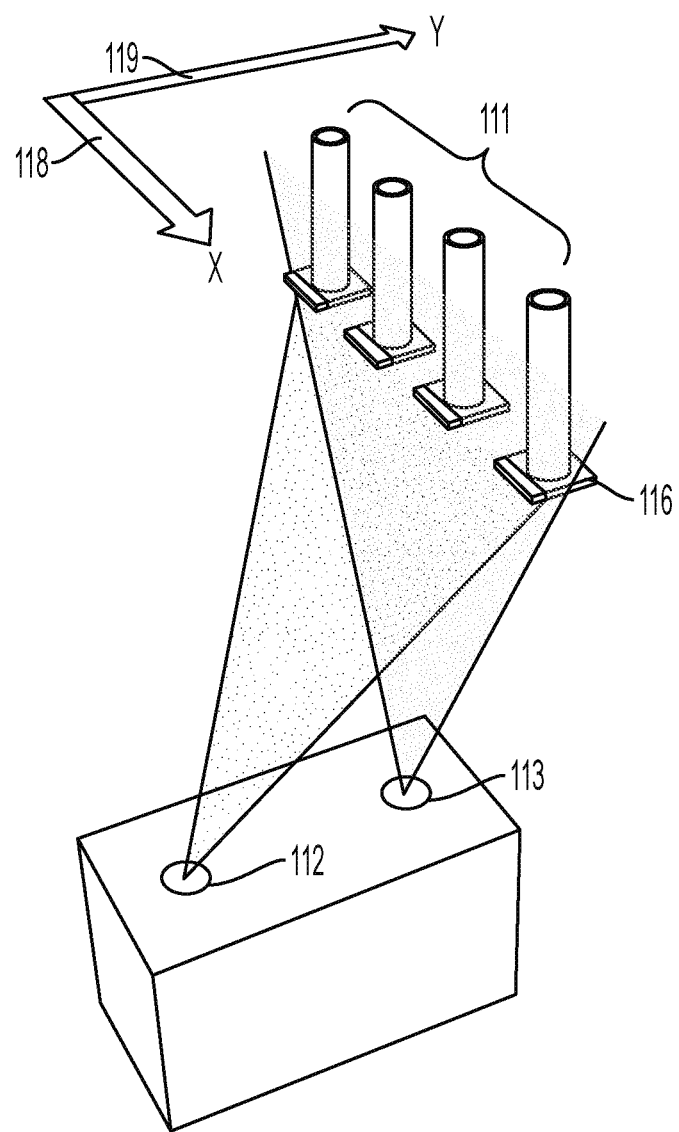
FIG. 41 is a block diagram of an example up-pointing LASER scanning system for scanning the underside of devices held by pickers during transport through a test system.

The test system may require placement of DUTs into test sockets and/or tray cells at a precision measured in single-digit microns, double-digit microns, triple-digit microns, or at any other appropriate precision. Placement at such precisions may require knowledge of how the DUT is being held by the picker prior to placement. To this end, the test system may include one or more (in this example, two) 3D LASER scanners 112, 113 mounted underneath pickers 111 and pointing upwards towards pickers 111, as shown in FIG. 41. The 3D LASER scanners are up-pointing in the example of FIG. 41, meaning that they point upwards towards the bottom of pickers 111 and, therefore, capture the underside of each DUT 116 held by the pickers. In FIG. 41, a LASER source scans pickers 111 holding the DUTs during movement along gantry beam 108 (X direction 118) and/or during movement of gantry beam 108 (Y direction 119). The up-pointing 3D LASER scanner(s) may be mounted on fixed brackets and may capture 3D data that forms a 3D point cloud representation of a DUT being held in a picker that itself is mounted on motorized axes. In an example, the 3D LASER scanners capture 3D data representing X, Y, Z coordinates and roll, pitch, and yaw information of a DUT being held by the picker nozzle before the DUT is placed into a test socket. The resulting data is sent to the control system, which generates a 3D point cloud based on the data. The control system uses the 3D point cloud, together with information about the locations of the test sockets, to control operation of the pickers to place the DUTs in the test sockets. For example, the control system may use the locations of the test sockets and the DUT X, Y, Z coordinates and roll, pitch, and yaw information to adjust the locations of the pickers accordingly, either through movement of the gantry beam, along the gantry beam, or using the Y-axis jog described previously. In some implementations, the control system uses the 3D point cloud, together with information about the locations of the test sockets, to control operation of the pickers to place the DUTs in tray cells.

The control system may use 3D data from both of the one or more up-pointing 3D LASER scanners 112, 113 and the one or more down-pointing 3D cameras of FIG. 40 to control the gantry and to control the pickers place DUTs into appropriate test sockets. The control system may use 3D data from both the one or more up-pointing 3D LASER scanners 112, 113 and the one or more down-pointing 3D LASER scanners to control the gantry and to control the pickers place DUTs into appropriate test sockets. For example, the 3D data from the down-pointing 3D scanners or cameras may represent information about the location, configuration, size, and other attributes of a target test socket, as described herein. The 3D data from the up-pointing 3D scanners may represent information about the location and orientation of a DUT on a picker. The control system may receive both sets of 3D data from the two 3D scanners and control placement of the DUT into the target test socket based on the two sets of 3D data.

Figure 42:
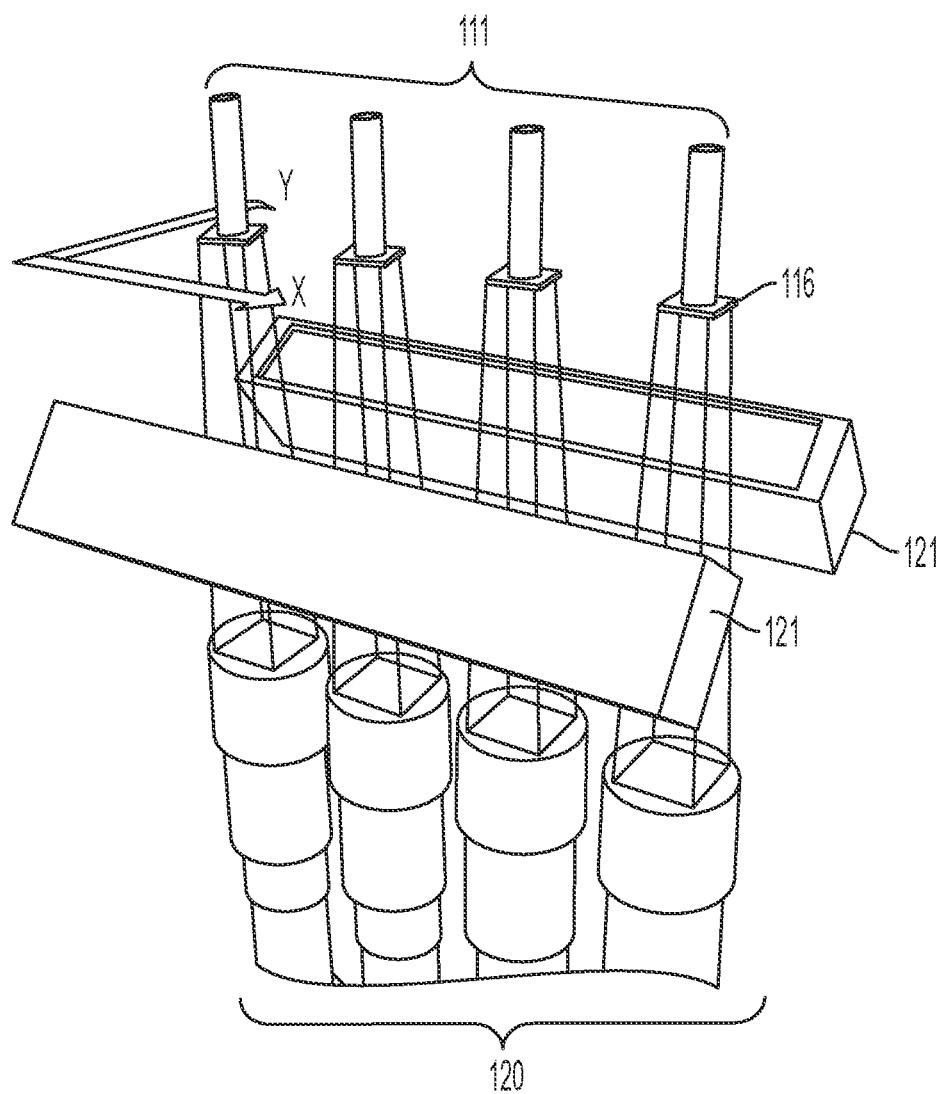
FIG. 42 is a block diagram of an example up-pointing camera system for capturing images of the underside of devices held by pickers during transport through a test system.

Referring to FIG. 42, in some implementations, test system 80 includes an array 120 of cameras, which may be 3D cameras or 2D cameras, mounted underneath the pickers 111. The cameras are up-pointing, meaning that they point upwards towards the bottom of pickers 111 and, therefore, capture the underside of each DUT such as DUT 116 held by the pickers. Each time the pickers move to place a DUT in a test socket, the gantry and pickers may be moved over the cameras 120 for image capture. In this example, strobe lights 121 are mounted on either side of the cameras and pickers. The strobe lights are configured to flash or illuminate at least the underside of the pickers to enable cameras 120 to capture images of the DUTs held by the pickers. An example implementation of cameras 120 and strobe lights 121 is also shown in FIG. 14 and the related figures, there labeled as cameras 122 and strobe lights 123. Illuminating the underside of the pickers in the manner described enables cameras 120 to capture images of the DUTs before the DUTS are placed into the test sockets (or, in some examples, into the trays). Data captured by cameras 120 may be sent to the control system. The control system is configured to process that data to determine the position and orientation of a DUT held by the picker or of each DUT held by each picker. The control system may use the position and orientation of the DUT obtained by the up-pointing cameras in combination with, or independently of, the data obtained by the up-pointing 3D LASER scanner to adjust the locations of the pickers during placement of DUTs, either through movement of the gantry beam, movement along the gantry beam, or using the Y-axis jog described previously. The control system may use the position and orientation of the DUT obtained by the up-pointing cameras in combination with, or independently of, the data obtained by the down-pointing 3D LASER scanner(s) to adjust the locations of the pickers during placement of DUTs, either through movement of the gantry or along the gantry beam or using the Y-axis jog described previously. The control system may use the position and orientation of the DUT obtained by the up-pointing cameras in combination with, or independently of, the data obtained by the down-pointing 3D camera(s) to adjust the locations of the pickers during placement of DUTs, either through movement of the gantry, movement along the gantry beam, or using the Y-axis jog described previously.

Cameras 120 may enable picture taking on-the-fly, for example, in real-time. For example, after picking a DUT and before placing the DUT into a test socket, the DUT's precise position and orientation in the picker may be determined. In order to improve or to maximize throughput, after the DUT has been picked from a tray, the gantry beam may move at full speed towards the up-pointing cameras 120 but slow down as the gantry approaches the up-pointing cameras. The DUT picker will then move at a reduced speed and, in some implementations a constant speed, above the up-pointing cameras 120. Light from strobe lights 121 captures a freeze-frame of the underside of the DUTs held by the pickers and the control system processes data representing those images to calculate the desired information.

As noted, strobe lights 121 are arranged and controlled to flash light while pickers holding DUTs are moving at a velocity that is constant or substantially constant—for example, less than 1%, 5%, or 10% deviation from a prescribed velocity. The number of pickers in the test system may be based on a desired maximum throughput. Similarly, the up-pointing cameras may vary in number. In some implementations, there may be a single up-pointing camera. In some implementations, there may be the same number of up-pointing cameras as the number of pickers, as shown in FIG. 42. In examples where there is only one up-pointing camera, each picker holding a DUT is controlled to move in the X-dimension to pass over the camera sequentially one-by-one. The strobe lights 121 flash for each image taken and the camera captures the images sequentially. In this case, the gantry to which all of the pickers are attached does not continue its travel towards the target sockets until all the images have been captured. In the example where there is a same number of up-pointing cameras as the number of pickers, the cameras operate in parallel to capture all images at the same time and the strobe operates once. In some examples, there may be multiple cameras but not one per picker. In that case, the pickers, the cameras, and the strobe may be controlled to capture images using a combination of sequential and parallel image captures. By having one up-looking camera for each picker, test system throughput can be increased. By contrast, fewer cameras may lower the cost of the test system.

All or some of the cameras in the vision system may be positioned on independent servo axes to expand their depths of field. For example, each camera or its lens may be positioned on an independent servo axis and controlled independently to move towards or away from its target for image capture—in the examples described herein, that is in the Z-dimension. In this regard, in some implementations, camera and lens combination used in the test system may have a shallow depth of field. The height of the camera's target can change based on DUT thickness and general variations of a plane containing the test sockets. In order to bring the target into focus, each camera may be mounted on a motorized axis that is controllable through servo control to position the camera's lens relative to its target. This type of control also enables the system to support DUTs having different heights or thicknesses.

Figure 43:
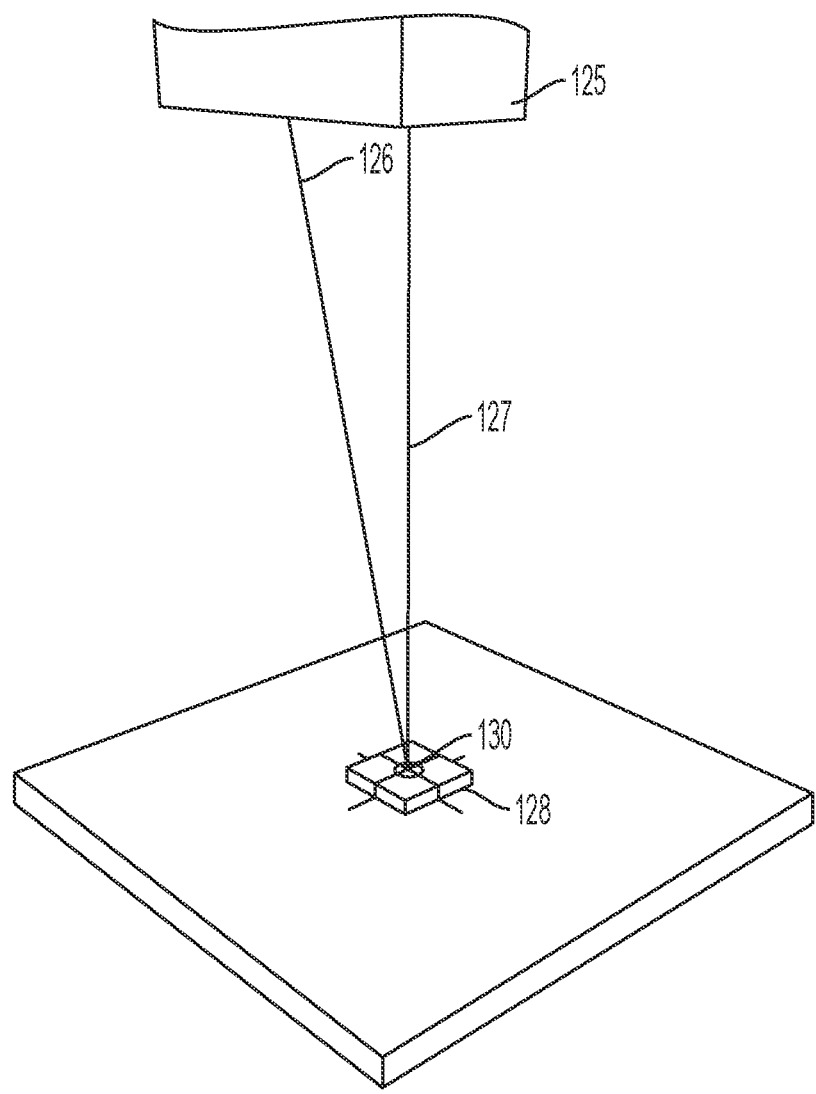
FIG. 43 is a block diagram of an example one-dimensional LASER range finder scanning a device to obtain data used to determine the device's position in a test socket.
Figure 44:
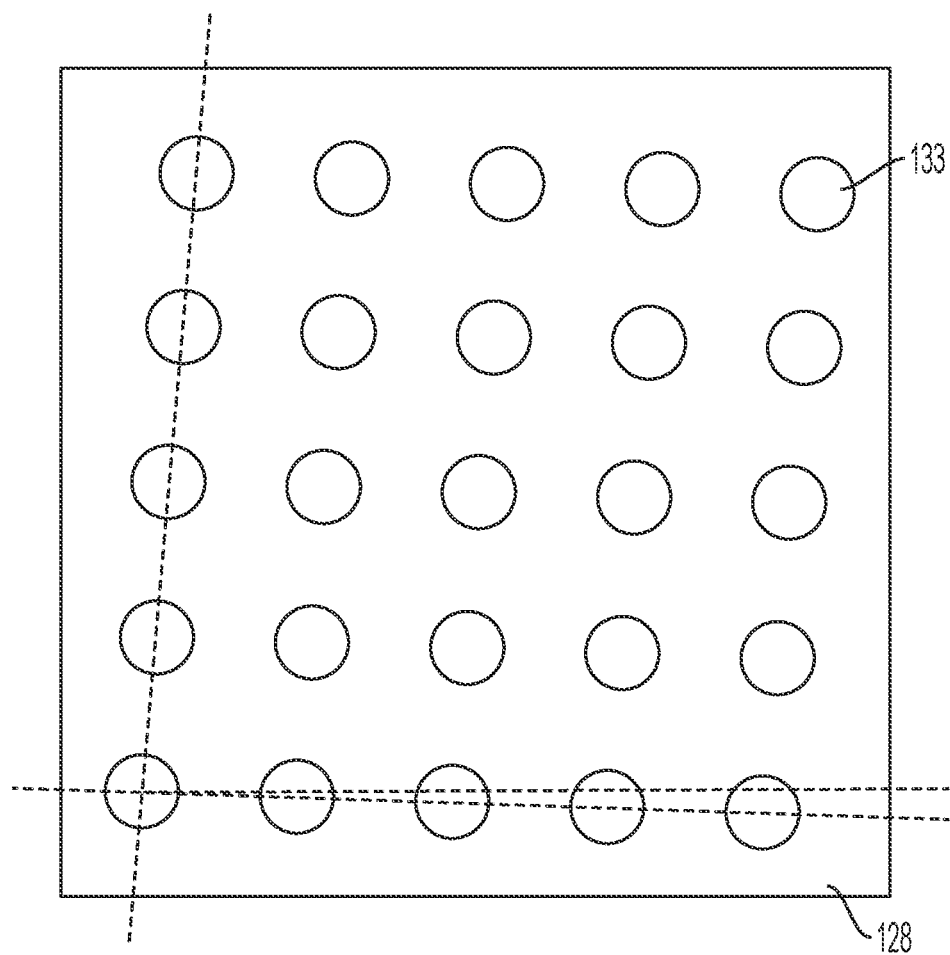
FIG. 44 is a top view showing example scan locations of a one-dimensional LASER range finder on a device in a test socket.

Referring to FIG. 43, to reduce the chances of damage to a DUT or the test system, the vision system employs one or more 1D LASER range finders 125 to determine whether the DUT has been placed properly in the test socket. Each LASER range finder may be mounted to a picker assembly such as picker 101 of FIG. 40 and may operate in the manner described herein. An example LASER range finder 125 is downward-pointing and controllable to direct one or more (in this example, two) LASER beams 126, 127 to the DUT 128 in the test socket. Using these LASER beams, the LASER range finder detects a vertical distance from the output of the LASER range finder to a point 130 on DUT 128. The LASER range finder is operated across a surface of the DUT to detect distances to an array 133 of points on DUT 128, as shown in FIG. 44 for example. Data representing the distance to each point is sent to the control system. The control system processes the data to determine a plane defined by the points. The data may represent an orientation and a position of the plane in 3D (e.g., XYZ) space). The plane constitutes a representation of the plane of the top of the DUT in the test socket. The control system may be configured to compare this plane to an expected position of the DUT in the test socket. The decision of whether or not to press the actuator down onto the DUT may be altered if the DUT position deviates from an acceptable position by too much. For example, if the result of the comparison is that the DUT is not in its expected position, or it deviates from its expected position by more than a predefined amount, such as 1%, 2%, or 3% in any dimension, then the control system may determine that the DUT is not positioned properly in the test socket. The control system may then prevent placement of the lid over the test socket and control the pickers and the gantry to move to the test socket containing the DUT, to remove the DUT from the test socket before a lid is placed over the DUT, and to replace the DUT in the test socket. In some implementation, the DUT may be placed back in a tray. If the result of the comparison is that the DUT is in its expected position, or it deviates from its expected position by less than an acceptable predefined amount, such as 1%, 2%, or 3% in any dimension, then the control system may control placement of a lid over the test socket and force the lid downwards as described herein. The LASER range finder may be configured to perform its measurements during approach of the gantry to a target test site or departure of the gantry from the target test site and, therefore, may not require additional gantry cycle time. That is, the LASER range finder may be configured to detect distances to the DUT placed into the socket concurrent to movement of the gantry before or after placement of the DUT into the socket.

As indicated above, the LASER range finder makes its determination before a lid is placed over the DUT in the test socket. Furthermore, as noted, operations performed by the LASER range finder may occur in parallel with—for example, concurrently with or at the same time as—the gantry moves the pickers to a next set of test sockets. Operation in this manner may result in negligible or no effect on throughput.

Figure 45:
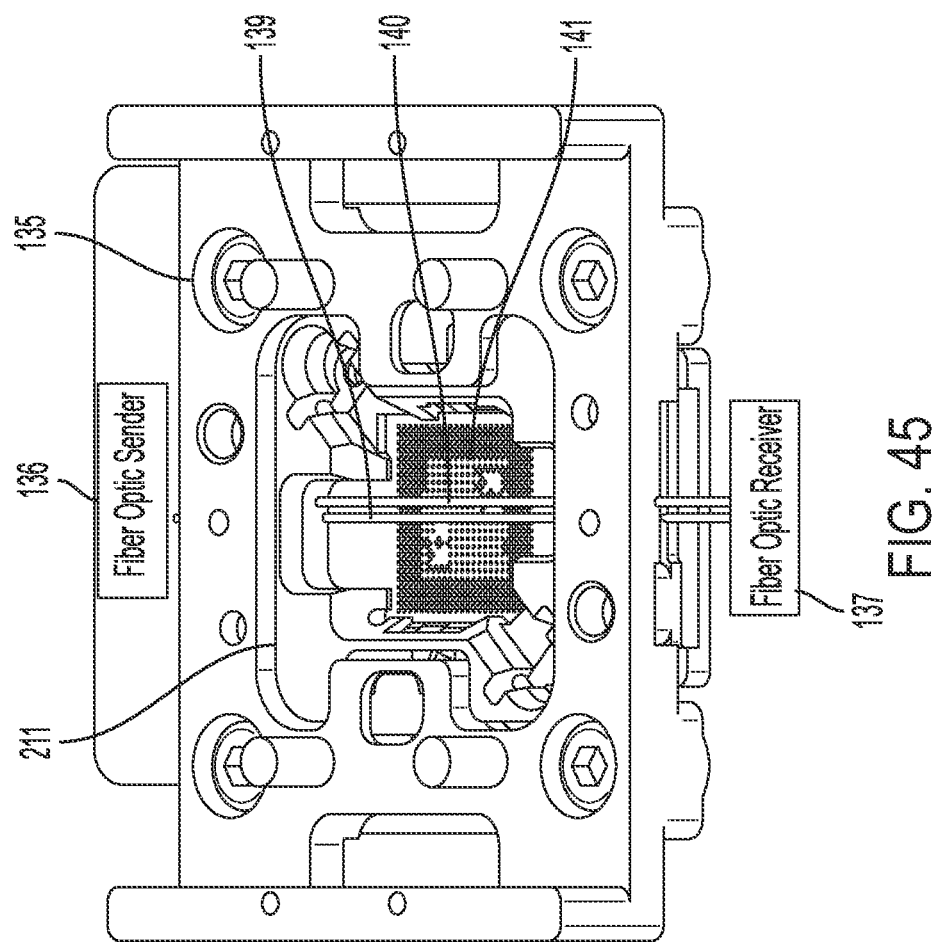
FIG. 45 is a perspective view of an example test socket containing two through-socket LASER beams for determining device presence and position.

Referring to FIG. 45, in some implementations, a test socket 135 of test system 80 may include internal LASER beams to detect a position of the DUT in the test socket. For example, test socket 135 may include a fiber optic sender 136 to output one or more (in this example, two) LASER beams across the test socket and a fiber optic receiver 135 to receive the LASER beam(s) output by the fiber optic sender. In this example, the fiber optic sender outputs two different LASER beams 139 and 140 at different heights—for example at 0.35 mm above base 141 of the test socket and at 0.85 mm above base 141. The fiber optic sender and the fiber optic receiver send data to the control system reporting their operational states. If the control system determines that the fiber optic sender is outputting a LASER beam 139 at 0.35 mm above base 141 and that the fiber optic receiver is not receiving that LASER beam, the control system infers that there is a DUT in the socket blocking the LASER beam. The control system thereby determines that the DUT is in the socket. The different LASER beams may also be used to determine the position of the DUT in the socket. For example in some implementations, the through-socket LASER beam 140 located at 0.85 mm above base 141 may be used to detect a DUT that is not in plane with the socket, and therefore, detect a crooked or misplaced DUT. For example, the control system may know the dimensions of the DUT and the socket. Based on this information, the control system may know that both LASER beams should be blocked by the DUT. If only one LASER beam is blocked—for example, if the fiber optic receiver reports receiving LASER beam 140 but not LASER beam 139—the control system may determine that the DUT is not placed properly in the test socket. The control system may then control the pickers and the gantry to move to the test socket containing the DUT, to remove the DUT from the test socket before a lid is placed over the DUT, and to replace the DUT in the test socket.

Referring to FIG. 46, in some implementations, the vision system includes a 3D LASER scanner 144 that is down-pointing, meaning that it is configured to scan surfaces and objects below it. FIG. 46 shows a single 3D LASER scanner 144 scanning a single tray 148 in the Y-dimension 149; however, the test system may contain multiple such 3D scanners (for example, one 3D scanner per tray) or a single 3D scanner may scan multiple trays simultaneously. The 3D LASER scanner 144 is configured to scan across a tray 148 comprised of cells holding DUTs to be tested and DUTs that have been tested. The scanning may be performed to determine which cells in the tray contain devices, which do not, and whether devices are placed properly in their respective cells. The down-pointing 3D scanner may be mounted on one or more motorized axes and may capture 3D data that forms a 3D point cloud representation of the tray and cells. This data may be sent to the control system in the manner described previously. The control system may be configured—for example, programmed—to process the 3D data to identify which cells in the tray contain devices and which do not. For cells in the tray that contain devices, the control system may be programmed to determine whether those devices are correctly positioned, e.g., at a prescribed orientation, in their respective cells. In some implementations, the control system may be configured to determine the roll and pitch of a plane representing some or all of a tray and the average height of devices in the tray. The control system may be configured to process the 3D data to determine the X, Y, and Z coordinates of, and yaw information for, a cell containing a device by taking into account the known structure of the cell, such as its four corners. The X, Y, Z coordinates and yaw information may be used by the control system to control the pickers. For example, the 3D data may identify a location of a tray cell containing a device and a position of the device in that cell. The control system may compare this information to expected locations of the test socket and/or the device, and adjust the locations of the pickers accordingly, either through movement of or along the gantry beam or using the Y-axis jog described previously. In some implementations, the pickers may be adjusted in this manner during or prior to testing operations. In some implementations, a 3D camera may be substituted for 3D LASER scanner 144.

Figure 47:
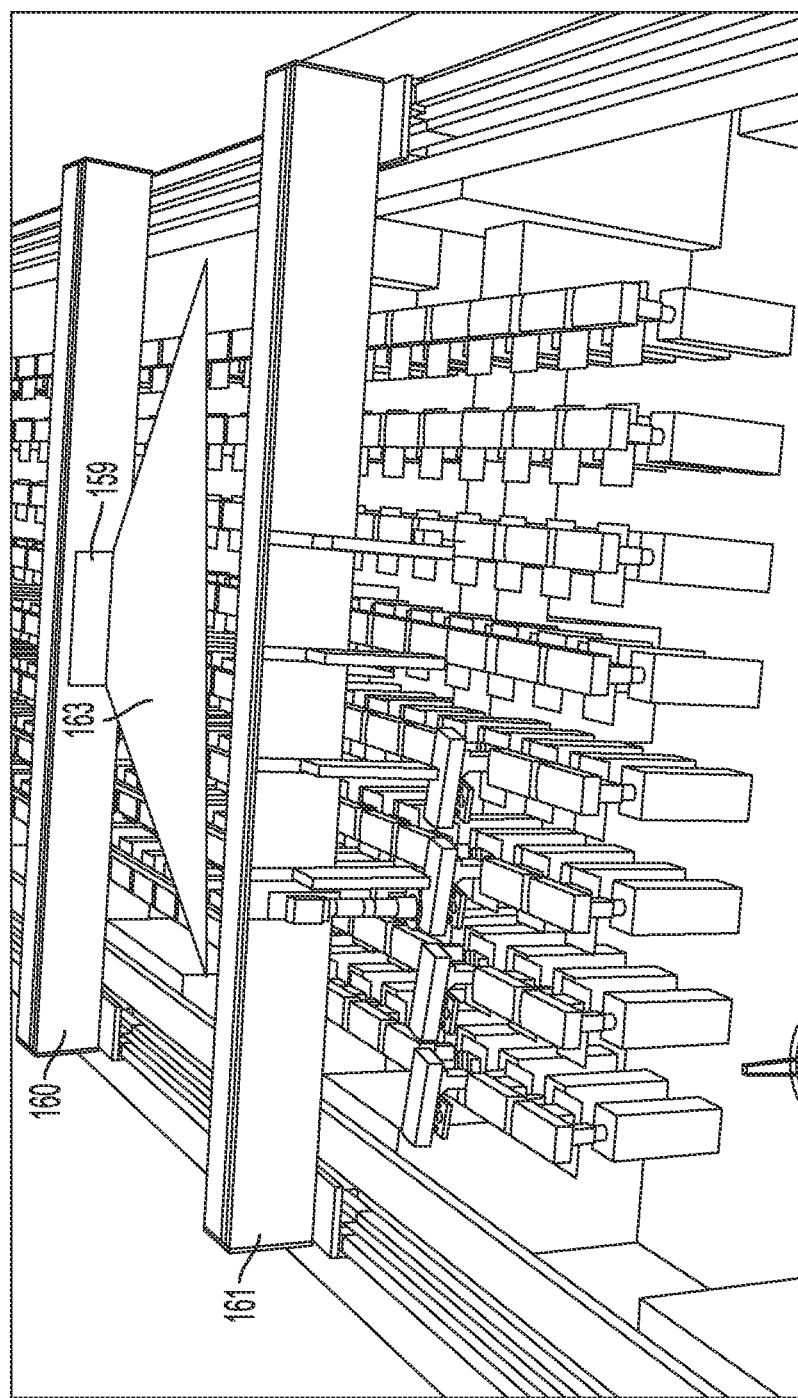
FIG. 47 is a perspective view of an example in-situ test socket LASER cleaning system that may be include in the test systems described herein.

The test system may include a permanently mounted LASER cleaner system on an auxiliary gantry. For example, as shown in FIG. 47, a LASER cleaning head assembly 159 configured with vacuum debris extraction may be attached to a separate automated gantry 160 built onto the same bearing system supporting a main gantry beam 161, which may have the same configuration and operation as gantry beam 21 of FIG. 3 or gantry beam 32 of FIGS. 4 to 28. The LASER cleaner system is controllable to, and configured to, clean the test sockets inside the test system without removing the test sites or packs from the system frame. The auxiliary gantry and LASER cleaning assembly held thereon may be controlled by the control system and configured to move the LASER cleaning assembly relative to the test sockets in order to clean the test sockets using one or more LASER beams 163. Debris loosened or broken-away by the LASER beams may be suctioned-up using a vacuum also mounted on the auxiliary gantry. In some examples, cleaning on some test sockets may be performed while testing is performed on other test sockets and while the main gantry services test sockets that are not currently being cleaned.

As described previously such as with respect to FIGS. 4 and 28, each test site includes a lid that covers a DUT in the test socket and that holds the DUT in the test socket. Referring to FIGS. 48 to 61, an example test site includes a lid 166 for the test socket 165 and an actuator 167 configured to force the lid onto, and hold the lid on, the test socket and to remove the lid from the test socket. Actuator 167 includes an upper arm 168 to move the lid; an attachment mechanism 175 (see FIG. 52) connected to upper arm 168 to contact lid 166; and a lower arm 170 to connect and to anchor actuator 167 to a test site circuit board 171 containing test socket 165.

In an example configuration, the test system includes actuator 167 having an upper arm 168 configured to move vertically in the Z-dimension towards and away from socket 165. The actuator is configured to move a lid onto the test socket and to move the lid off the socket so that the pickers have clear access to the DUT and test socket. A lid assembly or simply "lid" is configured for the specific socket application in terms of DUT size and thickness, whether the DUT is configured for top testing, and any DUT-specific heating or cooling requirements An attachment mechanism, which may be considered part of or separate from the lid, includes a stop plate that abuts the socket frame when the lid is full engaged with the test socket to establish a precision Z-dimension (or vertical) reference. The lid includes springs that are compressible to provide precise forces to the device in the socket even if there is fluctuation in force applied by the actuator. The lid includes a cap that contacts the device. This cap is aligned to the socket via alignment pins that also align to thermal control components in the lid. The thermal components are described in more detail below and may include passive heat sinks or active components such as a liquid cooled plate, a thermoelectric cooler (TEC), and/or electric heating elements. The test socket may also include temperature one or more sensors to monitor the temperature of the components. The test socket may also include one or more temperature sensors to monitor the temperature of the test socket or the test site containing the test socket.

The upper arm holds the socket lid. The dimensions of this upper arm can be configured based on the dimensions of a specific device to test—e.g., an application board—to provide appropriate reach. Between the upper arm and the lid is an attachment mechanism 175 that allows the lid to float, ensuring compliance between the lid and arm and accurate alignment between the lid and test socket. This attachment mechanism may include springs and centering features so as to return the lid assembly to a center of its floating range. The upper arm also contains features to support any cables or wires required for thermal control components or other test features such as radio frequency (RF) probing to a top of a device. The lower arm is configured to attach the assembly to another structure, here the customer test site board containing the test socket 165. The lower arm also supports an end-user test site board and a support spider that connects the board to the arm.

Figure 48:
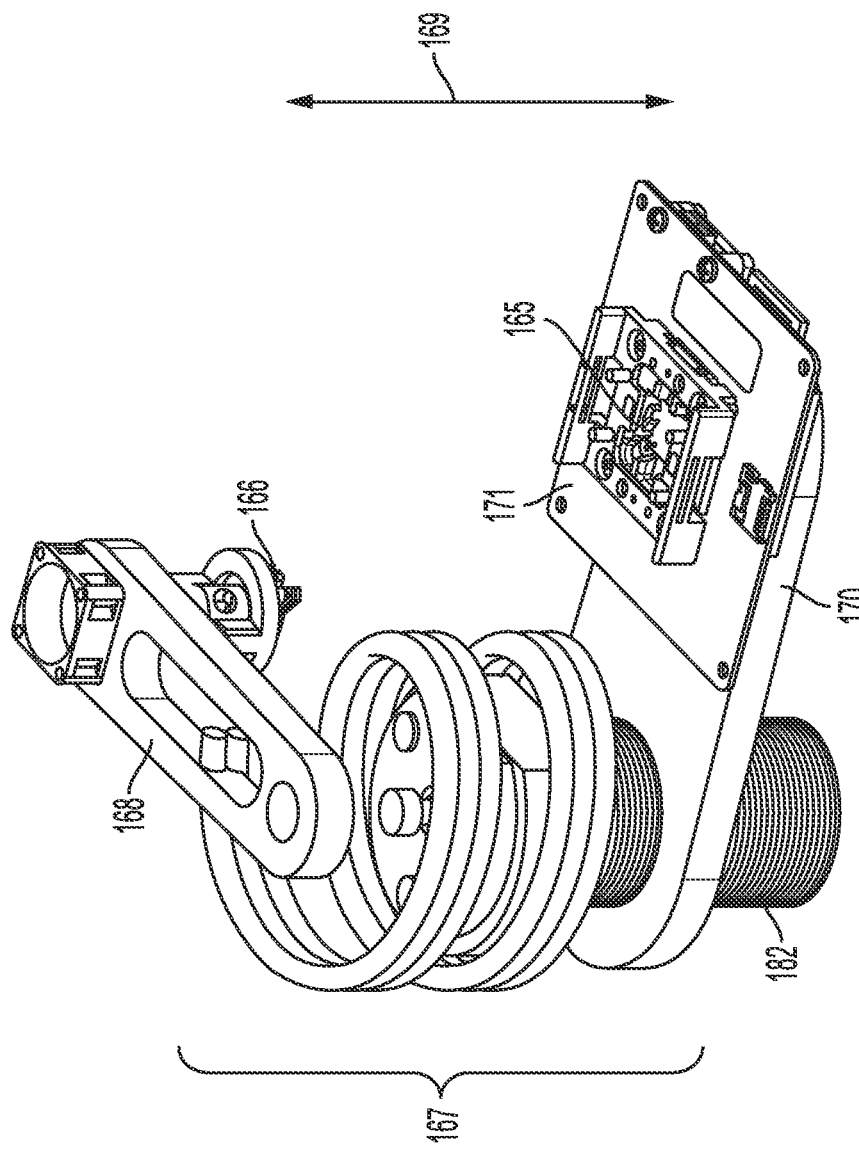
FIG. 48 is a perspective view of components of an example test site including an actuator and a lid, with the actuator moved away to expose the test site.
Figure 49:
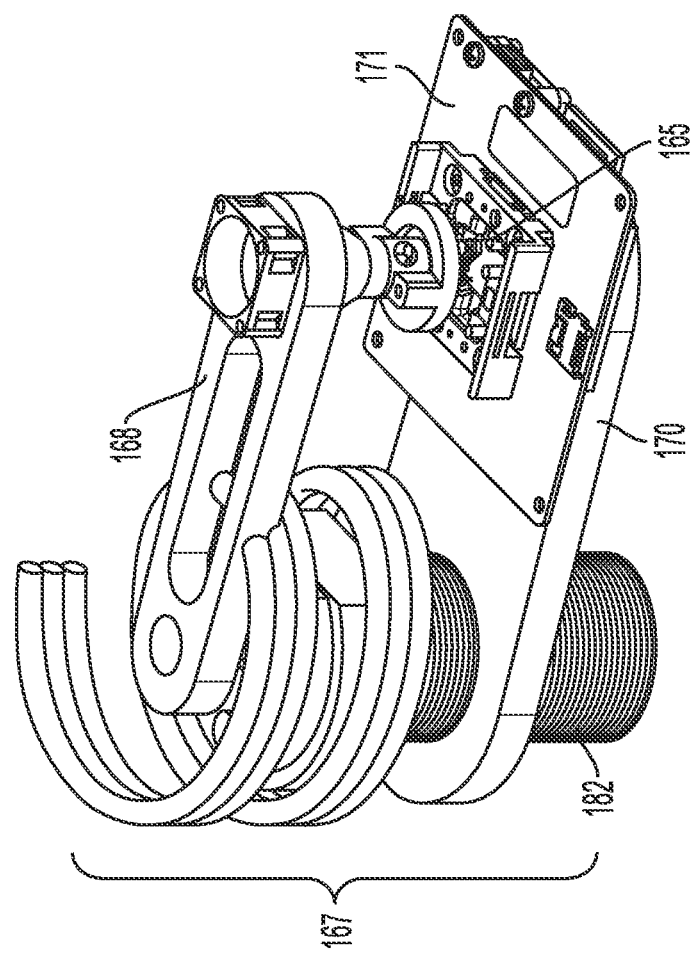
FIGS. 49 and 50 are perspective and side views, respectively, of components of an example test site including an actuator and a lid, with the actuator holding the lid on the test socket.
Figure 50:
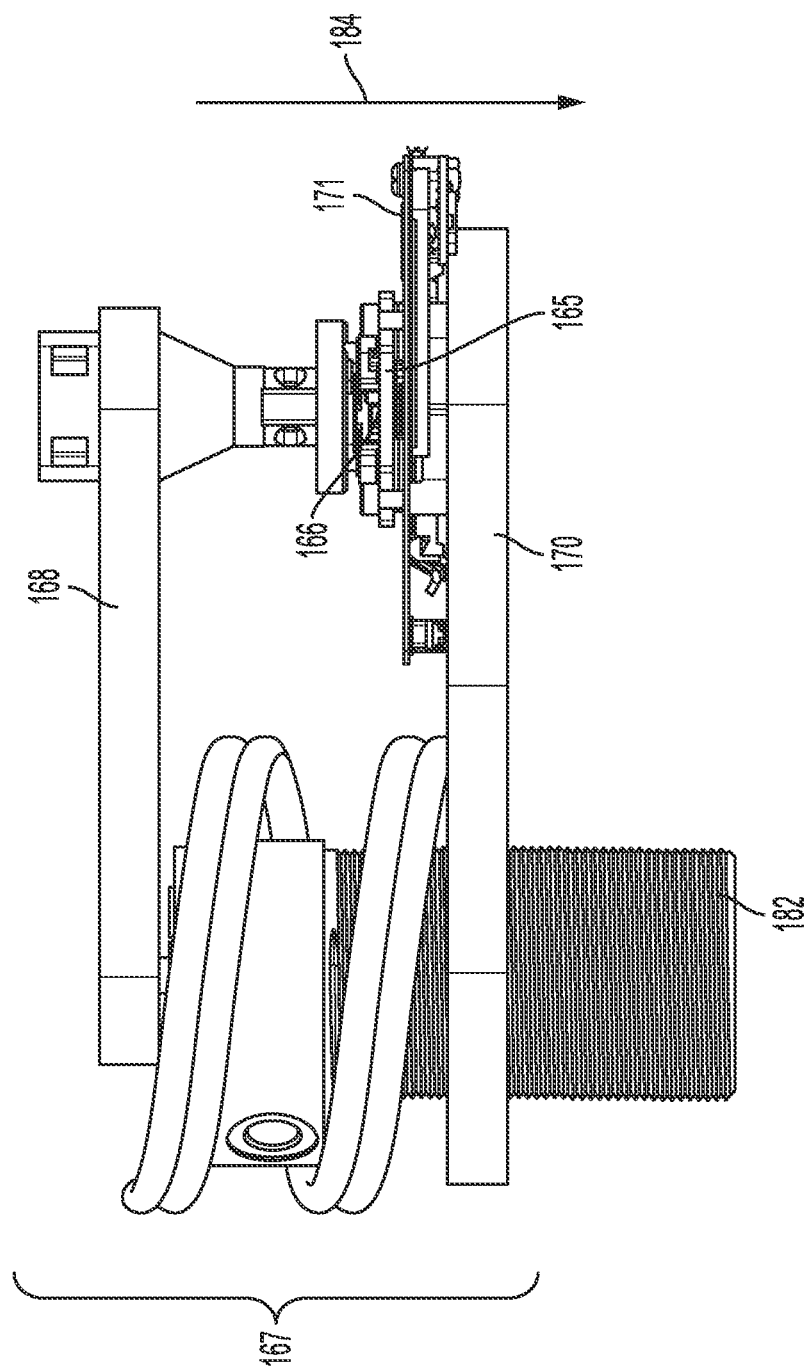

As shown in FIG. 48, upper arm 168 is configured and controllable by the control system to rotate away from test socket 165 to expose test socket 165 or a device contained therein. This exposure allows a picker to access the test socket either to place a device into the test socket for testing or to pick-up a device from the test socket. After a device has been placed into the test socket 165, upper arm 168 is configured and controllable by the control system to rotate towards the test socket to place lid 166 over the test socket, as shown in FIGS. 49 and 50. As shown in FIGS. 48 to 50, screw 182 is configured and arranged to enable the rotation of the upper arm.

Attachment mechanism 175 (FIG. 52) is configured to allow the lid to float relative to test socket 165 to enable precision alignment between the lid and the test socket. That is, the attachment mechanism is configured to move the lid into contact with the device in the test socket. The lid floats in the sense that, following contact with the device in the test socket, little or no downward pressure is applied to the lid allowing the lid to move, at least slightly, in one or more dimensions relative to the device in the test socket. For example, the lid may be permitted float in three, four, five, or six degrees of freedom relative to the test socket, where the six degrees of freedom include forward-backward movement (Y dimension), left-right movement (X dimension), up-down movement (Z dimension), pitch, yaw, and roll. In some examples, the amount of movement permitted during floating may be measured in single-digit microns, double-digit microns, or triple-digit microns (single-digit millimeters); however, other amounts of movement may be enabled. The floating allows the lid to settle over the test socket relative to the device therein and may reduce the chances of damage when the lid is forced onto the test socket as shown in FIGS. 49 and 50. In this regard, in some implementations, upper arm 168 may be configured and controllable to rotate slightly following contact between the lid and the test socket to promote settling.

As explained previously, actuator 167 is configured and controllable by the control system to force the lid into the test socket. That is, after the lid is over the device in the test socket and has settled in place, the actuator applies downward force in the Z-dimension in the direction of arrow 184 (FIG. 50) to force the lid onto the test socket so that the lid stays in place and is resistant to movement, during testing. Lower arm 170 anchors actuator 167 to a circuit board 171 containing test socket 165, as shown in FIG. 50. Downward force applied by the upper arm forces lid 166 onto the test socket and device. There the lid may be held until testing on the device in the test socket is completed. Afterwards, the lid may be removed to expose the tested device.

Figure 52:
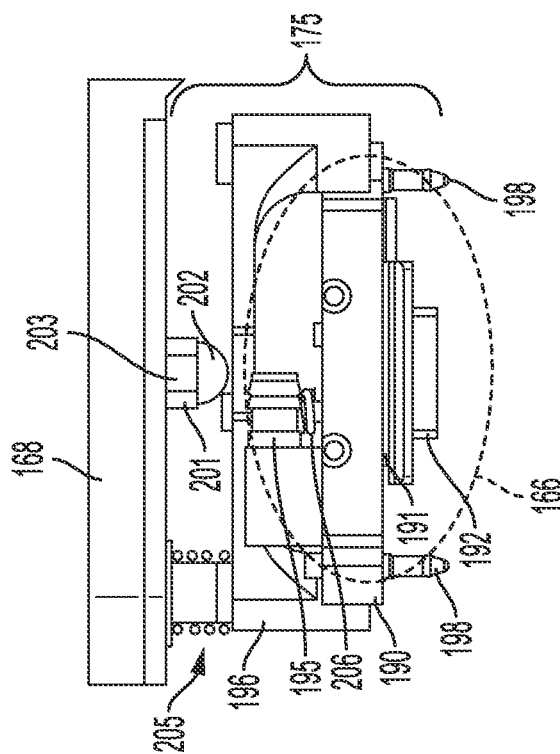
FIG. 52 is a cut-away side view of a test socket lid, an attachment mechanism to the test socket lid, and part of the actuator's upper arm.
Figure 51:
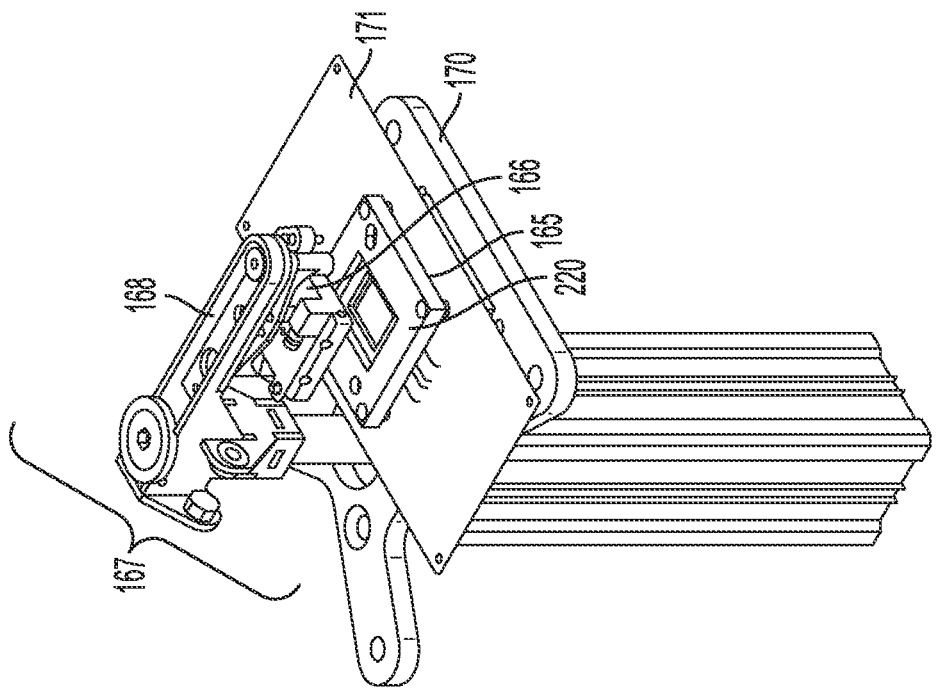
FIG. 51 is a perspective view of components of an example test site including an actuator and a lid, with the actuator not yet having applied the lid to the test socket.

FIGS. 51 and 52 show an example configuration of actuator 167 and attachment mechanism 175. More specifically, FIGS. 51 and 52 show actuator 167 including upper arm 168 and lower arm 170. Upper arm 168 includes attachment mechanism 175 and lid 166 for placement over test socket 165. Lower arm 170 anchors the actuator 167 to test site board 171. FIG. 52 shows components of an example attachment mechanism 175 and example lid 166 within the dashed circle. Lid 166 includes a structure such as cold plate 190, a TEC 191, and a cap 192. The cap directly contacts the DUT in the test socket. The cold plate and the TEC are part of a thermal control system for independently and asynchronously controlling the temperature of individual test sockets. A coolant connection 195 transports liquid coolant to the cooling plate. The thermal control system is described in more detail below with respect to FIGS. 63 to 65.

Attachment mechanism 175 includes stop plate 196 configured to abut the test socket frame 220 when the lid is full engaged with the test socket to establish a vertical (or Z-dimension) height reference. The stop plate may be a structure having at least one flat surface in some implementations. When full force is applied to lid 166, as shown in FIG. 57, stop plate 196 contacts the socket frame 220, which prevents or restricts further downward movement of the lid. Alignment 198 pins match, and fit within, corresponding alignment sockets (that is, holes) on the socket plate. In this example, gimbal 201 is an acorn nut comprised of a block having a rounded or semi-spherical tip 202 and a body 203 that is polyhedral in this example. The body connects to upper arm 168 and tip 202 contacts stop plate 196. This arrangement allows the lid to tilt freely about the gimbal in multiple dimensions—for example, to float—relative to the test socket prior to the application of full force to the lid by the actuator. The lid also contains one or more float springs 205 that may be wrapped around corresponding cylinders that are part of, or that contact, the upper arm or the stop plate. For example, float spring 205 is wrapped around a cylinder. Float spring(s) 205 enables the lid to float relative to the test socket prior to the application of force to the lid by the actuator. For example, the float spring allows the lid to tilt freely in multiple dimensions relative to the gimbal while still constraining some motion to maintain connectivity. Lid 166 also includes one or more cap springs such as cap spring 206. Cap spring 206 holds stop plate 196 relative to lid 166 and compresses when force is applied by the actuator.

FIGS. 53 to 57 show a sequence of operations in which example actuator 167 attaches example lid 166 to example test socket 165. In FIG. 53, there is a rough alignment between lid 166 and test socket 165. That is, actuator 157 rotates the lid into position over the test socket such that the alignment pins 198 (only one is visible in the figures) align to, but do not engage, corresponding alignment sockets on test socket 165. Actuator 167 thereafter moves the alignment pin toward the alignment socket. Movement of components of the actuator and lid toward the test socket are shown by dashed arrow 210.

In FIG. 54, lid 166 is finely aligned to the test socket by moving the cap into position over of a complementary portion of the test socket containing a DUT and making any rotational adjustments necessary to ensure that the lid is properly aligned to the DUT and test socket. An example of the complementary portion is within the outline 211 of FIG. 45. Actuator 167 begins moving lid downward toward the test socket so that alignment pin 198 moves into its complementary alignment socket. In FIG. 55, actuator 167 continues to move lid 166 downward and into toward test socket 165 such that its cap contacts a DUT in the test socket, as shown by dashed arrow 212. In FIG. 56, actuator 167 continues to move lid 166 downward and into test socket 165 forcing gimbal 201 against stop plate 196 and causing float spring 205 and cap spring 206 (FIG. 52) to compress. The lid continues to float to support alignment between the lid and the test socket containing the DUT. The cap is forced further into the test socket as shown by dashed arrow 214. In FIG. 57, actuator 167 continues to move lid 166 downward and into test socket 165, as shown by arrow 216. Force applied by actuator 167 against stop plate 196 forces stop plate 196 against the test socket frame 220 as shown by arrow 221, thereby preventing further downward movement. At this point, the lid is firmly over the test socket and not movable in any dimension. The lid no longer floats in other words. The lid may be retained forcibly against the test socket during a duration of DUT testing by the test system.

To remove lid 166 from the test socket, actuator 167 moves in the direction of arrow 217, taking lid 166 with it. Actuator 167 may then rotate upper arm 168 to expose test socket 165 to allow the pickers to access a DUT that has been tested.

Figure 59:
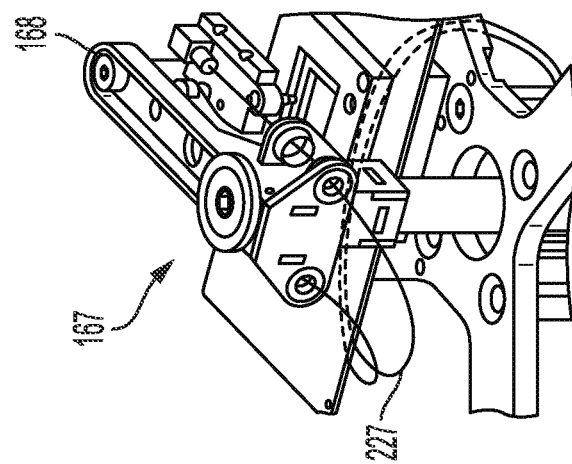
FIG. 59 is a back perspective view of the actuator showing routings for cable and cooling lines to and from the actuator.
Figure 58:
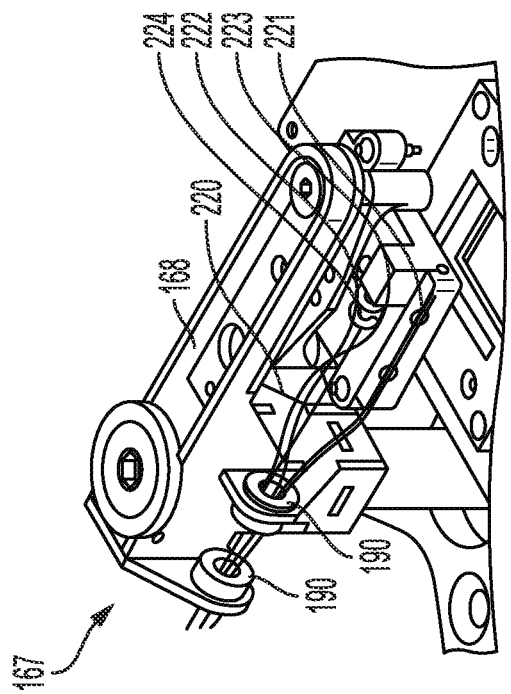
FIG. 58 is a front perspective view of the actuator showing routings for cable and cooling lines to and from the actuator.
Figure 60:
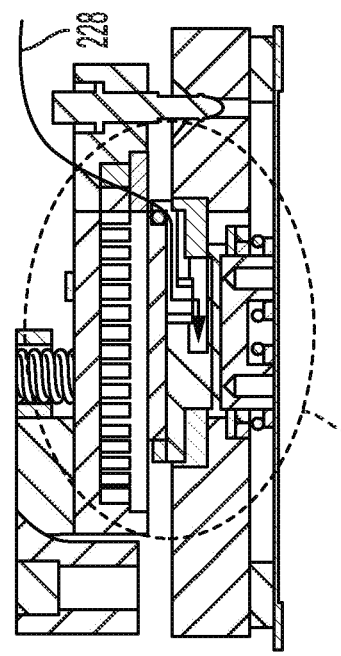
FIG. 60 is a cut-away side view of the lid and part of the test socket showing routing of electrical wiring to temperature sensors on the lid's cap.

FIGS. 58 to 60 show examples of cable and coolant paths through components of actuator 167 and lid 166. FIG. 58 shows cable grommets 190 holding electrical wiring 220 to control operation of TEC 191, electrical wiring 221 to control cartridge heaters on the cold plate 190 (described below), electrical wiring 222, 223 to communicate with upper and lower temperature sensors, respectively on lid 166, and coolant conduits 224 to circulate coolant to and from cold plate 190. FIG. 59 shows a back-perspective view of the actuator and lid shown in FIG. 58. FIG. 58 shows that the length is relatively long and the radius path is relatively large for the wiring and coolant connections 227 described with respect to 58, which produces slack in the wiring and coolant connections that may reduce stress on the wiring and coolant connections during movement of the actuator. FIG. 60 is a cut-away side view of lid 166 showing an example path for electrical wiring 228 to a lower temperature sensor on lid 166.

Figure 61:
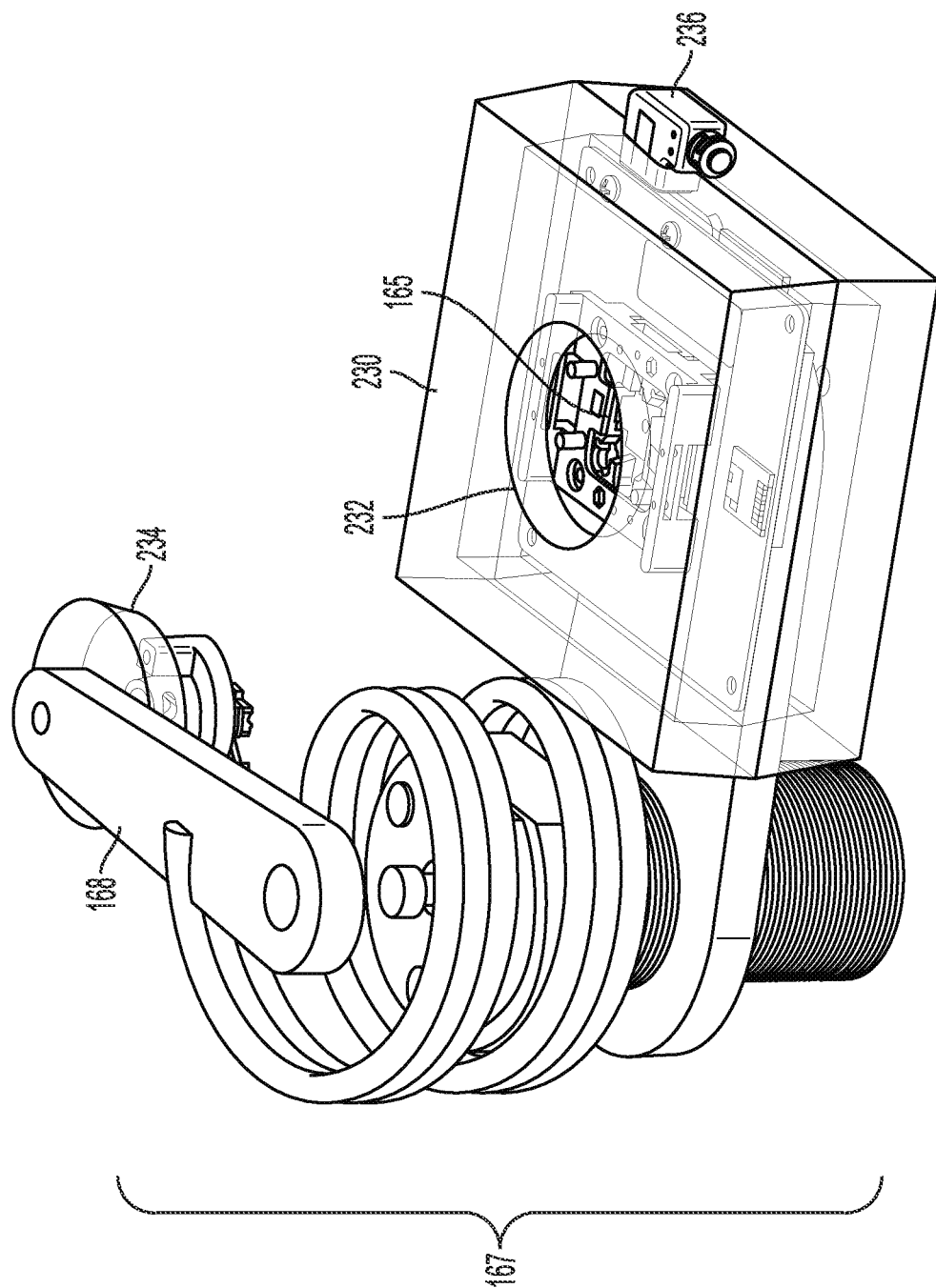
FIG. 61 is a perspective view of an actuator and a test socket containing an enclosure for physically isolating and thermally insulating the test socket during testing.

Referring to FIG. 61, in some implementations, each test socket includes an enclosure 230 to house a test socket 165 and a DUT in test socket 165. The enclosure 230 may provide complete or partial thermal insulation around the test socket and the DUT in the test socket. The enclosure 230 may also provide a complete or partial environmental—for example, a physical or hermetic—seal around the test socket and the DUT in the test socket. The enclosure may be modular and, therefore, removable to support testing with or without the enclosure. The enclosure is also configured to enable contact between cap 192 and the DUT in the test socket and, therefore, to enable thermal communication—for example thermal conduction—between the DUT and the TEC 191 and cold plate 190, as described below. That is, in this example, the cap creates a thermal path between the TEC and the DUT. As shown in FIG. 61, enclosure 230 includes a hole or opening 232, through which a picker can pick-and-place a DUT, and through which actuator 167 can place the test socket lid over the test socket containing the DUT. An enclosure lid or cover may plug the hole, as described below. In some implementations, the enclosure may reduce or minimize power usage when hot and may reduce or prevent condensation when cold.

In some implementations, the control system controls the liquid coolant to keep it at a temperature that is above a dew point temperature of an environment containing the test system. The dew point is a temperature at which air must be cooled to saturate with water vapor. Saturation exists when the air is holding a maximum amount of water vapor possible at a given temperature and pressure. When the temperature is below the dew point, the water vapor in the air is released as liquid water, namely condensation. Keeping the liquid coolant above the dew point temperature may prevent condensation on the coolant transmission conduits, on the lid, and elsewhere in the test system. Example dew points for environmental temperatures include, but are not limited to, indoor air maintained at 20-24.5° C. (68-76° F.) with a 20-60% relative humidity, equivalent to a dew point of 4.0 to 15.5° C. (39 to 60° F.).

In this regard, an enclosure, such as enclosure 230, creates a thermally-insulated and a hermetically-sealed micro-environment around its respective test socket. The dew point temperature within that micro-environment may be managed, for example, by applying vacuum pressure to the enclosure as described in more detail below. In this regard, decreasing the atmospheric pressure within enclosure 230 may decrease the dew point temperature in the micro-environment. In some examples, dry air may be introduced into the enclosure as described in more detail below in order to control the dew point within the micro-environment. The rate of flow of, and/or the type of, the liquid coolant may therefore be controlled—for example, changed or varied—to produce low temperatures in the micro-environment, such as temperatures at or below 0° C. (32° F.), while keeping those temperatures above the lowered dew point temperature of the micro-environment. The combination of managing the dew point temperature in the micro-environment and controlling the type and/or flow rate of the liquid coolant to keep the temperatures produced thereby above the managed dew point temperature enables low-temperature cooling of the DUT in the test socket while reducing or preventing condensation on or around the DUT, on or around the test socket, or on or around other components and/or electronics included within the enclosure. In this regard, in some implementations, the thermal control system is configured to control a temperature of a DUT in a test socket in a range from below 0° C. (32° F.) to over 150° C. (302° F.). Other implementations may perform temperature control over different ranges.

Enclosure 230 may be made of metal, composite, or plastic. Enclosure 230 may thermally insulate a DUT in test socket 165 from all or some other DUTs and/or test sockets in the test system. This insulation, combined with the thermal control system described with respect to FIGS. 63 to 65, enables independent and asynchronous thermal testing of DUTs by the test system. For example, the test system may perform thermal test on DUTs in different test sockets independently of thermal tests performed on other DUTs in other test sockets. For example, the test system may perform two different independent and asynchronous thermal tests on two different DUTs in test sockets in the same pack or in the same row in that pack. For example, the test system may perform two different independent and asynchronous thermal tests on two immediately adjacent DUTs; that is, DUTs in two test sockets that are right next to each other in the same row or column. Also, in connection with the thermal control system described herein, the enclosure enables the test system to independently and asynchronously control the temperature of each individual test socket in the test system. Notably, independent and asynchronous testing is not limited to thermal testing. That is, the test system may perform any appropriate tests, such as electrical or RF tests, on DUTs in different test sockets independently of and asynchronously from other concurrent tests performed by other DUTs in other test sockets.

Actuator 167 also may hold an enclosure lid 234 that fits over and thermally and physically seals hole 230 when the test socket lid is placed over the test socket. In some implementations (not shown in the figures), the bottom half of the enclosure is around the test socket and the upper arm holds the top half of the enclosure and places it over the bottom half while placing the lid over the test socket. The bottom half of the enclosure may include the socket frame with a fitting to connect to purge air or vacuum. The top half of the enclosure may be attached to the cold plate and swing into place with the upper arm. The TEC, the cap, and DUT will be in the enclosure.

In some implementations, enclosure 230 and enclosure lid 234 hermetically seal the test socket and DUT contained therein. For example, the enclosure and lid may physically isolate the test socket and DUT from all or some other test sockets and DUTs in the test system and may create an air-tight region around the test socket and DUT. This isolation and thermal insulation can prevent contaminants from infecting the testing operations and enable precise temperature control. A fitting 236 may be included on enclosure 230. The fitting may include a port to allow access to the enclosure's interior. For example, vacuum pressure or a gas purge may be applied to the port. A vacuum pressure, or vacuum, may include a pressure that is less than local atmospheric pressure and that may be defined as a difference between the local atmospheric pressure and a point at which the pressure is measured. The vacuum may suction air or contaminants from the hermetically-sealed enclosure and may be used to change the dew point within the enclosure, as described previously. A gas purge may include introducing dry air or nitrogen gas into the enclosure either before, after, or during testing. In some implementations, the test system may include one or more supplies of ionized gas, such as ionized air, that may be introduced into the enclosure to reduce to minimize ESD events, as described previously. In some implementations, one or more fans may be configured and arranged move ionized air from the ionized air supply over all or some of the test sockets while the pick-and-place robots are moving devices into and out of the test sockets and during testing. The ionized air may therefore also enter the enclosures while the test sockets are exposed during system operation.

Figure 62:
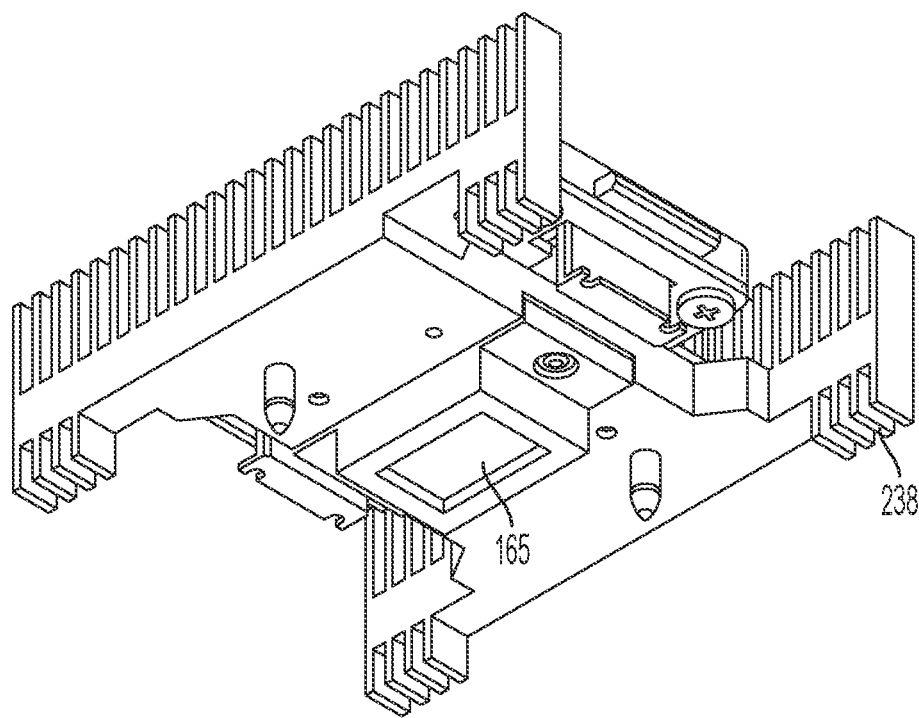
FIG. 62 is perspective view of a component of the test socket for dissipating heat.

Referring to FIG. 62, in some implementations, test socket 165 may include thermally-conductive fins 238 that extend above and below the test socket. The fins may be made of metal or any appropriately thermally conductive material and may facilitate heat dissipation into the environment from the test socket during testing. The fins may be within the enclosure in some implementations.

Figure 63:
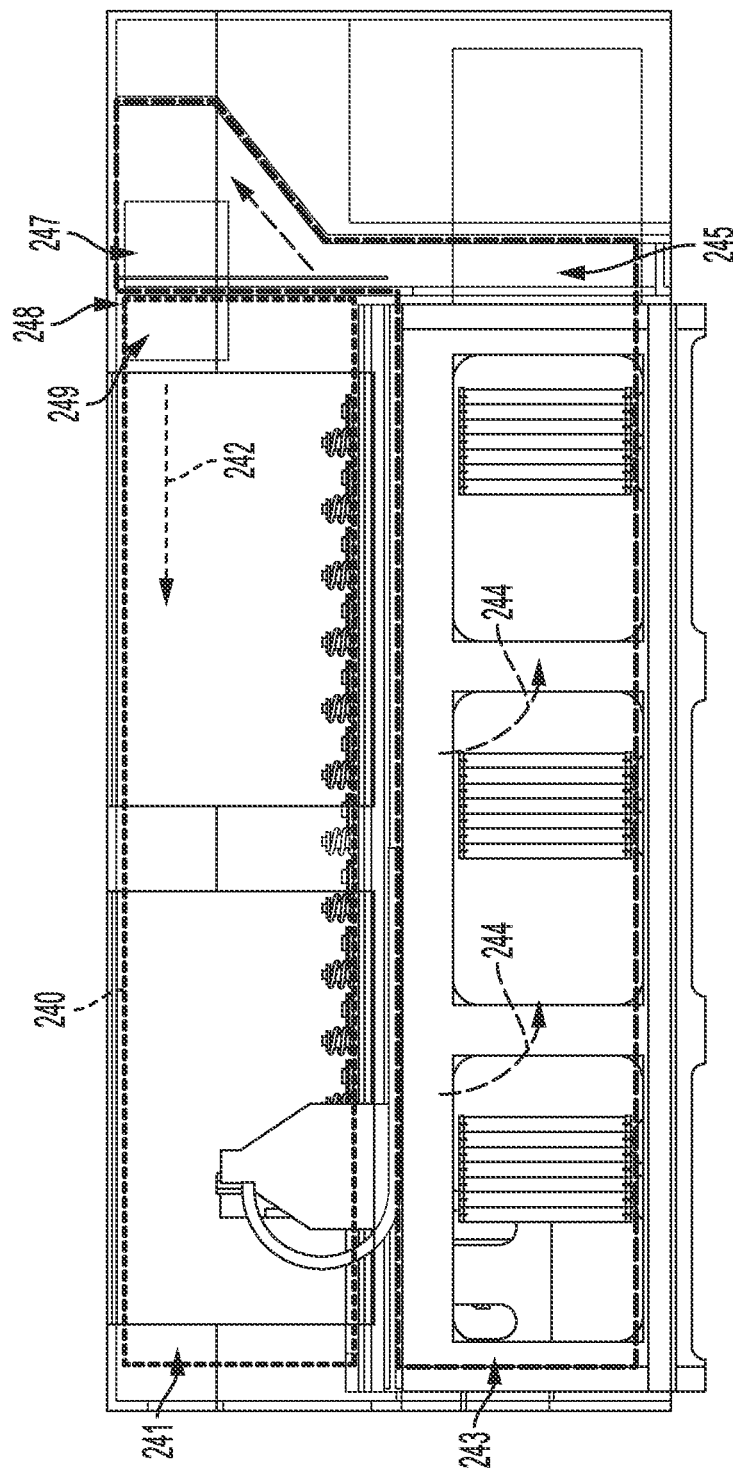
FIG. 63 is cut-away side view of an example test system of the type described herein containing warm and cold atriums and showing air flow between the two.

Referring to FIG. 63, in some implementations, a test system housing 240 defines a cool atrium 241 that houses the test sockets and that is supplied with cooled air (represented by arrow 242) and one or more warm atriums 243 arranged to receive air (represented by arrows 244) from the cool atrium that has been warmed as a result of testing the DUTs. In the example of FIG. 63, there is one different warm atrium for each different pack; however, that need not be the case. Any appropriate number of warm atriums may be included. For example, there may be a single warm atrium. One or more air ducts 245 may be configured to circulate the warm air from the warm atriums to an air-to-liquid heat exchanger 247. The air-to-liquid heat exchanger 247 cools the air to produce the cooled air from the circulated warm air from the atriums. That cooled air may be moved into the cool atrium by one or more fans 248. In some implementations, the air circulation system may include one or more air filters 249 to remove at least some contaminants from the circulating air.

Figure 64:
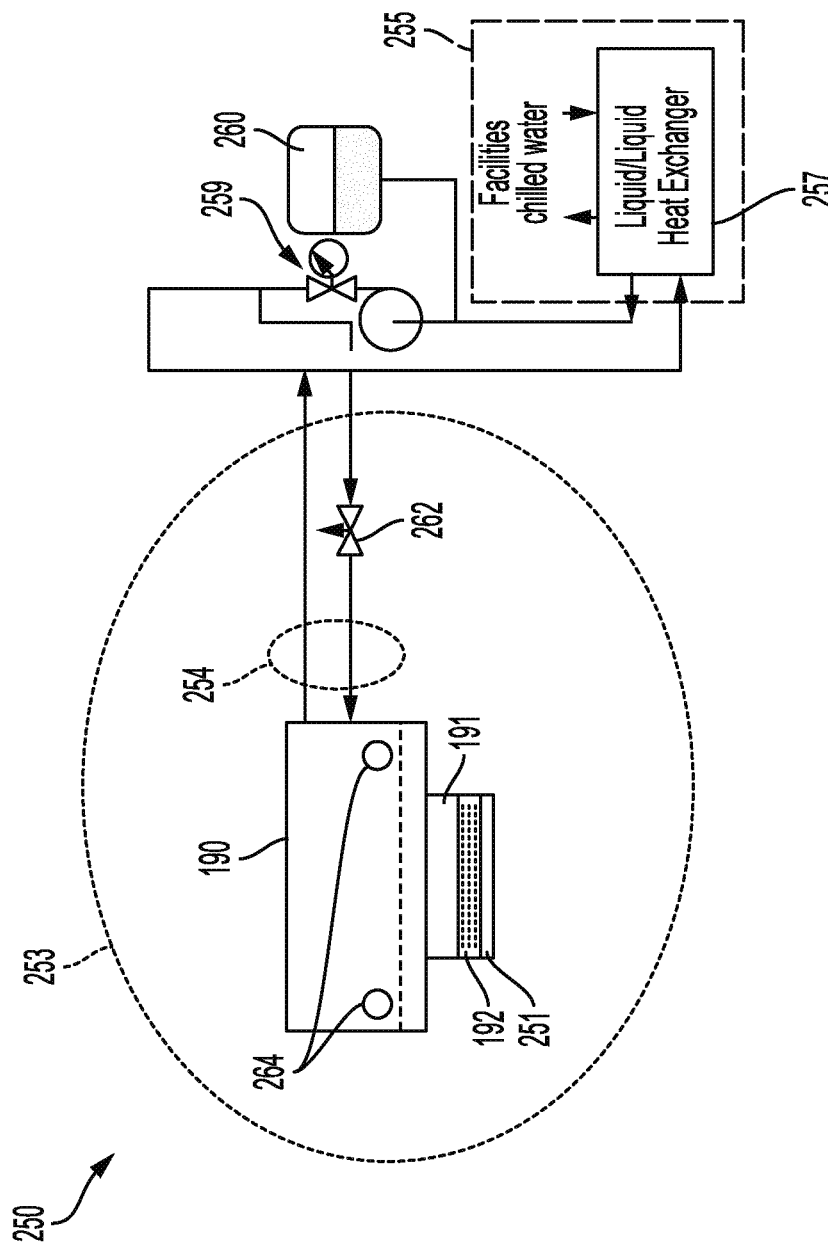
FIG. 64 is a block diagram of components of an example thermal control system for a test site that supports independent and asynchronous testing.

FIG. 64 shows example components 250 that may be included in a thermal control system for the test systems described herein. The example thermal control system includes components 253 that are included at each test site. Those components may be configured to control a temperature of a DUT in a test site separately from control over temperatures of other DUTs in other test sites. The components of FIG. 64 therefore enable and/or contribute to the test system's ability to control the temperature of individual test sockets independently and asynchronously and, therefore, to perform testing, including thermal testing, on DUTs in the test sockets independently and asynchronously.

In FIG. 64, cold plate 190, TEC 191, and cap 192 may be as described with respect to FIG. 52. As shown, TEC 191 is not directly in contact with a DUT 251, but rather is in indirect contact through cap 192. Cap 192 is made of a thermally conductive material such as metal. Accordingly, the indirect contact between the TEC and the DUT through the cap still enables thermal conduction between the TEC and the DUT. The cap thus creates a thermal path between the TEC and the DUT. The resulting thermal conduction enables control over the temperature of the DUT through transfer of heat between the DUT and cold plate 190. More specifically, heat is transferred by the TEC between the DUT (through the cap) and the cold plate. Operation of the TEC to transfer the heat may be controlled by the control system. In some implementations, the cap may be left off and the TEC may directly contact the DUT. In such implementations, the thermal path will be or include a direct path between the TEC and the DUT.

In this example, cold plate 190 has structure that is at least partly flat, hence use of the term "plate". However, cold plate 190 may have any appropriate structure, including cubical structures or polyhedral structures. The cold plate may be reduced in temperature using liquid coolant conduits that run to, through, and/or over the cold plate. Examples of liquid coolant that may be used include, but are not limited to, chilled water, an ethylene glycol and water mixture, hydrofluoroether (HFE), and silicone oil. One or more conduits 254 are configured to transport the liquid coolant between cold plate 190 and a supply 255 of the liquid coolant. The supply may be within the housing of the test system or external to the test system. The liquid coolant thus circulates between the cold plate and its supply. A liquid/liquid/heat exchanger 257 may be arranged in the circulation path of the liquid coolant, for example at the supply, to maintain the liquid coolant at a target temperature using chilled water. A pressure regulator 259 in conjunction with an expansion tank 260 may be configured to maintain the pressure of the liquid coolant in the conduits. In some examples, the control system described herein may control the flow of liquid coolant shown in FIG. 64 and control operation of the liquid/liquid/heat exchanger 257 to maintain the temperature of the liquid coolant reaching the cold plate at or below 68° Fahrenheit (F) (20° Celsius (C)). In some examples, the control system may control these operations to maintain the temperature of the circulating liquid coolant at different temperatures.

The flow of liquid coolant to each test site is independently and asynchronously controllable to affect—for example, to reduce—a temperature of a DUT in each test site. The control system described herein may control the flow of liquid coolant to the test site based, for example, on active feedback from temperature sensors at the test site. The temperature sensors may include a first temperature sensor at, on, or near the cap 192 to detect a temperature proximate to the DUT and a second temperature sensor at, on, or near the cap but farther away from the DUT than the first temperature sensor. Additional or fewer temperature sensors may be used, which may be distributed across various locations on the lid. In this example, the two temperature sensors send temperature data to the control system. The control system is configured to control the temperature of the DUT based on the sensed temperatures based on the requirements of one or more test programs being run to test the DUT.

As shown in FIG. 64, thermal control system 250 may include one or more valves to control a flow of the liquid coolant through the conduits to and from the cold plate 190. For example, valve 262 may be opened to allow coolant to flow to cold plate 190 or closed to prevent coolant from flowing to cold plate 190. In some implementations, the valve may be opened partially or proportionally to regulate the volume of liquid coolant that is transported to and/or from the cold plate. A greater volume of liquid coolant provided over a shorter period of time may cause a greater rate of temperature change than a lesser volume of liquid coolant provided over a longer period of time.

The thermal control system may also include one or more—for example two—heaters 264 embedded in, or placed on, the cold plate. The heaters are adjustable by the control system to increase a temperature of the cold plate and, through conduction via the TEC and the cap, to increase the temperature of the DUT during testing. The heaters may be arranged at locations on the cold plate that ensure equal or substantially equal distribution of heat over the cold plate. This temperature increase may be a requirement of a test program, for example. During a heating cycle, the flow of liquid coolant to the cold plate may stop or may be reduced so as not to counteract the heating produced by the heaters. The system may control the heaters to heat the cold plate at a rate that is greater than or equal to a predefined rate required for testing. During cooling using the liquid coolant, the heaters may be turned off or turned down so as not to counteract the cooling produced by the liquid coolant.

Figure 65:
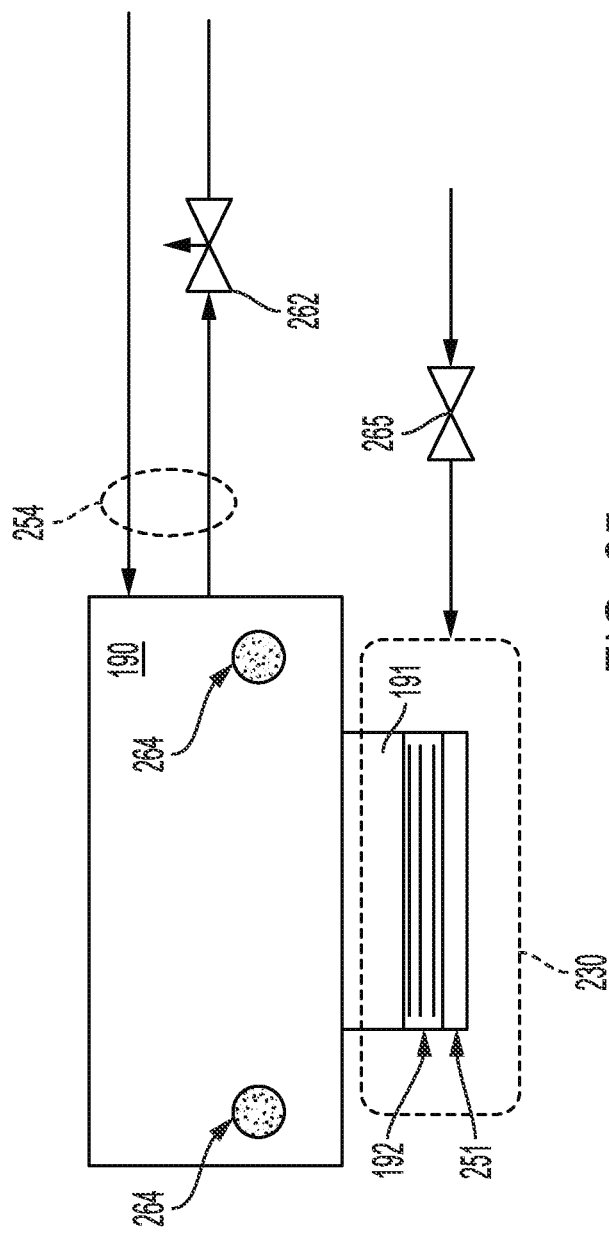
FIG. 65 is a block diagram of components of an example thermal control system for a test site that supports independent and asynchronous testing.

FIG. 65 shows components of the thermal control system in an implementation that includes enclosure 230 of FIG. 61. The other components of FIG. 65 are the same as those labeled also in FIG. 64. In this example, at least the combination of the liquid coolant, the heaters, and the physical and thermal isolation produced by enclosure 230 enables the test system to test the DUT independently of, and asynchronously from, testing of other DUTs in other test sites. FIG. 65 also shows the fitting connected to the enclosure 230 to introduce vacuum pressure or purge gas and/or ionized gas into the enclosure. In this example, the fitting includes a valve 265 that is controlled by the control system. The valve may be controllable to open to introduce vacuum pressure or vacuum—that is, suction—to the enclosure or to close to prevent vacuum pressure from reaching the enclosure. The valve may be controllable to open to introduce purge gas to the enclosure or to close to prevent the purge gas from reaching the enclosure. The valve may be controllable to open to introduce ionized air from an ionized air supply to the enclosure or to close to prevent the ionized air from reaching the enclosure. In some implementations, the purge gas and ionized air may be mixed and provided to enclosure 230 at the same time.

In operation, the temperature of a DUT in a test socket is controlled by changing a temperature of cold plate 190 that is thermally conductive. This is done by controlling an amount of liquid coolant that flows through the cold plate and/or controlling a temperature of the cold plate by controlling operation of one or more heaters in contact with the plate. The TEC is controlled to transfer heat between the plate and the DUT to control the temperature of the DUT. Following heated testing, the heaters may be turned-off and the liquid coolant may be controlled to flow through the structure to cool the structure down to a handling temperature, such as 68° F. (20° C.).

Figure 66:
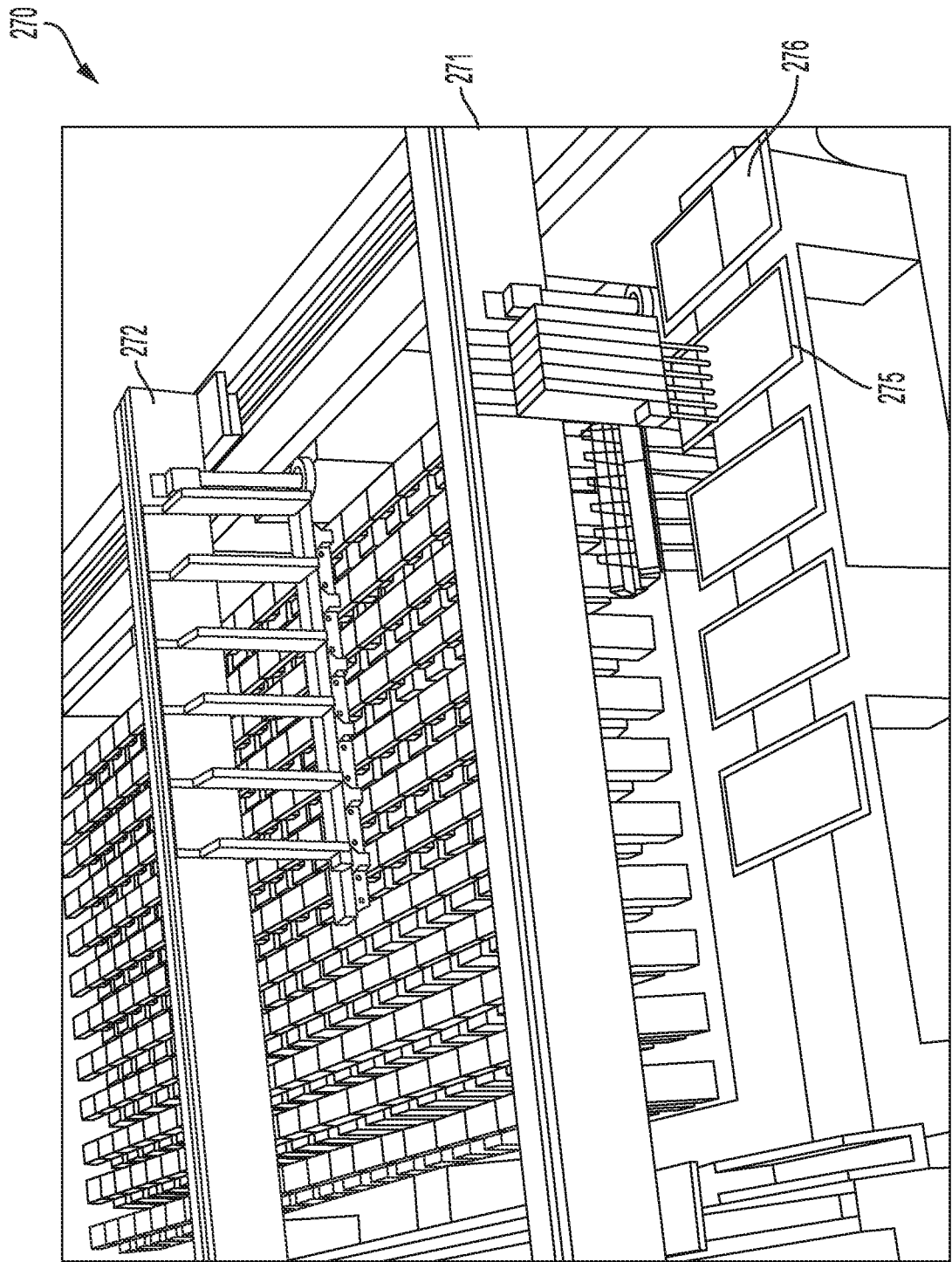
FIG. 66 is a perspective view of parts of pick-and-place automation that may be part of an example test system described herein and that includes two movable gantry beams.

In some implementations of the test system described herein, the automated gantry may include more than one gantry beam that moves relative to a horizontal plane of test sites. For example, as shown in FIG. 66, example test system 270 may include two gantry beams 271 and 272, each operating as described herein and containing a separate set of pickers having the features and operability described herein. During operation, gantry beams 271 and 272 may be controlled by control system so that the two gantry beams access different rows of trays and sockets at the same time or at different times. For example, gantry beam 270 may access front halves of trays 275 and 276 and may service a front half of the test sockets and gantry beam 272 (which is in back of gantry beam 271) may access back halves of trays 275 and 276 and may service a back half of the test sockets. In operation, gantry beams 271 and 272 may retrieve their devices from the front and back halves of tray 276 contemporaneously or concurrently, perform pick and place operations on their respective sockets contemporaneously or concurrently, and then move back to the feeder contemporaneously or concurrently to deposit tested devices in tray 275 and retrieve untested devices from tray 276. In some implementations, the system may include more than two gantry beams, such as three gantry beams or four gantry beams that each contain respective pickers and that operate in the manner described herein to service a proportionate share of the test sockets included on the system. In some implementations, there may be one gantry beam per opposing pair of packs. In some implementations, each gantry beam may be configured to service all sockets in the system, allowing one or more of the additional gantry beams to become inoperable without preventing the system from testing across the whole work area. The other features of test system 270 may be as described herein with respect to FIGS. 1 to 65.

In example implementations, the test system is 1.6 meters (m) in width by 8 m in length. However, the test system is not limited to these dimensions and may be any appropriate size. The test system may scale to accommodate a user's needs.

In some implementations, individual packs may operate as stand-alone testers. For example, test sockets of a pack may be manually loaded with DUTs. The pack may then perform one or more test routines on the DUT using the test electronics contained on the packs. In this configuration, a stand-alone pack may, or may not, communicate with a remote computing or control system to direct testing, to control testing, and/or to report test results. Upon completion of testing, the DUTs may be manually removed from the test socket and the process may be repeated.

The example test systems described herein may be implemented by, and/or controlled using, one or more computer systems comprising hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The example systems described herein can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may include a direct physical connection or a wired or wireless connection that includes or does not include intervening components but that nevertheless allows electrical signals to flow between connected components. Any "connection" involving electrical circuitry that allows signals to flow, unless stated otherwise, includes an electrical connection and is not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
   test sites comprising sockets for testing devices under test (DUTs);
   pickers for picking DUTs from the sockets or placing the DUTs in the sockets;
   a gantry on which the pickers are mounted, the gantry being configured to move the pickers relative to the test sites to position the pickers for picking the DUTs from the sockets or placing the DUTs into the sockets;
   a camera configured for positioning over a socket and controlled using servo control to capture an image of the socket or of a DUT in the socket; and
   a control system to implement the servo control of the camera and to use the image to control placing the DUT in the socket or picking the DUT from the socket;
   wherein the camera is a three-dimensional (3D) camera to capture 3D image data representing at least the socket.

2. The test system of claim 1, further comprising:
   one or more LASER range finders mounted on the gantry for movement over DUTs in the sockets and in conjunction with movement of the pickers, a LASER range finder being configured to detect a distance to the DUT placed in the socket.

3. The test system of claim 2, wherein the LASER range finder comprises a one-dimensional (1D) LASER range finder.

4. The test system of claim 2, wherein the one or more LASER range finders comprise multiple LASER range finders, and wherein each LASER range finder is mounted on a respective picker.

5. The test system of claim 2, wherein the LASER range finder is configured to detect distances to the DUT placed in the socket in parallel with movement of the gantry following placement of the DUT into the socket.

6. The test system of claim 2, wherein the control system is configured to determine a plane of the DUT placed in the socket based on multiple distances detected by the LASER range finder, and to determine whether the DUT has been placed properly in the socket based on the plane of the DUT.

7. The test system of claim 6, wherein the control system is configured to determine whether or not to place a lid over the socket based on whether the DUT has been placed properly into the socket.

8. The test system of claim 7, wherein the control system is configured to control movement of the lid to be placed over the socket when the DUT has been placed properly in the socket.

9. The test system of claim 7, wherein the control system is configured to control the lid not to be placed over the socket when the DUT has been placed improperly in the socket.

10. The test system of claim 1, further comprising:
a scanner configured to face the sockets and to move over the sockets, the scanner being configured to capture three-dimensional data (3D) representing a structure of at least part of the socket.

11. The test system of claim 10, wherein the control system is configured to determine a location and an orientation of the socket based on the 3D data.

12. The test system of claim 11, wherein the control system is configured to determine a plane of the socket, a roll and pitch of the plane, and a height of the plane relative to a base holding the sockets.

13. The test system of claim 12, wherein the control system is configured to determine Cartesian X, Y, and Z coordinates of the plane and a yaw of the plane.

14. The test system of claim 13, wherein the control system is configured to determine the Cartesian X, Y, and Z coordinates of the plane and the yaw of the plane based on features associated with the socket.

15. The test system of claim 11, wherein the control system is configured to control a picker to place the DUT in the socket based on the location and orientation of the socket.

16. The test system of claim 15, wherein the control system is configured to control the picker to place the DUT in the socket at a precision measured in single-digit microns.

17. The test system of claim 10, wherein the 3D data comprises a 3D point cloud.

18. The test system of claim 1, further comprising:
trays comprising cells for holding DUTs to be tested or DUTs that have been tested;
wherein the pickers are configured for picking the DUTs to be tested from the trays and for placing the DUTs that have been tested into the trays;
wherein the gantry is configured to move the pickers relative to the cells to position the pickers for picking the DUTs to be tested or for placing the DUTs that have been tested;
a scanner configured for movement over the trays, the scanner being configured to capture three-dimensional data (3D) representing structures of the trays and presence or absence of DUTs in at least some of the cells; and
wherein the control system is configured to determine, based on the 3D data, which of the cells contains DUTs and whether DUTs in the cells are placed properly.

19. The test system of claim 18, wherein, for a tray among the trays, the control system is configured to perform a comparison based on 3D data for the tray and a predefined model of the model of the tray.

20. The test system of claim 18, wherein, for a tray among the trays, the control system is configured to compare a representation of the tray based on the 3D data to a predefined model of the tray.

21. The test system of claim 18, wherein determining whether a DUT in a cell is placed properly comprises determining whether the DUT in the cell is at a prescribed orientation or with an acceptable tolerance of the prescribed orientation.

22. The test system of claim 18, wherein the 3D data comprises a 3D point cloud.

23. The test system of claim 18, the scanner comprises a 3D scanner mounted on a linear motorized axis over the trays.

24. The test system of claim 1, further comprising:
a scanner configured to face towards the DUT held by a picker controlled to place the DUT in the socket, the scanner being configured to capture three-dimensional data (3D) representing the picker holding the DUT prior to placement of the DUT in the socket; and
wherein the control system is configured to determine, based on the 3D data, whether the DUT is properly oriented for placement in the socket.

25. The test system of claim 24, wherein the scanner comprises a 3D scanner that is oriented to face upwards toward a bottom of the DUT.

26. The test system of claim 24, wherein the scanner is a first scanner and the 3D data is first 3D data;
wherein the test system further comprises a second scanner configured for movement over the sockets, the second scanner being configured to capture second 3D data representing a structure of at least part of the socket; and
wherein the control system is configured to control the picker to place the DUT into the socket based on the first 3D data and the second 3D data.

27. The test system of claim 26, wherein the control system is configured to control the picker to place the DUT into the socket at a precision measured in single-digit microns.

28. The test system of claim 24, wherein the 3D data comprises Cartesian X, Y, and Z coordinates for the DUT being held by the picker prior to placement in the socket.

29. The test system of claim 28, wherein the 3D data comprises pitch, yaw, and roll information for the DUT being held by the picker prior to placement in the socket.

30. The test system of claim 24, wherein the scanner is fixed in place.

31. A test system comprising:
a strobe light
test sites comprising sockets for testing devices under test (DUTs);
pickers for picking DUTs from the sockets or placing the DUTs in the sockets;
a gantry on which the pickers are mounted, the gantry being configured to move the pickers relative to the sockets to position the pickers for picking the DUTs from the sockets or placing the DUTs into the sockets;
a camera configured to face towards a DUT held by a picker controlled to place the DUT in a socket at a test site, the camera being configured to capture an image of the picker holding the DUT prior to placement of the DUT in the socket; and
a control system to control operation of the gantry to reduce a speed of the picker as the picker approaches the camera, to control operation of the strobe light and the camera to capture an image of the picker holding the DUT prior to placement of the DUT in the socket, and to use the image to determine a position and an orientation of the DUT relative to the socket;
wherein controlling the strobe light and the camera comprises causing the strobe light to illuminate at a time that the camera is controlled to capture the image.

32. A test system comprising:
a strobe light
test sites comprising sockets for testing devices under test (DUTs);
pickers for picking DUTs from the sockets or placing the DUTs in the sockets;
a gantry on which the pickers are mounted, the gantry being configured to move the pickers relative to the sockets to position the pickers for picking the DUTs from the sockets or placing the DUTs into the sockets;

a camera configured to face towards a DUT held by a picker controlled to place the DUT in a socket at a test site, the camera being configured to capture an image of the picker holding the DUT prior to placement of the DUT in the socket; and a control system to control operation of the gantry to reduce a speed of the picker as the picker approaches the camera, to control operation of the strobe light and the camera to capture an image of the picker holding the DUT prior to placement of the DUT in the socket, and to use the image to determine a position and an orientation of the DUT relative to the socket;

wherein the speed of the picker is reduced to a constant speed.

33. The test system of claim 32, wherein the camera comprises a single camera to capture an image of each picker holding a DUT.

34. The test system of claim 32, wherein the test system comprises multiple cameras including the camera, each of the multiple cameras being associated with a different test site and being configured to face towards a DUT held by a picker controlled to place the DUT in a socket, each camera being configured to capture an image of the picker holding the DUT prior to placement of the DUT in a socket of the different test site.

35. The test system of claim 1, wherein the 3D camera comprises an imaging device comprised of two or more lenses that enables perception of depth in captured images to produce a 3D image.

36. The test system of claim 1, wherein the 3D camera comprises a two-dimensional (2D) camera to capture 2D data of at least the socket and a pointing laser to capture a third dimension of data for at least the socket, the 2D data and the third dimension of the data being the 3D image data.

* * * * *